(12) United States Patent
Hiratsuka

(10) Patent No.: US 8,597,966 B2
(45) Date of Patent: Dec. 3, 2013

(54) METHOD FOR PRODUCING SEMICONDUCTOR OPTICAL DEVICE

(71) Applicant: Sumitomo Electric Industries, Ltd., Osaka (JP)

(72) Inventor: Kenji Hiratsuka, Kamakura (JP)

(73) Assignee: Sumitomo Electric Industries Ltd., Osaka (JP)

( * ) Notice: Subject to any disclaimer, the term of this patent is extended or adjusted under 35 U.S.C. 154(b) by 0 days.

(21) Appl. No.: 13/739,169

(22) Filed: Jan. 11, 2013

(65) Prior Publication Data
US 2013/0183780 A1 Jul. 18, 2013

(30) Foreign Application Priority Data

Jan. 18, 2012 (JP) ................................. 2012-008298

(51) Int. Cl.
*H01L 21/308* (2006.01)

(52) U.S. Cl.
USPC .......... 438/31; 438/29; 257/E33.071

(58) Field of Classification Search
USPC .............................................. 438/29, 31, 42
See application file for complete search history.

(56) References Cited

U.S. PATENT DOCUMENTS

| | | | |
|---|---|---|---|
| 7,273,565 B2 * | 9/2007 | Stoltz et al. ...................... 216/24 |
| 2008/0037605 A1 * | 2/2008 | Yamatoya et al. ......... 372/45.01 |
| 2012/0270347 A1 * | 10/2012 | Yagi ................................. 438/31 |
| 2012/0321244 A1 * | 12/2012 | Suzuki et al. .................... 385/14 |
| 2013/0001643 A1 * | 1/2013 | Yagi ................................ 257/184 |
| 2013/0012002 A1 * | 1/2013 | Yoneda et al. ................. 438/478 |
| 2013/0051725 A1 * | 2/2013 | Shinoda et al. ................. 385/14 |
| 2013/0183778 A1 * | 7/2013 | Katsuyama .................... 438/27 |

FOREIGN PATENT DOCUMENTS

JP 7-142699 6/1995

* cited by examiner

*Primary Examiner* — Alexander Ghyka
(74) *Attorney, Agent, or Firm* — Smith, Gambrell & Russell, LLP

(57) ABSTRACT

A method for producing a semiconductor optical device includes a first etching step of etching a stacked semiconductor layer with a first mask to form a stripe-shaped optical waveguide, the stripe-shaped optical waveguide including first and second stripe-shaped optical waveguides formed on first and second regions of a substrate, respectively; a step of forming a second mask on the stacked semiconductor layer with the first mask left; and a second etching step of etching the stacked semiconductor layer on the first region with the first and second masks. The second mask has a pattern for forming a mesa structure and includes an opening including first and second opening edges remote from side surfaces of the first stripe-shaped optical waveguide. The mesa structure is formed of the first stripe-shaped optical waveguide in the second etching step. The second stripe-shaped optical waveguide formed in the first etching step has a ridge structure.

10 Claims, 39 Drawing Sheets

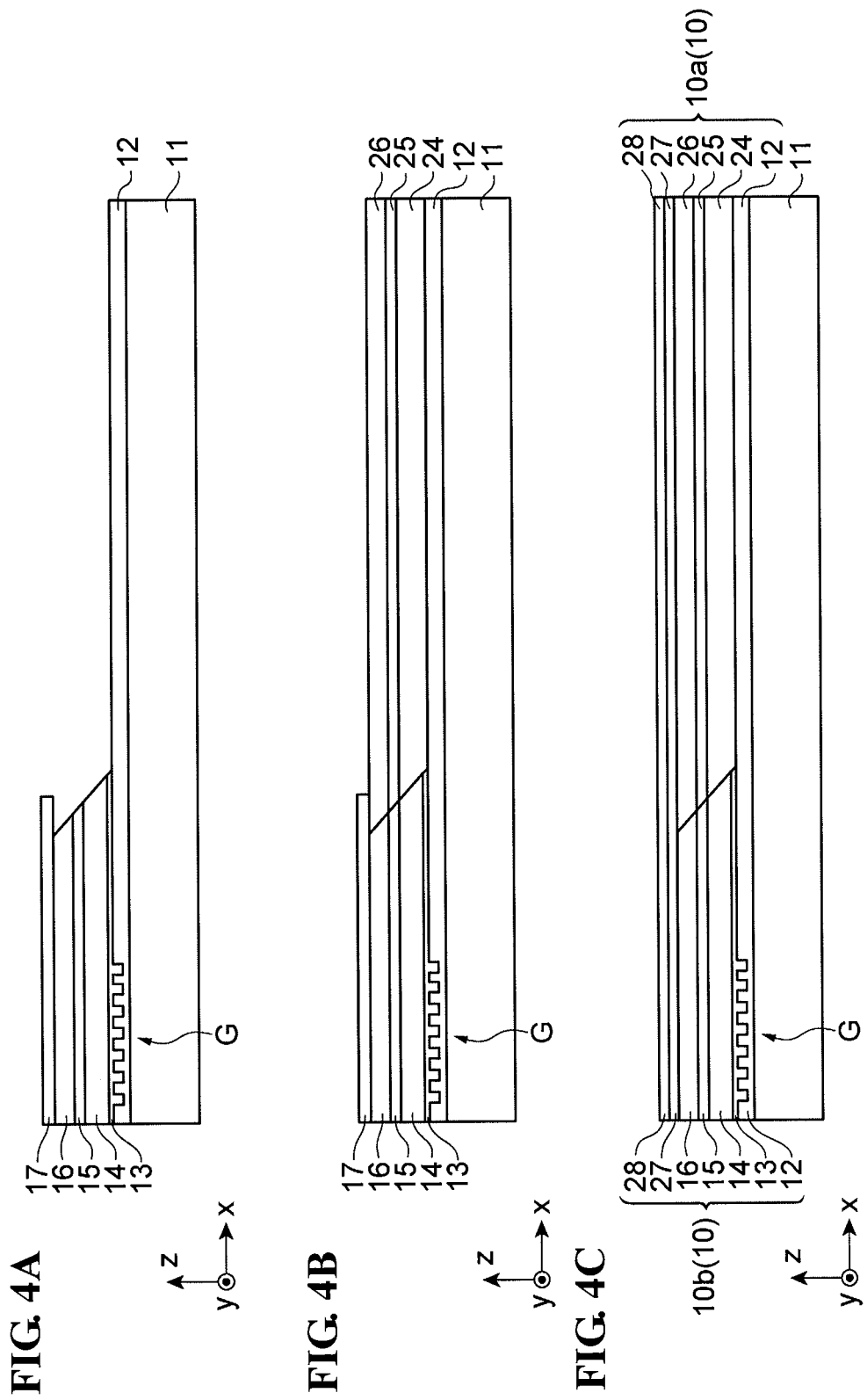

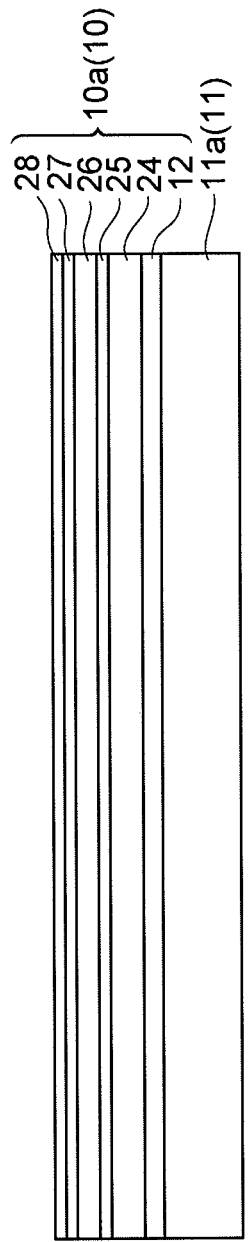
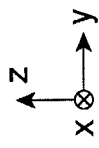
FIG. 5A
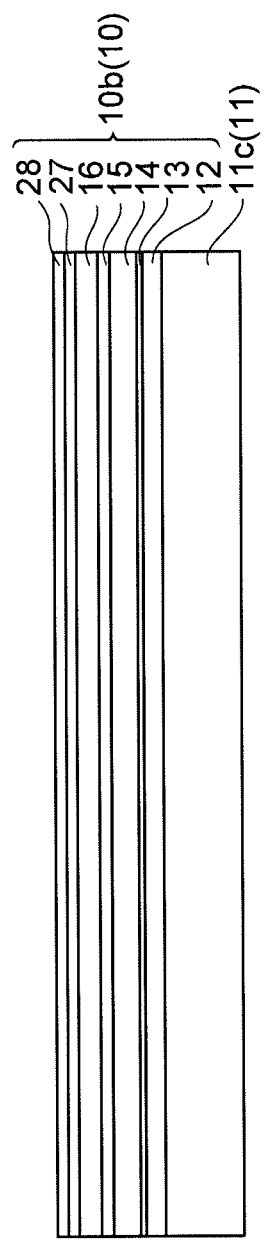
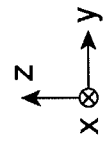
FIG. 5B
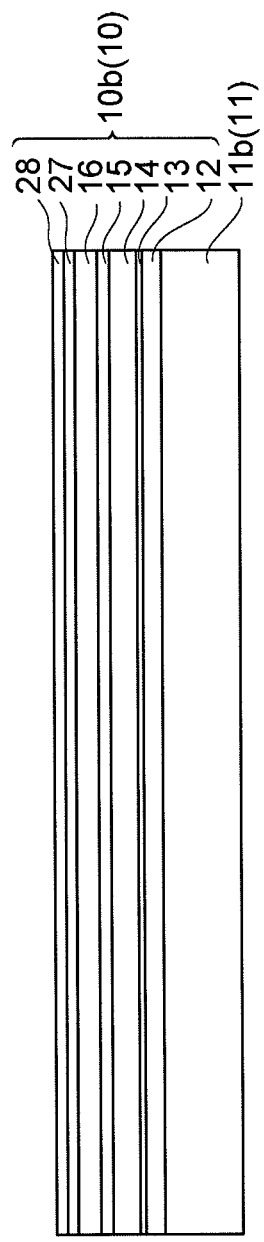
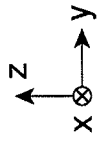
FIG. 5C

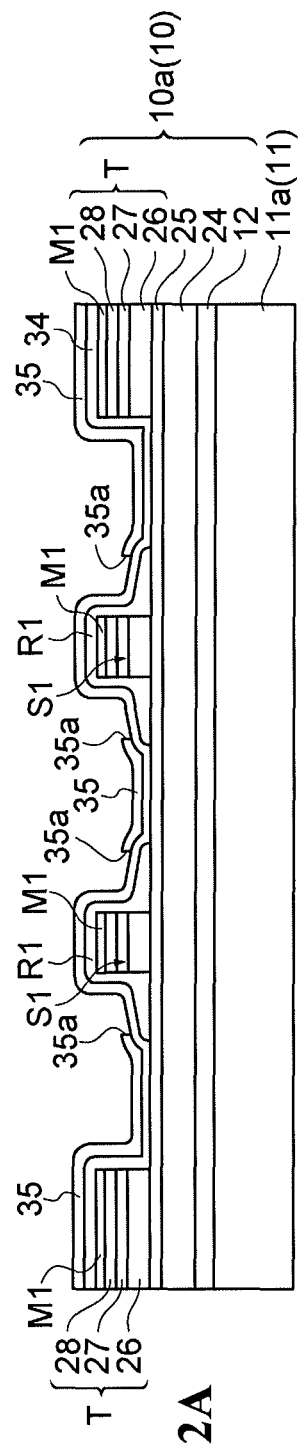
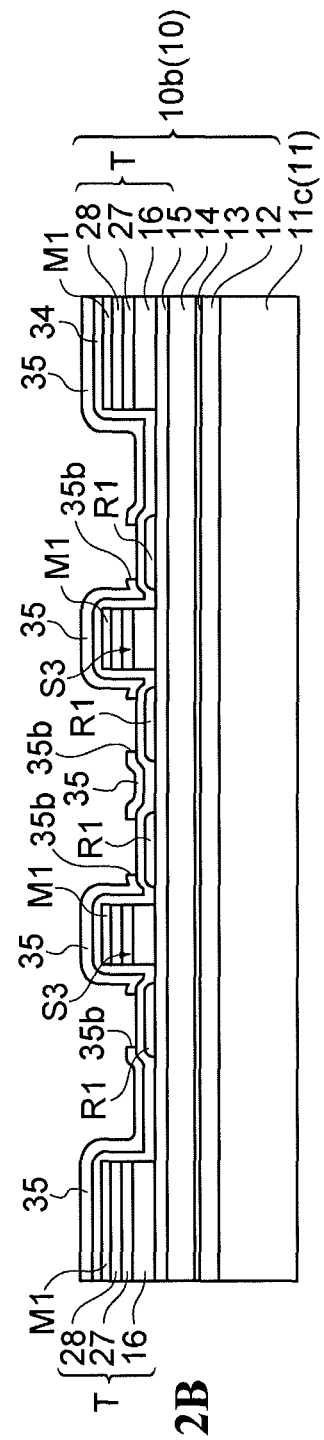
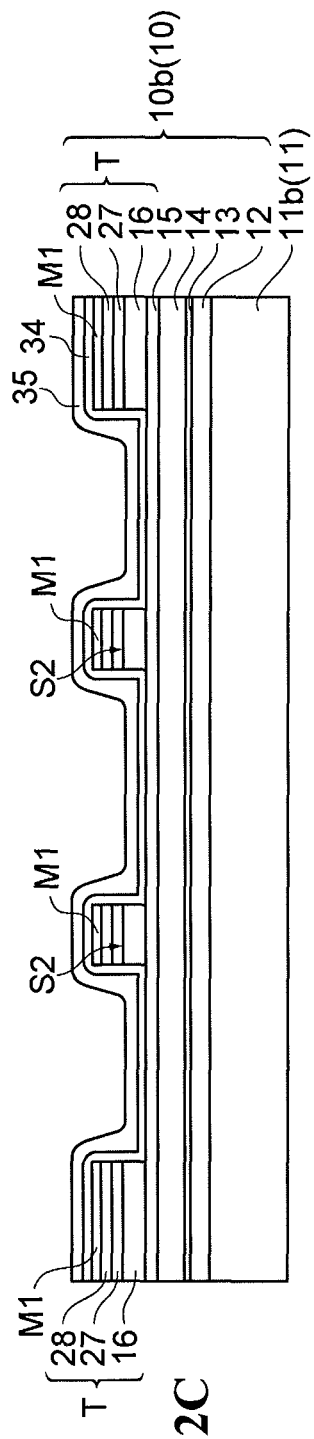
FIG. 12A
FIG. 12B
FIG. 12C

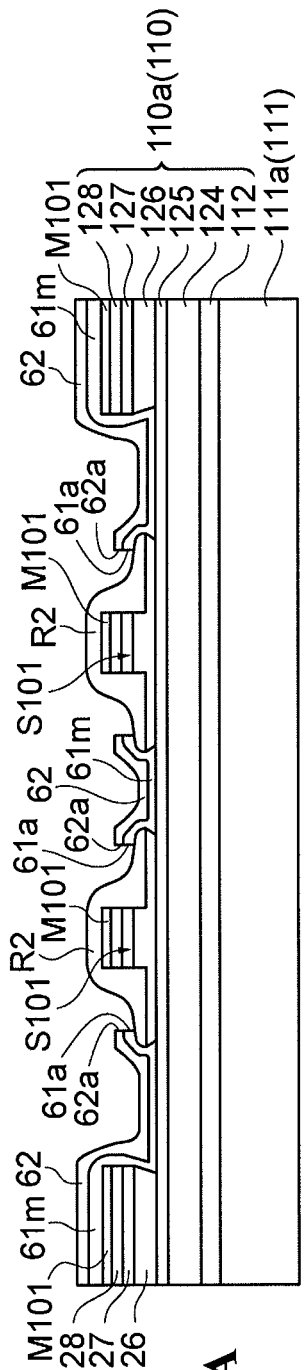
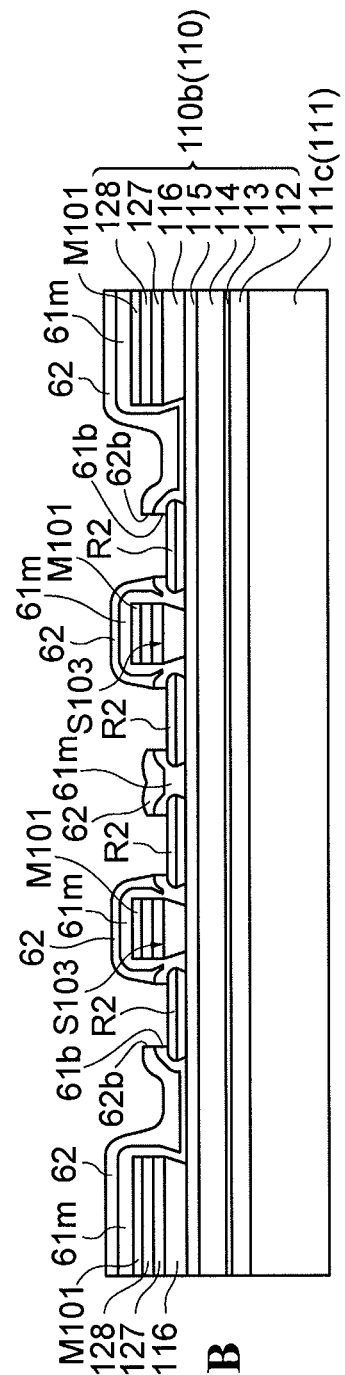
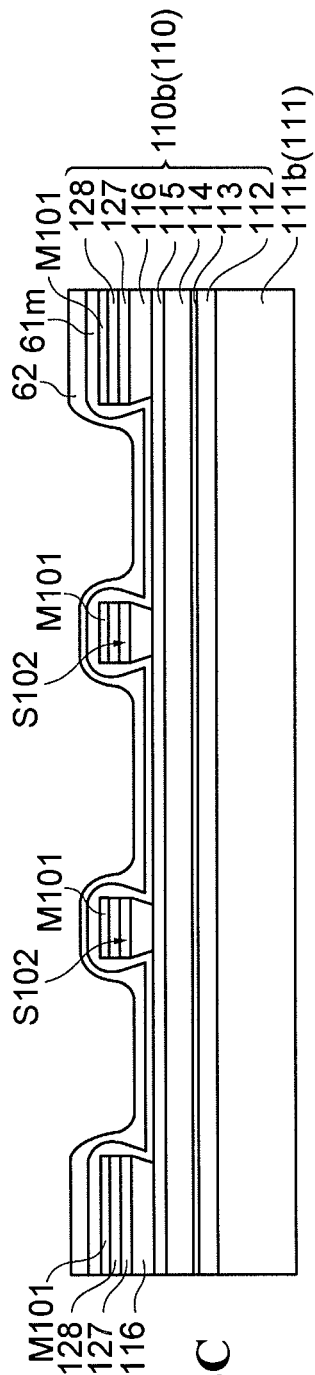
FIG. 34A
FIG. 34B
FIG. 34C

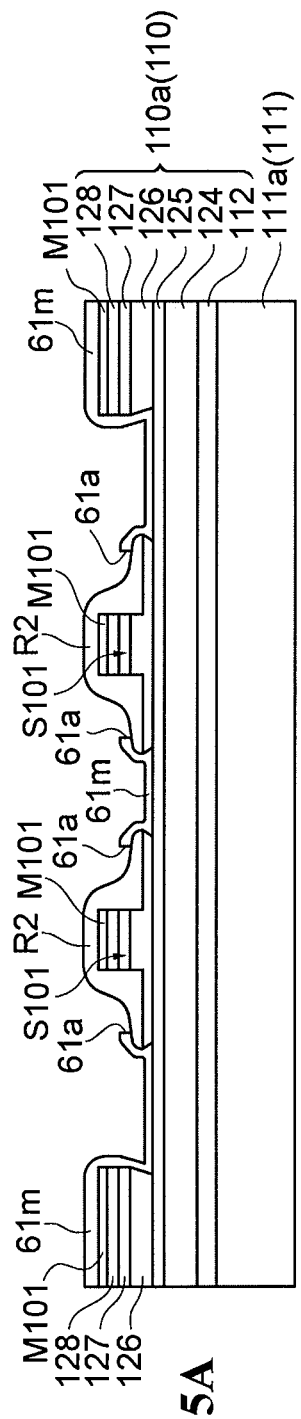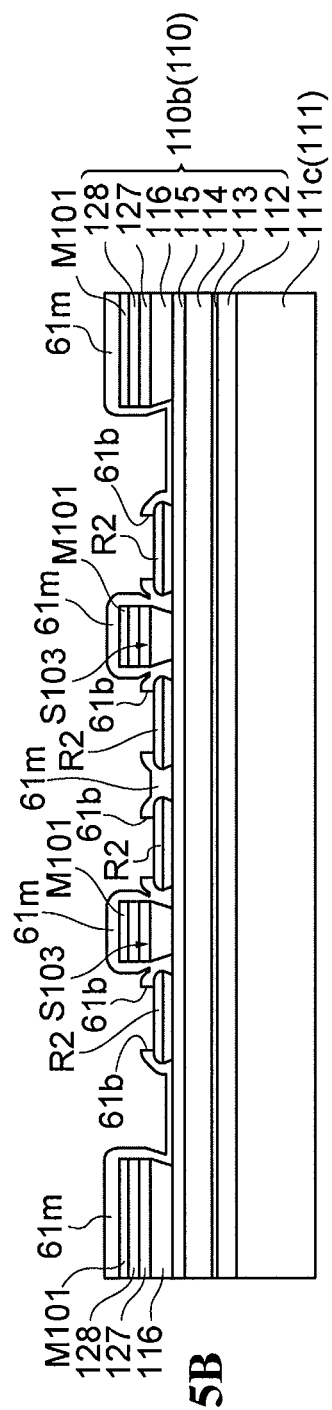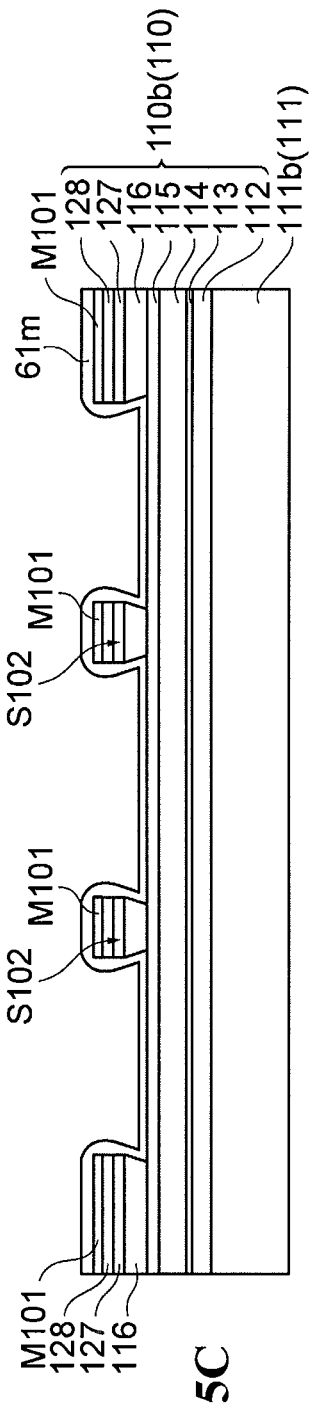
FIG. 35A
FIG. 35B
FIG. 35C

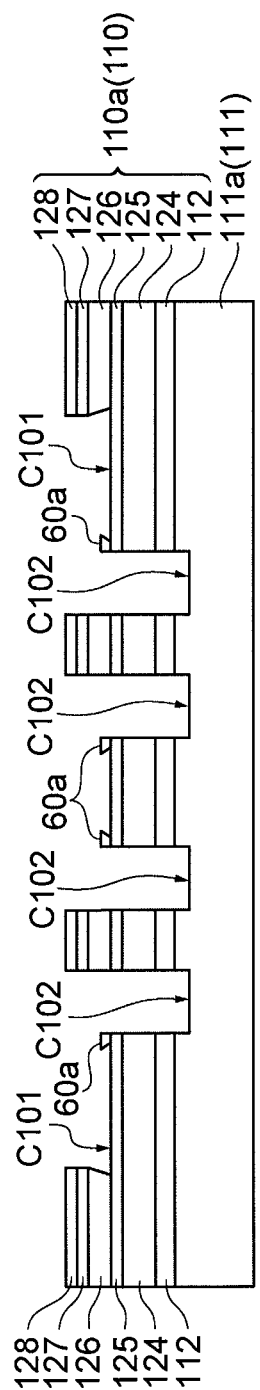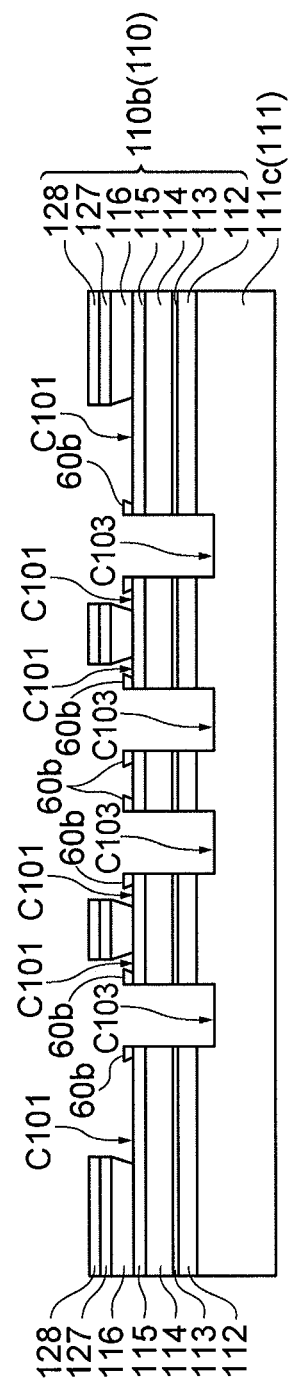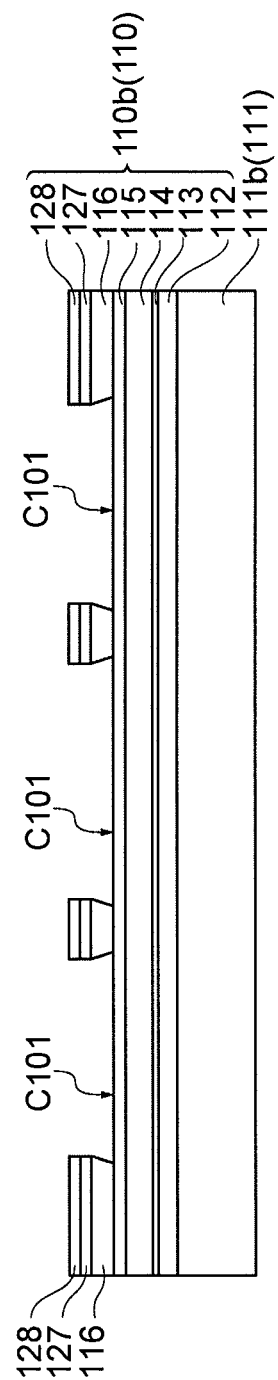

METHOD FOR PRODUCING SEMICONDUCTOR OPTICAL DEVICE

BACKGROUND OF THE INVENTION

1. Field of the Invention

The present invention relates to a method for producing a semiconductor optical device.

2. Description of the Related Art

An integrated semiconductor optical device containing two optical devices which are optically coupled to each other is known. In general, these two optical devices have waveguide structures. In the integrated semiconductor optical device, the waveguide structures of the two optical devices may have different optical confinement structures from each other. For example, Japanese Unexamined Patent Application Publication No. 7-142699 discloses a method for producing a semiconductor optical device in which a ridge-type optical waveguide and a buried-type optical waveguide are connected to each other. In the method for producing a semiconductor optical device, a $SiO_2$ mask is formed on semiconductor layers grown on a semiconductor substrate. The SiO2 mask is used to form the ridge-type optical waveguide and the buried-type optical waveguide by patterning. A region where the ridge-type optical waveguide will be formed is protected by covering the region with a $SiN_x$ mask. A region where the buried-type optical waveguide will be formed is processed with the $SiO_2$ mask into a mesa structure. A buried semiconductor layer is grown on side surfaces of the mesa. The $SiN_x$ mask that covers the region where the ridge-type optical waveguide will be formed is selectively removed. The region where the buried-type optical waveguide is formed is covered with a photoresist pattern. The region where the ridge-type optical waveguide will be formed is processed with the $SiO_2$ mask as an etching mask into a ridge structure.

SUMMARY OF THE INVENTION

However, the method for producing a semiconductor optical device described in Japanese Unexamined Patent Application Publication No. 7-142699 has the following problems: It is difficult to precisely align the etching mask. Thus, the region covered with the $SiN_x$ mask and the region covered with the photoresist pattern can overlap partially. In this case, an unetched protruding portion is formed between the ridge-type optical waveguide and the buried-type optical waveguide. Alternatively, a region that is not covered with any mask can be formed between the region covered with the $SiN_x$ mask and the region covered with the photoresist pattern. In this case, the region is over-etched, thereby forming a recessed portion between the ridge-type optical waveguide and the buried-type optical waveguide.

Accordingly, a method for producing a semiconductor optical device according to the present invention includes (a) a step of preparing a substrate including a first region and a second region; (b) a step of growing a stacked semiconductor layer on the substrate; (c) a step of forming a first mask on the stacked semiconductor layer, the first mask having a stripe-shaped pattern that extends in a waveguiding direction; (d) a first etching step of etching the stacked semiconductor layer with the first mask to form a stripe-shaped optical waveguide, the stripe-shaped optical waveguide including a first stripe-shaped optical waveguide formed on the first region, and a second stripe-shaped optical waveguide formed on the second region; (e) after the first etching step, a step of forming a second mask on the stacked semiconductor layer with the first mask left, the second mask having a pattern configured to form a semiconductor mesa structure; and (f) a second etching step of etching the stacked semiconductor layer on the first region with the first mask and the second mask to form the semiconductor mesa structure. The second mask includes a first opening extending along the waveguiding direction. The first opening includes a first opening edge remote from one side surface of the first stripe-shaped optical waveguide, and a second opening edge remote from the other side surface of the first stripe-shaped optical waveguide. The first opening edge and the second opening edge are located on a region of the stacked semiconductor layer uncovered with the first mask. In addition, the semiconductor mesa structure is formed of the first stripe-shaped optical waveguide formed on the first region. The second stripe-shaped optical waveguide formed on the second region has a ridge structure different from the semiconductor mesa structure.

In the method for producing a semiconductor optical device, the stripe-shaped optical waveguide is formed by etching with the first mask. The semiconductor mesa structure is then formed by etching with the first mask and the second mask. In this way, the semiconductor mesa structure and the ridge structure having different structures from each other are formed by multiple etching operations. The first opening edge and the second opening edge of the second mask are located on the region of the stacked semiconductor layer uncovered with the first mask. That is, the first opening edge and the second opening edge are located on the region of the stacked semiconductor layer etched in the first etching step. Thus, the first opening edge and the second opening edge are located on the region etched in the first etching step without being affected by the misalignment of the second mask. This prevents the formation of a protruding portion due to the fact that etching is not performed or the formation of a recessed portion due to overetching, between the optical waveguide including the semiconductor mesa structure and the optical waveguide having the ridge structure.

In the method for producing a semiconductor optical device according to the present invention, preferably, the substrate further includes a third region provided between the first region and the second region. Preferably, the stripe-shaped optical waveguide further includes a third stripe-shaped optical waveguide formed on the third region, the third stripe-shaped optical waveguide connecting the first stripe-shaped optical waveguide and the second stripe-shaped optical waveguide. Preferably, the second mask further includes a second opening on a region which is uncovered with the first mask and which is located on both sides of the third stripe-shaped optical waveguide. Preferably, the second opening extends along the waveguiding direction and is gradually separated from both side surfaces of the third stripe-shaped optical waveguide. In addition, in the second etching step, preferably, the stacked semiconductor layer on the third region is etched with the first mask and the second mask to form a conversion region provided between the semiconductor mesa structure and the ridge structure, the conversion region including the third stripe-shaped optical waveguide.

In the method for producing a semiconductor optical device, the conversion region is provided, thereby resulting in a reduction in optical propagation loss between the optical waveguide including the semiconductor mesa structure (e.g., a high-mesa optical waveguide) and the optical waveguide including the ridge structure. The second opening is located on the region of the stacked semiconductor layer uncovered with the first mask. That is, the second opening is located on the region etched in the first etching step. Thus, the second opening is located on the region etched in the first etching step without being affected by the misalignment of the second mask.

In the method for producing a semiconductor optical device according to the present invention, preferably, the step of forming the second mask includes, after the first etching step, a step of forming a selection film composed of a thermo-curable resin on a selection film formation region, the selection film formation region including a first opening formation region of the stacked semiconductor layer where the first opening will be formed, and a second opening formation region of the stacked semiconductor layer where the second opening will be formed; after the step of forming the selection film, a step of forming a silicon nitride film on the stacked semiconductor layer; a step of forming a resist mask on the silicon nitride film, the resist mask including an opening located on the first opening formation region and the second opening formation region; a step of etching the silicon nitride film with the resist mask to form a silicon nitride film mask; after the step of etching the silicon nitride film, a step of removing the resist mask; and after the step of removing the resist mask, a step of removing the selection film to form the second mask. In addition, the second mask preferably includes the silicon nitride film mask. In this case, the selection film is composed of the thermo-curable resin and thus has a certain degree of heat resistance. Thus, the silicon nitride film is formed on the selection film without the influence of the deposition temperature of the silicon nitride film on the selection film.

In the method for producing a semiconductor optical device according to the present invention, in the step of removing the selection film, the selection film is preferably removed with oxygen plasma. In this case, the selection film is selectively removed without having any influence on the stacked semiconductor layer.

In the method for producing a semiconductor optical device according to the present invention, the first mask is preferably formed of a silicon nitride film. Preferably, the step of forming the second mask includes, after the first etching step, a step of forming a silicon oxide film on the stacked semiconductor layer; a step of forming a resist mask on the silicon oxide film, the resist mask including an opening which is located on a first opening formation region of the stacked semiconductor layer where the first opening will be formed and which is located on a second opening formation region of the stacked semiconductor layer where the second opening will be formed; a step of selectively etching the silicon oxide film with the resist mask to form a silicon oxide film mask; and, after the step of selectively etching the silicon oxide film, a step of removing the resist mask to form the second mask. In addition, the second mask preferably includes the silicon oxide film mask. In this case, the first mask is composed of the silicon nitride; hence, the silicon oxide film formed on the first mask is selectively etched to form the second mask.

In the method for producing a semiconductor optical device according to the present invention, preferably, the stacked semiconductor layer includes an active layer, an etch-stop layer provided on the active layer, and a plurality of semiconductor layers stacked on the etch-stop layer. The first etching step may include a step of etching the plurality of semiconductor layers; after the step of etching the plurality of semiconductor layers, a step of forming a selection film composed of a thermo-curable resin on a selection film formation region, the selection film formation region including a first opening formation region of the stacked semiconductor layer where the first opening will be formed, and a second opening formation region of the stacked semiconductor layer where the second opening will be formed; and a step of selectively etching the plurality of semiconductor layers using the first mask with the selection film left until the etch-stop layer is exposed, to form the stripe-shaped optical waveguide. The step of forming the second mask may include, after the selective etching, a step of forming a silicon nitride film on the stacked semiconductor layer; a step of forming a resist mask on the silicon nitride film, the resist mask including an opening located on the first opening formation region and the second opening formation region; a step of etching the silicon nitride film with the resist mask to form a silicon nitride film mask; after the step of etching the silicon nitride film, a step of removing the resist mask; and, after the step of removing the resist mask, a step of removing the selection film to form the second mask. In addition, the second mask may include the silicon nitride film mask. In this case, the selective etching is performed with the first mask after the formation of the selection film, so that the side surfaces of the optical waveguide including the ridge structure have an inverted mesa shape. The selection film is composed of the thermo-curable resin and thus has a certain degree of heat resistance. Hence, the silicon nitride film is formed on the selection film without the influence of the deposition temperature of the silicon nitride film on the selection film.

In the method for producing a semiconductor optical device according to the present invention, in the step of forming the resist mask, the edge of the opening of the resist mask is preferably provided on the selection film. In this case, the edge of the selection film is superimposed on the edge of the opening of the resist mask when viewed in plan. This prevents the first opening and the second opening of the second mask from being located on a selectively etched portion.

In the method for producing a semiconductor optical device according to the present invention, the height of the semiconductor mesa structure may be greater than the height of the ridge structure.

In the method for producing a semiconductor optical device according to the present invention, preferably, the stacked semiconductor layer includes an active layer, an etch-stop layer provided on the active layer, and a plurality of semiconductor layers stacked on the etch-stop layer. Preferably, in the first etching step, the plurality of semiconductor layers are etched until the etch-stop layer is exposed. In this case, the stripe-shaped optical waveguide including the ridge structure is formed in one etching step.

In the method for producing a semiconductor optical device according to the present invention, preferably, the width of the semiconductor mesa structure differs from the width of the ridge structure. In this case, a semiconductor optical device including the mesa structure and the ridge structure having different widths is produced.

BRIEF DESCRIPTION OF THE DRAWINGS

FIGS. 4A to 4C illustrate a procedure subsequent to the procedure in FIGS. 3A to 3C.

FIGS. 5A to 5C illustrate a procedure of a first mask formation step in the method for producing the semiconductor optical device in FIG. 1.

FIGS. 12A to 12C illustrate a procedure subsequent to the procedure in FIGS. 10A to 10C.

FIGS. 34A to 34C illustrate a procedure subsequent to the procedure in FIGS. 33A to 33C.

FIGS. 35A to 35C illustrate a procedure subsequent to the procedure in FIGS. 34A to 34C.

FIGS. 38A to 38C illustrate a first and second mask removal step in the method for producing the semiconductor optical device in FIG. 28.

DESCRIPTION OF THE PREFERRED EMBODIMENTS

Figure 1:
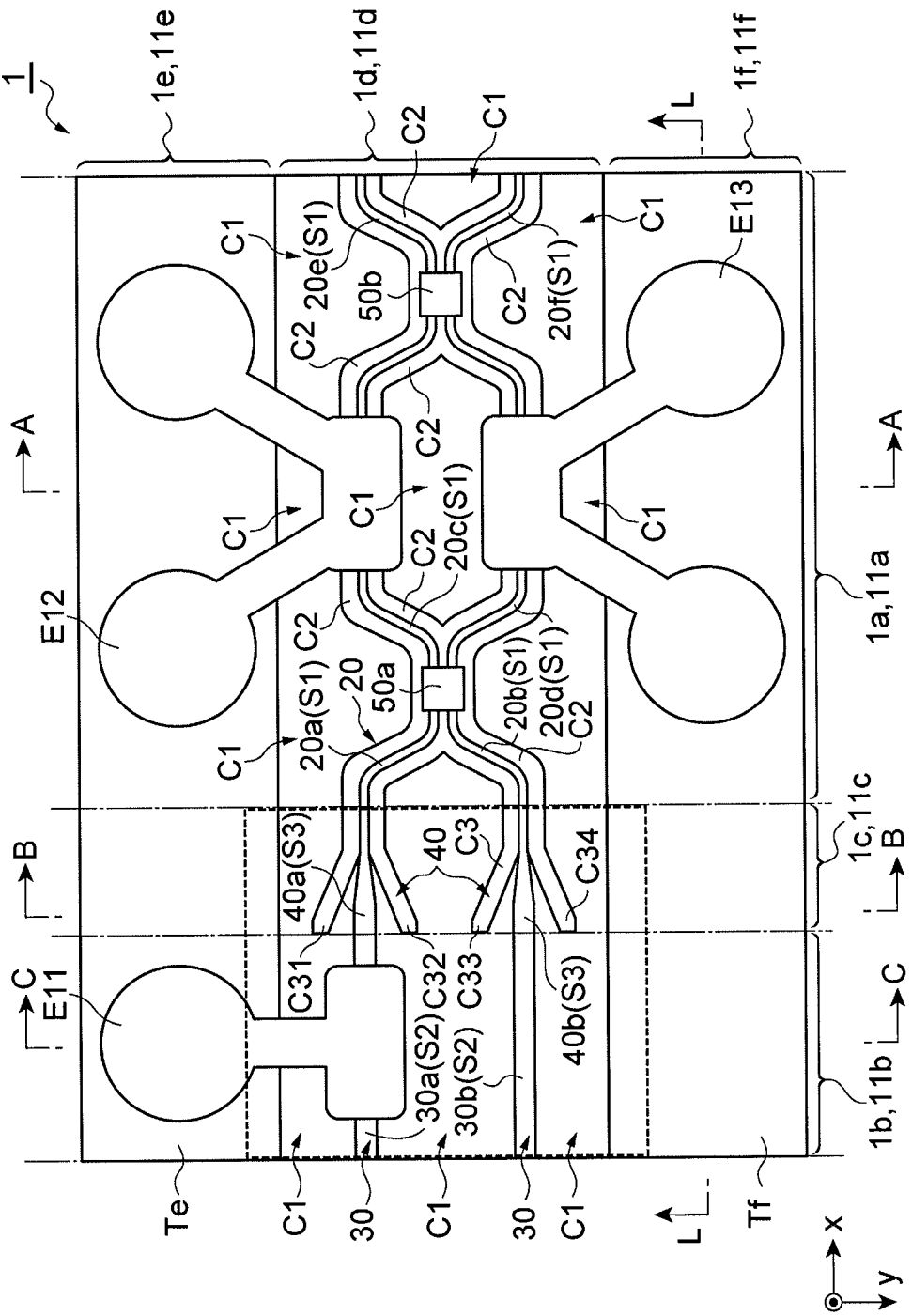
FIG. 1 is a schematic plan view illustrating a structure of a semiconductor optical device according to a first embodiment.

The present invention will be described in detail below with reference to the attached drawings. If possible, the same or equivalent elements are designated using the same reference numerals.

First Embodiment

FIG. 1 is a schematic plan view illustrating a structure of a semiconductor optical device according to a first embodiment. As illustrated in FIG. 1, the optical semiconductor device 1 includes a first portion 1a, a second portion 1b, and a third portion 1c. The first portion 1a, the third portion 1c, and the second portion 1b are arranged in that order in one direction (first direction). The first portion 1a includes a mesa-type optical waveguide 20 having a high mesa structure. The first portion 1a includes, for example, a Mach-Zehnder modulator (MZM) with 2×2 multi-mode interference (MMI). The Mach-Zehnder modulator functions as, for example, a semiconductor optical modulator. The second portion 1b includes a ridge-type optical waveguide 30 having a ridge structure. The third portion 1c includes a conversion region 40. The second portion 1b includes, for example, a semiconductor laser including a diffraction grating that serves as a light source.

The optical semiconductor device 1 includes a portion where a stripe-shaped optical waveguide is formed (hereinafter, referred to as a "stripe-shaped waveguide formation portion") 1d sandwiched, in a second direction orthogonal to the first direction, between portions where a pair of terraces is formed (hereinafter, referred to as "terrace formation portions) 1e and 1f. A stripe-shaped optical waveguide S is provided in the stripe-shaped waveguide formation portion 1d. The stripe-shaped optical waveguide S extends in the first direction (waveguiding direction) and includes a first stripe-shaped waveguide section S1 provided in the first portion 1a, a second stripe-shaped waveguide section S2 provided in the second portion 1b, and a third stripe-shaped waveguide section S3 provided in the third portion 1c. The third stripe-shaped waveguide section S3 is connected to an end of the first stripe-shaped waveguide section S1 and an end of the second stripe-shaped waveguide section S2. Specifically, the first stripe-shaped waveguide section S1 has a mesa structure and includes a first mesa 20a, a second mesa 20b, a third mesa 20c, a fourth mesa 20d, a fifth mesa 20e, and a sixth mesa 20f. The second stripe-shaped waveguide section S2 has a ridge structure and includes a first ridge 30a and a second ridge 30b. The third stripe-shaped waveguide section S3 has a structure configured to connect the ridge structure and the mesa structure. In addition, the third stripe-shaped waveguide section S3 includes a first conversion portion 40a and a second conversion portion 40b. In the first stripe-shaped waveguide section S1 includes a first multiplexer/demultiplexer 50a and a second multiplexer/demultiplexer 50b. Each of the first multiplexer/demultiplexer 50a and the second multiplexer/demultiplexer 50b is constituted by, for example, a multimode interference (MMI) coupler.

Each of the first ridge 30a and the second ridge 30b has one end at one end facet of the optical semiconductor device 1 in the first direction and extends from the one end facet to the third portion 1c in the first direction. The first ridge 30a and the second ridge 30b are arranged substantially parallel to each other. The first conversion portion 40a has one end connected to the other end of the first ridge 30a and the other end connected to an end of the first mesa 20a and extends in the first direction. Similarly, the second conversion portion 40b has one end connected to the other end of the second ridge 30b and the other end connected to the other end of the second ridge 30b and extends in the first direction. The first mesa 20a and the second mesa 20b extend from the first conversion portion 40a and the second conversion portion 40b, respectively, and are connected to the first multiplexer/demultiplexer 50a. The third mesa 20c and the fourth mesa 20d are provided between the first multiplexer/demultiplexer 50a and the second multiplexer/demultiplexer 50b. The fifth mesa 20e and the sixth mesa 20f extend from the second multiplexer/demultiplexer 50b to the other end facet of the optical semiconductor device 1 in the first direction.

Terraces Te and Tf are provided in the terrace formation portions 1e and 1f. An upper electrode E11 and an upper electrode E12 are provided on the terrace Te. An upper electrode E13 is provided on the terrace Tf. The upper electrode E11 is connected to the first ridge 30a and extends to the upper surface of the terrace Te. The upper electrode E12 is connected to the third mesa 20c and extends to the upper surface of the terrace Te. The upper electrode E13 is connected to the fourth mesa 20d and extends to the upper surface of the terrace Tf.

The stripe-shaped optical waveguide S and the terraces Te and Tf define a first recess C1. That is, the first recess C1 is provided between the terrace Te and the first ridge 30a, the first conversion portion 40a, the first mesa 20a, the first multiplexer/demultiplexer 50a, the third mesa 20c, the second multiplexer/demultiplexer 50b, and the fifth mesa 20e. The first recess C1 is provided between the terrace Tf and the second ridge 30b, the second conversion portion 40b, the second mesa 20b, the first multiplexer/demultiplexer 50a, the fourth mesa 20d, the second multiplexer/demultiplexer 50b, and the sixth mesa 20f. The first recess C1 is provided in a portion surrounded by the first ridge 30a, the first conversion portion 40a, the first mesa 20a, the first multiplexer/demultiplexer 50a, the second mesa 20b, the second conversion portion 40b, and the second ridge 30b. The first recess C1 is provided in a portion surrounded by the first multiplexer/demultiplexer 50a, the third mesa 20c, the second multiplexer/demultiplexer 50b, and the fourth mesa 20d. The first recess C1 is provided in a portion the fifth mesa 20e, the second multiplexer/demultiplexer 50b, and the sixth mesa 20f.

A second recess C2 extending substantially parallel to the first stripe-shaped waveguide section S1 is provided along both side surfaces of the first stripe-shaped waveguide section 51. The second recess C2 extends from the boundary of the first portion 1a and the third portion 1c to the other end facet of the optical semiconductor device 1. A third recess C3 is provided on both sides of the third stripe-shaped waveguide section S3. Specifically, third recess portions C31 and C32 are provided so that the first conversion portion 40a is sandwiched between the third recess portions C31 and C32. In addition, third recess portions C33 and C34 are provided so that the second conversion portion 40b is sandwiched between the third recess portions C33 and C34. An end of each of the third recessed portions C31, C32, C33, and C34 is connected to the second recess C2. The third recessed portion C31 is provided so as to be gradually separated from one side surface of the first conversion portion 40a from the boundary between the first portion 1a and the third portion 1c toward the boundary between the second portion 1b and the third portion 1c. The third recess portion C32 is provided so as to be gradually separated from the other side surface of the first conversion portion 40a from the boundary between the first portion 1a and the third portion 1c toward the boundary between the second portion 1b and the third portion 1c. Similarly, the third recess portion C33 and the third recess portion C34 are provided so as to be gradually separated from one side surface and the other side surface, respectively, of the second conversion portion 40b from the boundary between the first portion 1a and the third portion 1c toward the boundary between the second portion 1b and the third portion 1c. In this way, a refractive index in the conversion region 40 is gradually changed from a refractive index in the high-mesa optical waveguide 20 to a refractive index in the ridge-type optical waveguide 30 with the third recess C3 provided on both sides of each of the first conversion portion 40a and the second conversion portion 40b. This results in a reduction in optical propagation loss at the portion that connects the high-mesa optical waveguide 20 and the ridge-type optical waveguide 30.

The high-mesa optical waveguide 20 (first stripe-shaped waveguide section S1) and the ridge-type optical waveguide 30 (second stripe-shaped waveguide section S2) differ in width. Specifically, the width of the ridge-type optical waveguide 30 is larger than that of the high-mesa optical waveguide 20. To reduce optical propagation loss at the portion that connects the high-mesa optical waveguide 20 and the ridge-type optical waveguide 30, the width of the optical waveguide is continuously changed in the conversion region 40. The light axis of the high-mesa optical waveguide 20 is matched to the light axis of the ridge-type optical waveguide 30. As described above, the optical semiconductor device 1 has a structure in which the high-mesa optical waveguide 20 and the ridge-type optical waveguide 30 are connected to each other with the conversion region 40 and in which the semiconductor optical modulator and the semiconductor laser are integrated. The optical waveguide of the semiconductor optical modulator (the first portion 1a) is joined to the optical waveguide of the semiconductor laser (the second portion 1b and the third portion 1c) by butt-joint coupling. In the optical semiconductor device 1 having the foregoing structure, laser light is generated by injecting a current through the upper electrode E11. The laser light generated in the second portion 1b passes through a butt-joint coupling portion and is modulated with the semiconductor optical modulator in the first portion 1a. The modulated light is then emitted from the other end facet of the optical semiconductor device 1.

Figure 2:
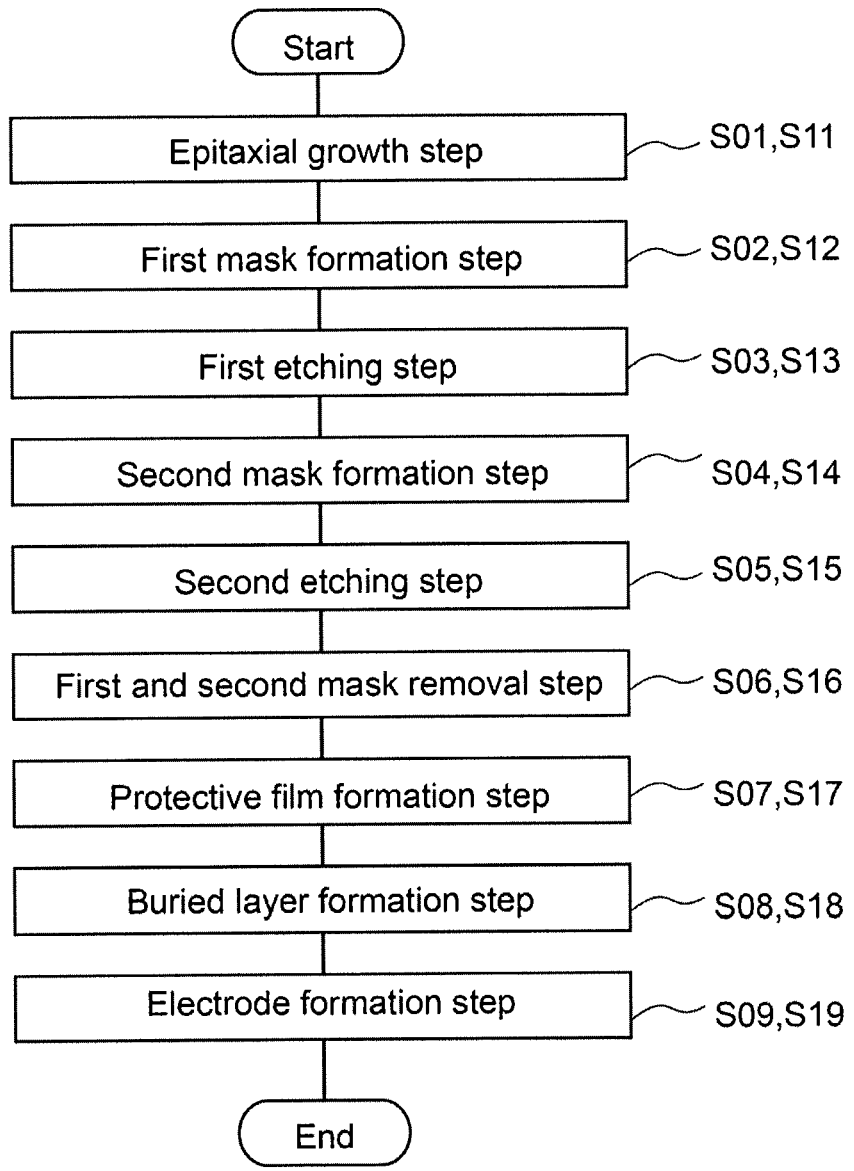
FIG. 2 is a flow chart of methods for producing semiconductor optical devices illustrated in FIGS. 1 and 28.

A method for producing the optical semiconductor device 1 will be described below with reference to FIG. 2. FIG. 2 is a flow chart of a method for producing the optical semiconductor device 1. As illustrated in FIG. 2, the method for producing the optical semiconductor device 1 includes an epitaxial growth step S01, a first mask formation step S02, a first etching step S03, a second mask formation step S04, a second etching step S05, a first and second mask removal step S06, a protective film formation step S07, a buried layer formation step S08, and an electrode formation step S09.

Figure 3A:
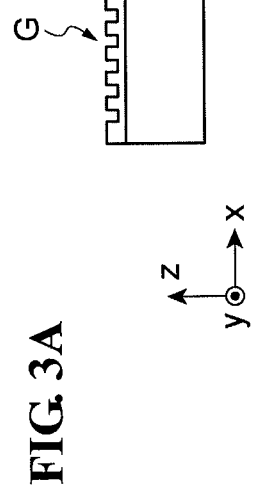
FIGS. 3A to 3C illustrate a procedure of an epitaxial growth step in the method for producing the semiconductor optical device in FIG. 1.

In the epitaxial growth step S01, a stacked semiconductor layer 10 is grown on a main surface of a semiconductor substrate 11. The epitaxial growth step S01 will be specifically described below with reference to FIGS. 3A to 3C and FIGS. 4A to 4C. FIGS. 3A to 3C and 4A to 4C are schematic cross-sectional views taken along line L-L in FIG. 1 in the epitaxial growth step S01. As illustrated in FIG. 3A, a buffer layer (not illustrated) and a grating layer 12 are epitaxially grown on the main surface of the semiconductor substrate 11. The buffer layer is composed of, for example, n-type InP. The buffer layer has a thickness of about 500 nm and an impurity concentration of, for example, about $4\times10^{17}$ cm$^{-3}$. The grating layer 12 is composed of, for example, InGaAsP having a composition with a photoluminescence (PL) wavelength of 1.33 µm. The grating layer 12 has a thickness of about 120 nm and an impurity concentration of, for example, about $5\times10^{17}$ cm$^{-3}$. A diffraction grating G is formed in the grating layer 12 on a second region 11b of the semiconductor substrate 11 (diffraction grating formation step).

The diffraction grating G is formed as described below. A silicon nitride film (SiN film) having a thickness of, for example, about 40 nm is formed by a chemical vapor deposition (CVD) method on the grating layer 12. A diffraction grating pattern is formed on the silicon nitride film with an electron beam exposure apparatus. At this time, a resist for electron beam exposure is applied on the silicon nitride film. The diffraction grating pattern is formed on the resist by using the electron beam exposure method. The silicon nitride film is etched using the patterned resist as a mask by, for example, dry etching. In this dry etching, for example, reactive ion etching (RIB) using CF$_4$ gas as an etching gas is used. As a result, the diffraction grating pattern formed on the resist is transferred to the silicon nitride film. The patterned resist is then removed. The grating layer 12 is etched with the patterned silicon nitride film as a mask by, for example, RIE using a gas mixture of methane gas (CH$_4$) and hydrogen gas (H$_2$) as an etching gas. The etch depth is, for example, about 60 nm. By removing the silicon nitride film, the diffraction grating G is formed. The diffraction grating G has a period of, for example, about 238.9 nm.

Figure 3B:
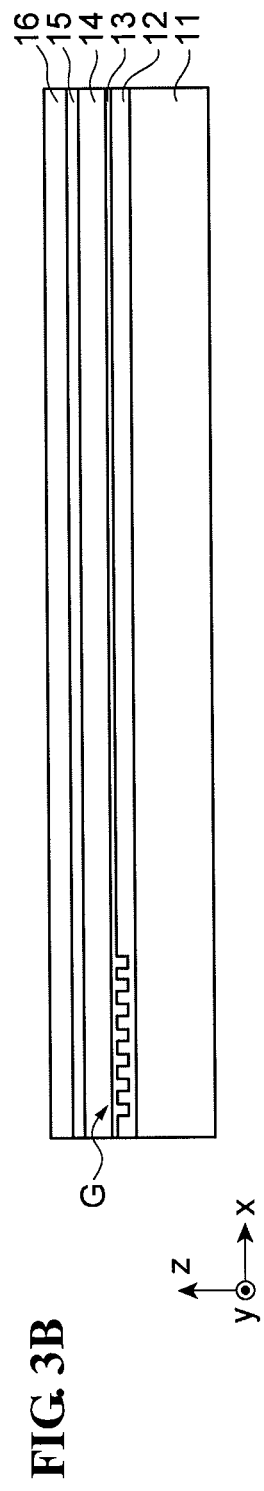

As illustrated in FIG. 3B, a spacer layer 13, an active layer 14, an etch-stop layer 15, and a lower cladding layer 16 are epitaxially grown, in that order, on the grating layer 12 with a crystal growth apparatus, such as an organometallic vapor phase epitaxy (OMVPE) apparatus, (active layer epitaxial growth step). The spacer layer 13 is composed of, for example, n-type InP. The spacer layer 13 has a thickness of about 70 nm on a flat portion of the grating layer 12 and an impurity concentration of, for example, about $5\times10^{17}$ cm$^{-3}$. The diffraction grating G is buried in the spacer layer 13. A main surface of the spacer layer 13 is planarized. The active layer 14 has, for example, a multi quantum well structure (MQW structure). Compositions and thicknesses of well layers and barrier layers that constitute the MQW structure of the active layer 14 are adjusted in such a manner that the active layer 14 has a PL wavelength of 1.54 µm. The well layers and the barrier layers are composed of III-V group compound semiconductors, such as GaInAsP and AlGaInAs. The etch-stop layer 15 is composed of, for example, InGaAsP having a composition with a PL wavelength of 1.15 µm. The etch-stop layer 15 has a thickness of, for example, about 20 nm. The lower cladding layer 16 is composed of, for example, p-type InP. The lower cladding layer 16 has a thickness of, for example, about 600 nm and an impurity concentration of, for example, about $5\times10^{17}$ cm$^{-3}$.

Figure 3C:
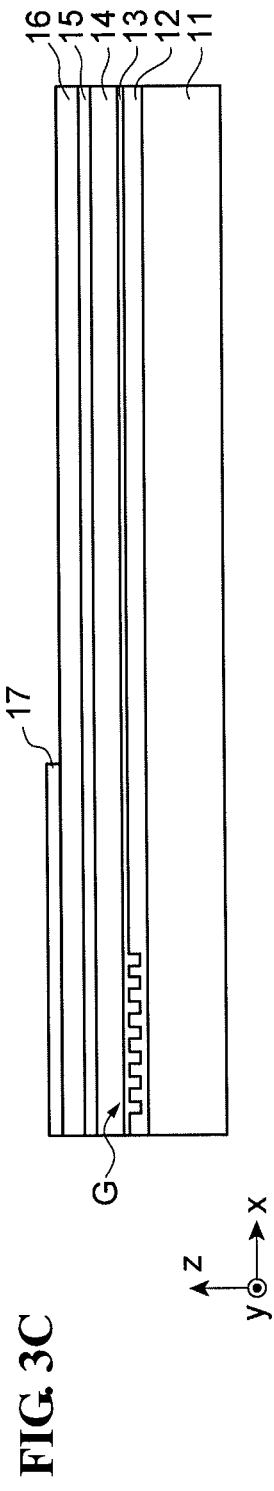

As illustrated in FIG. 3C, a butt-joint mask 17 is formed on the lower cladding layer 16 (butt-joint mask formation step). The butt-joint mask 17 is formed as described below. At first, a silicon nitride film having a thickness of about 250 nm is formed on the lower cladding layer 16 using a CVD method. Then, the silicon nitride film is patterned using photolithography to form the butt-joint mask 17. The butt-joint mask 17 is provided in a predetermined region including one end in the longitudinal direction.

As illustrated in FIG. 4A, the lower cladding layer 16 is etched with an aqueous solution of 48% hydrobromic acid and water, the mixing ratio by volume of 48% hydrobromic acid to water being 2:1, to form a (111) facet. This etching is stopped at the etch-stop layer 15. The etch-stop layer 15 and the active layer 14 are etched with an aqueous solution of 36% hydrochloric acid, 31% aqueous hydrogen peroxide, and water, the mixing ratio by volume of 36% hydrochloric acid, 31% aqueous hydrogen peroxide, and water being 1:2:7. This etching is stopped at the spacer layer 13. The spacer layer 13 is etched with the aqueous solution of 48% hydrobromic acid and water, the mixing ratio by volume of 48% hydrobromic acid to water being 2:1 (butt-joint selective etching step).

As illustrated in FIG. 4B, butt-joint epitaxial growth is performed by a metal organic chemical vapor deposition (MOCVD) method (butt-joint selective epitaxial growth step). An active layer 24 is grown on the grating layer 12 exposed by the etching in the butt-joint selective etching step with the butt-joint mask 17 as a mask for selective growth. The active layer 24 has, for example, a MQW structure. Compositions and thicknesses of well layers and barrier layers that constitute the MQW structure of the active layer 24 are adjusted in such a manner that the active layer 24 has a PL wavelength of 1.48 µm. The well layers and the barrier layers are composed of, for example, III-V group compound semiconductors, such as GaInAsP and AlGaInAs. The active layer 24 is grown so as to be located at the same height position as the active layer 14. An etch-stop layer 25 is grown on the active layer 24. A lower cladding layer 26 is grown on the etch-stop layer 25. The etch-stop layer 25 is configured to be the same as the etch-stop layer 15. That is, the etch-stop layer 25 is composed of, for example, InGaAsP having a composition with a PL wavelength of 1.15 µm and has a thickness of, for example, about 20 nm. The lower cladding layer 26 is configured to be the same as the lower cladding layer 16. That is, the lower cladding layer 26 is composed of, for example, p-type InP. The lower cladding layer 26 has a thickness of, for example, about 600 nm and an impurity concentration of, for example, about $5\times10^{17}$ cm$^{-3}$.

As illustrated in FIG. 4C, the butt-joint mask 17 is removed with hydrofluoric acid. An upper cladding layer 27 and a contact layer 28 are grown, in that order, on the lower cladding layers 16 and 26 by an MOCVD method (contact epitaxial growth step). The upper cladding layer 27 is composed of, for example, p-type InP and has a thickness of, for example, about 1.6 µm. The upper cladding layer 27 has impurity concentrations of about $5\times10^{17}$ cm$^{-3}$ in its lower portion and about $1.5\times10^{18}$ cm$^{-3}$ in its upper portion. The contact layer 28 is composed of, for example, InGaAs lattice-matched to InP. The contact layer 28 has a thickness of, for example, about 250 nm and an impurity concentration of, for example, about $1.5\times10^{19}$ cm$^{-3}$. In this way, a first stacked semiconductor layer 10a and a second stacked semiconductor layer 10b are formed on the semiconductor substrate 11 in the first direction. Here, the first stacked semiconductor layer 10a includes the grating layer 12, the active layer 24, the etch-stop layer 25, the lower cladding layer 26, the upper cladding layer 27, and the contact layer 28. The second stacked semiconductor layer 10b includes the grating layer 12, the spacer layer 13, the active layer 14, the etch-stop layer 15, the lower cladding layer 16, the upper cladding layer 27, and the contact layer 28.

As illustrated in FIG. 1, the semiconductor substrate 11 includes a first region 11a where the high-mesa optical waveguide 20 is formed and the second region 11b where the ridge-type optical waveguide 30 is formed. A third region 11c where the conversion region 40 is formed may be provided between the first region 11a and the second region 11b. That is, in the semiconductor substrate 11, the first region 11a, the third region 11c, and the second region 11b are arranged in that order in the first direction. In the epitaxial growth step S01, the first stacked semiconductor layer 10a is provided on the first region 11a as illustrated in FIG. 5A. As illustrated in FIGS. 5B and 5C, the second stacked semiconductor layer 10b is provided on the second region 11b and the third region 11c. The semiconductor substrate 11 includes a waveguide formation region 11d where the stripe-shaped optical waveguide S is formed; and a pair of terrace formation regions 11e and 11f where a pair of terraces T is formed, the waveguide formation region 11d and the terrace formation regions 11e and 11f being arranged in the second direction, and the waveguide formation region 11d being provided between the terrace formation regions 11e and 11f.

Figure 6A:
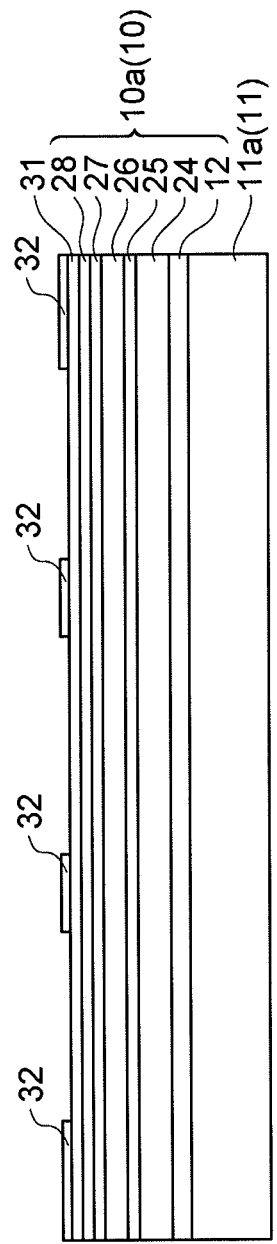
FIGS. 6A to 6C illustrate a procedure subsequent to the procedure in FIGS. 5A to 5C.
Figure 6B:
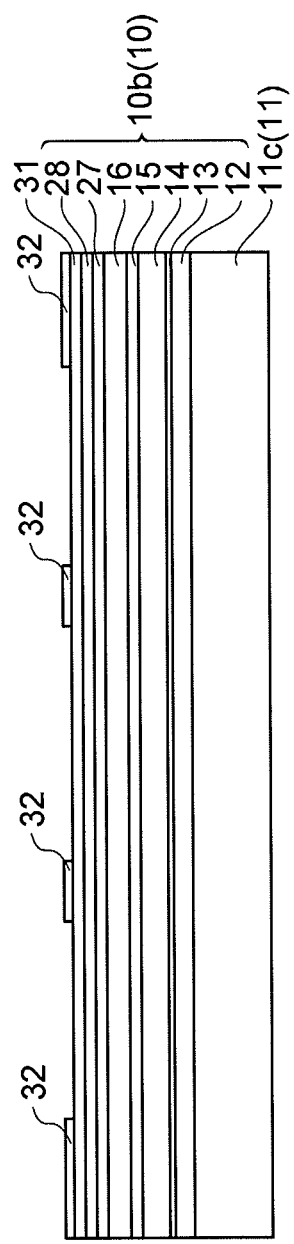
Figure 6C:
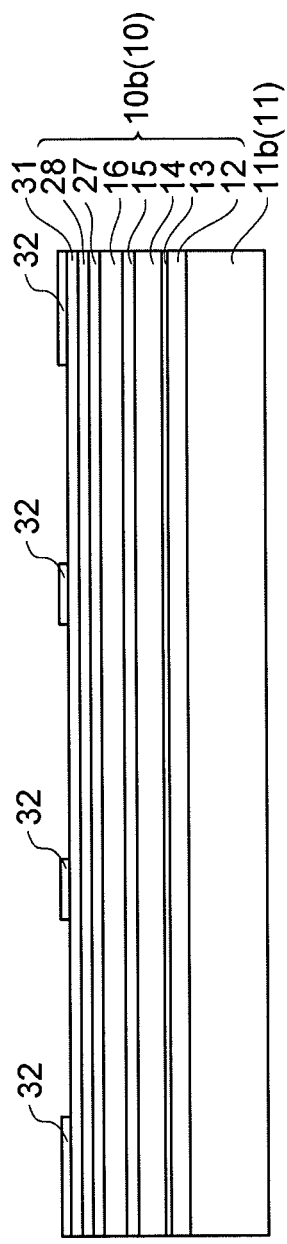
Figure 7A:
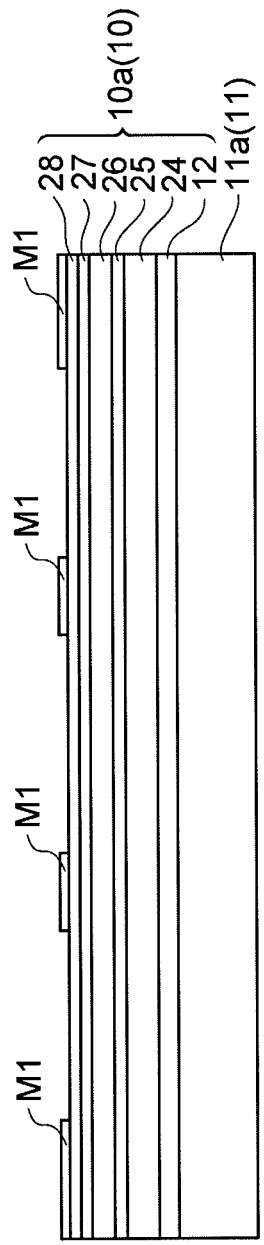
FIGS. 7A to 7C illustrate a procedure subsequent to the procedure in FIGS. 6A to 6C.
Figure 7B:
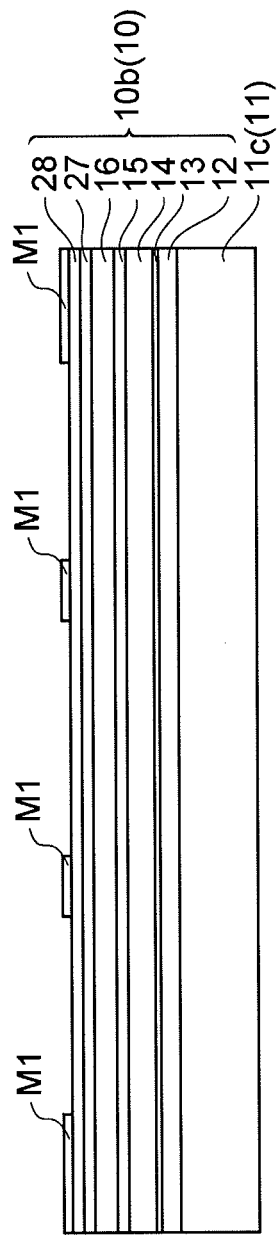
Figure 7C:
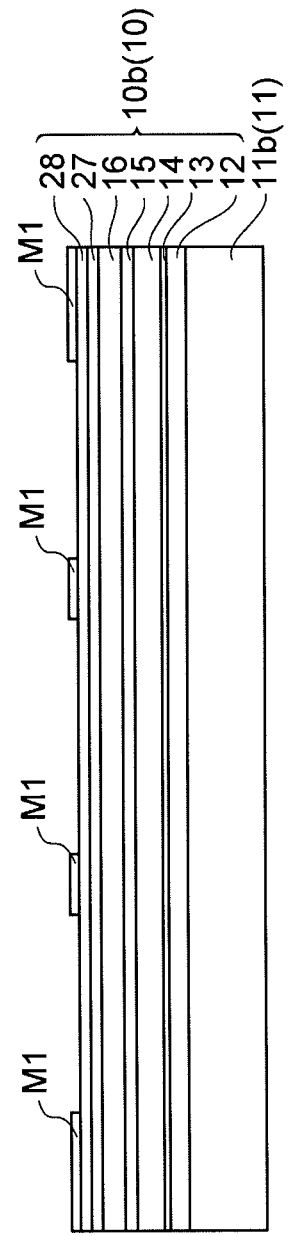
Figure 8:
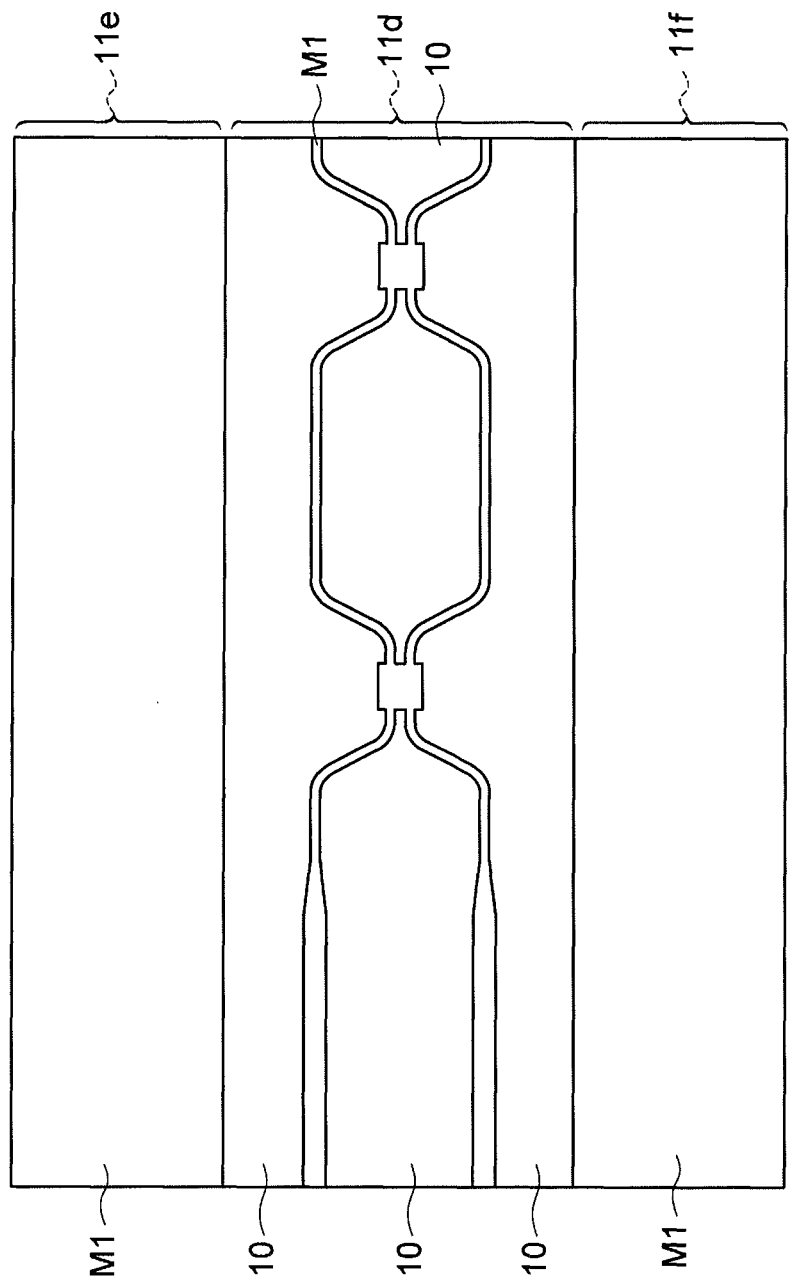
FIG. 8 illustrates a first mask formed in the first mask formation step in the method for producing the semiconductor optical device in FIG. 1.

In the first mask formation step S02, the stripe-shaped optical waveguide S and first masks for the terraces T are formed on the stacked semiconductor layer 10. The first mask formation step S02 will be specifically described with reference to FIGS. 1 and 6A to 8. FIGS. 6A and 7A are schematic cross-sectional views taken along line A-A in FIG. 1 in the first mask formation step S02. FIGS. 6B and 7B are schematic cross-sectional views taken along line B-B in FIG. 1 in the first mask formation step S02. FIGS. 6C and 7C are schematic cross-sectional views taken along line C-C in FIG. 1 in the first mask formation step S02. FIG. 8 illustrates the first masks formed in the first mask formation step S02.

As illustrated in FIGS. 6A to 6C, a silicon nitride film 31 is formed on the stacked semiconductor layer 10 (contact layer 28) by a CVD method. The silicon nitride film 31 has a thickness of, for example, about 200 nm. Resist masks 32 are formed on the silicon nitride film 31 by photolithography so as to cover regions of the silicon nitride film 31 corresponding to the stripe-shaped optical waveguide S and the terraces T. The silicon nitride film 31 is etched by, for example, ME using $CF_4$ gas as an etching gas with the resist masks 32 as etching masks, thereby forming silicon nitride film masks 31m (not illustrated). As illustrated in FIGS. 7A to 7C, the resist masks 32 are removed to form first masks M1 including the silicon nitride film masks 31m. As illustrated in FIG. 8, the first masks M1 are formed so as to cover portions of the stacked semiconductor layer 10 where the stripe-shaped optical waveguide S and the terraces T will be formed.

Figure 9A:
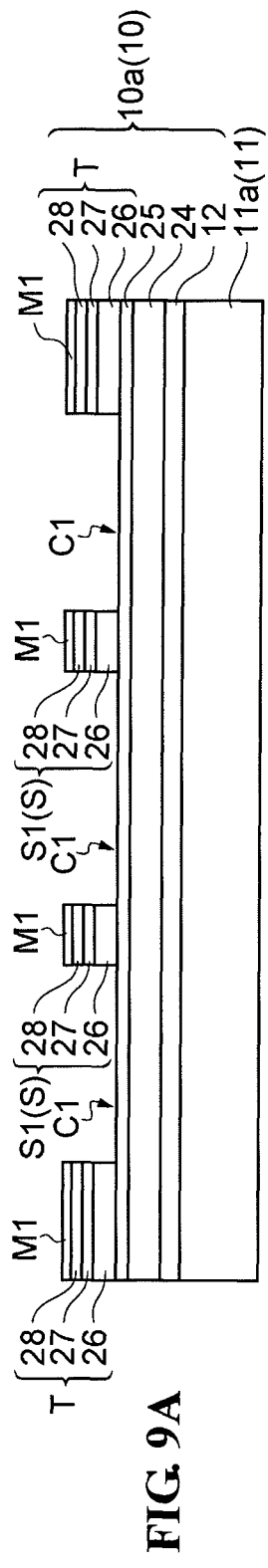
FIGS. 9A to 9C illustrate a first etching step in the method for producing the semiconductor optical device in FIG. 1.
Figure 9B:
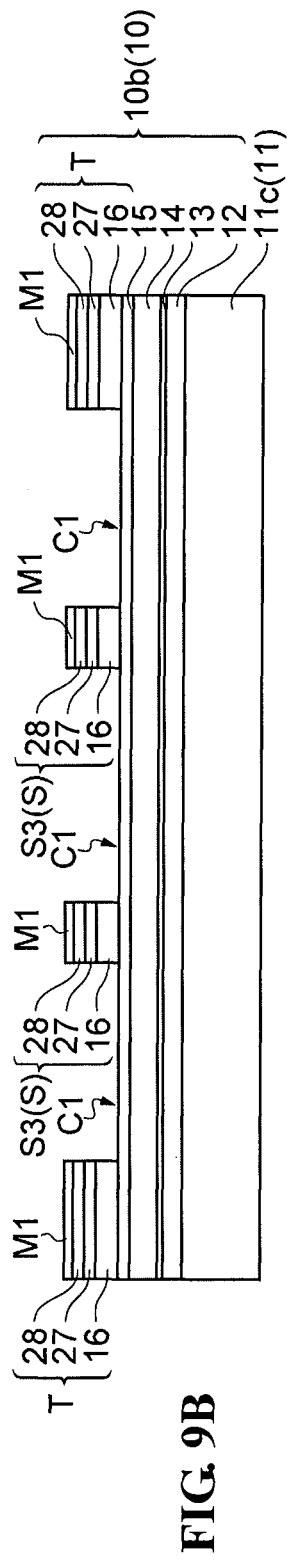
Figure 9C:
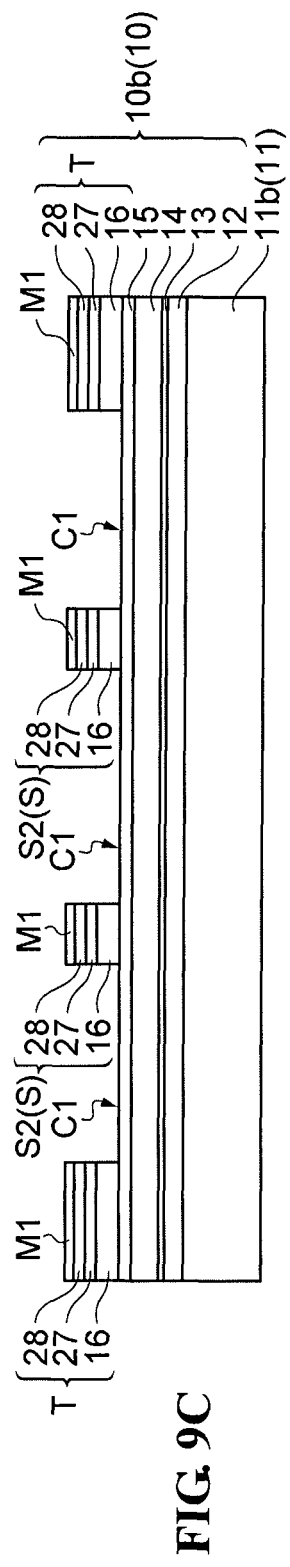

In the first etching step S03, the stacked semiconductor layer 10 is etched with the first masks M1 as etching masks to form the stripe-shaped optical waveguide S. In the first etching step S03, the contact layer 28, the upper cladding layer 27, and the lower cladding layers 16 and 26 are etched in that order by, for example, RIE using $SiCl_4$ gas as an etching gas, as illustrated in FIGS. 9A to 9C. In the first etching step S03, the etch rate of the etch-stop layers 15 and 25 is relatively low comparing with the etch rate of other layers constituting the stacked semiconductor layer, thus stopping the etching at the etch-stop layers 15 and 25. In the first etching step S03, the first recess C1 is formed in the stacked semiconductor layer 10. In this step, a plasma spectrum originating from an element in the composition of the etch-stop layers 15 and 25 may be detected with, for example, a plasma monitor, and the etching may be stopped when the plasma spectrum is detected.

In this way, the stacked semiconductor layer 10 is processed to form the first recess C1 in the first etching step S03. In this step, the stripe-shaped optical waveguide S is formed on the waveguide formation region 11d. The terraces Te and Tf are formed on the terrace formation regions 11e and 11f. The stripe-shaped optical waveguide S includes the first stripe-shaped waveguide section S1 on the first region 11a and the second stripe-shaped waveguide section S2 on the second region 11b. When the third region 11c is provided, the stripe-shaped optical waveguide S further includes the third stripe-shaped waveguide section S3 on the third region 11c. In this case, one end of the third stripe-shaped waveguide section S3 is connected to one end of the first stripe-shaped waveguide section S1. The other end of the third stripe-shaped waveguide section S3 is connected to one end of one end of the second stripe-shaped waveguide section S2.

Figure 14A:
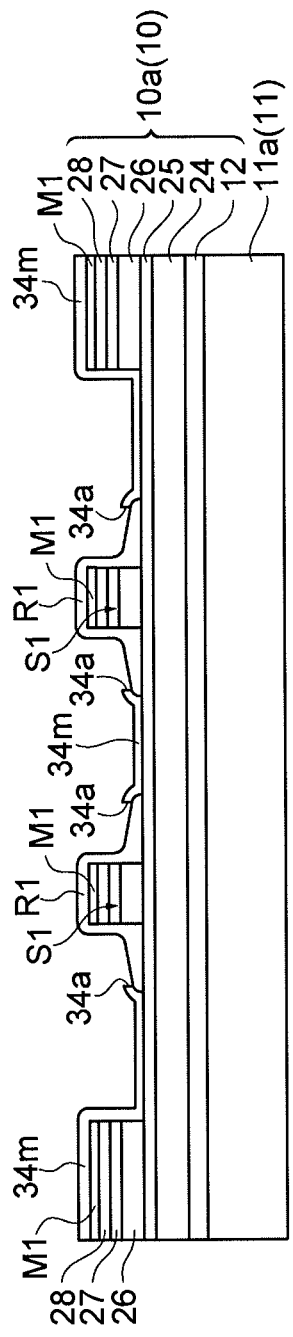
FIGS. 14A to 14C illustrate a procedure subsequent to the procedure in FIGS. 13A to 13C.
Figure 14B:
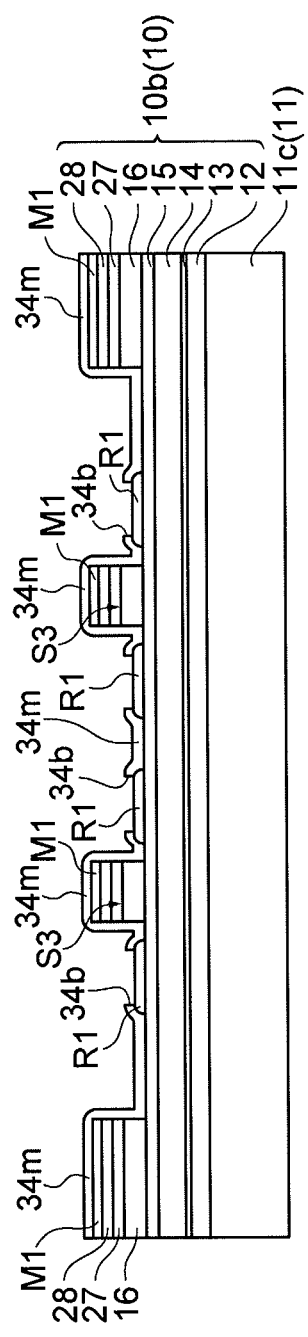
Figure 14C:
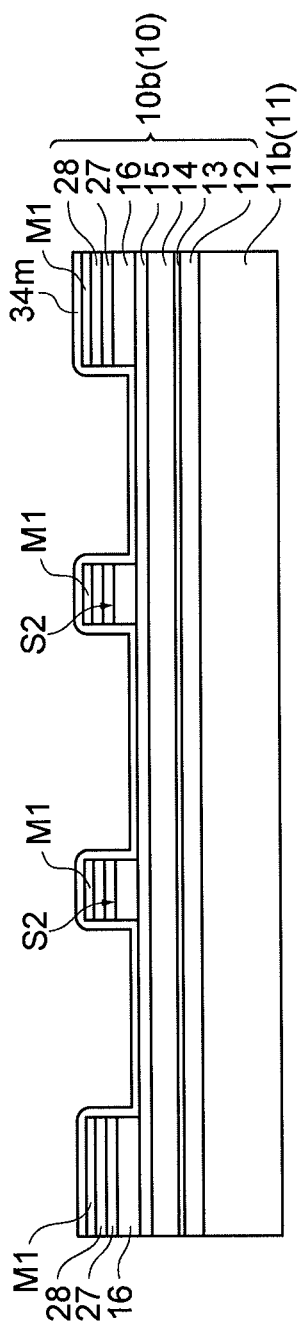
Figure 15A:
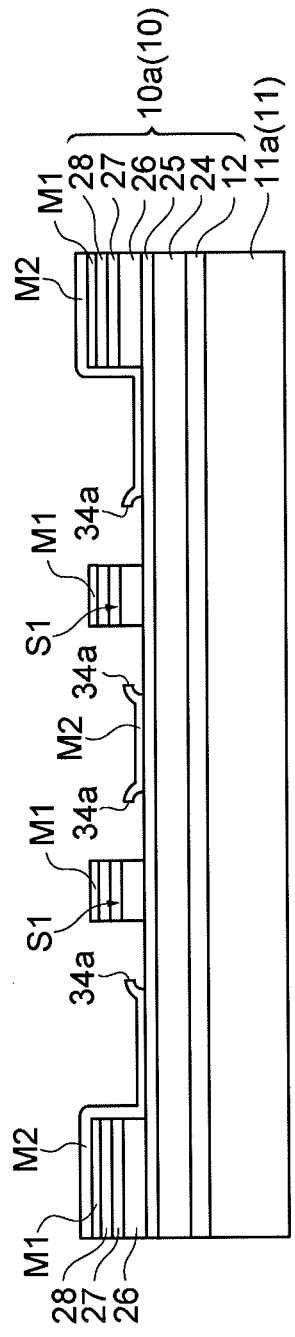
FIGS. 15A to 15C illustrate a procedure subsequent to the procedure in FIGS. 14A to 14C.
Figure 15B:
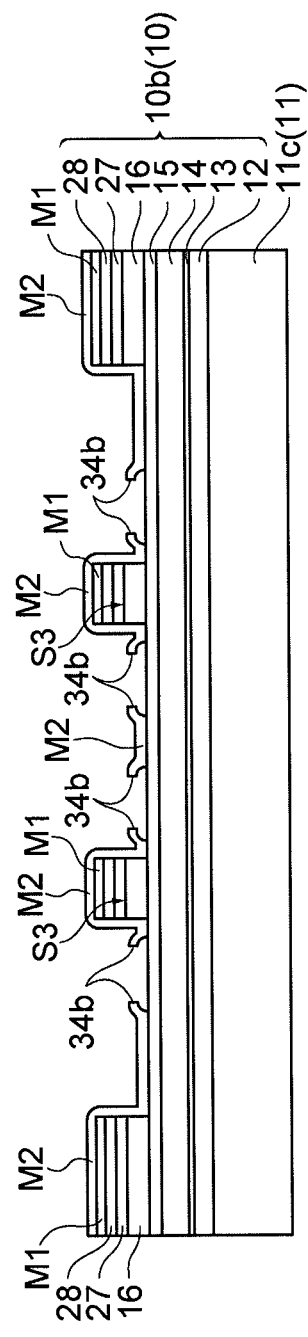
Figure 15C:
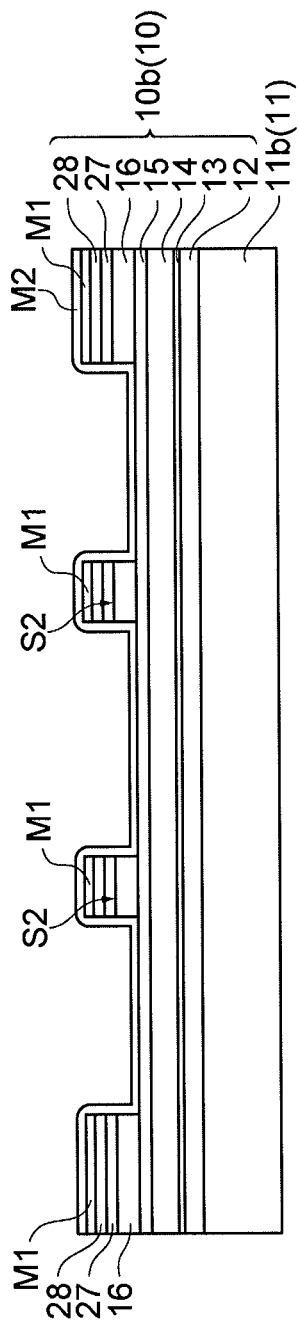
Figure 16:
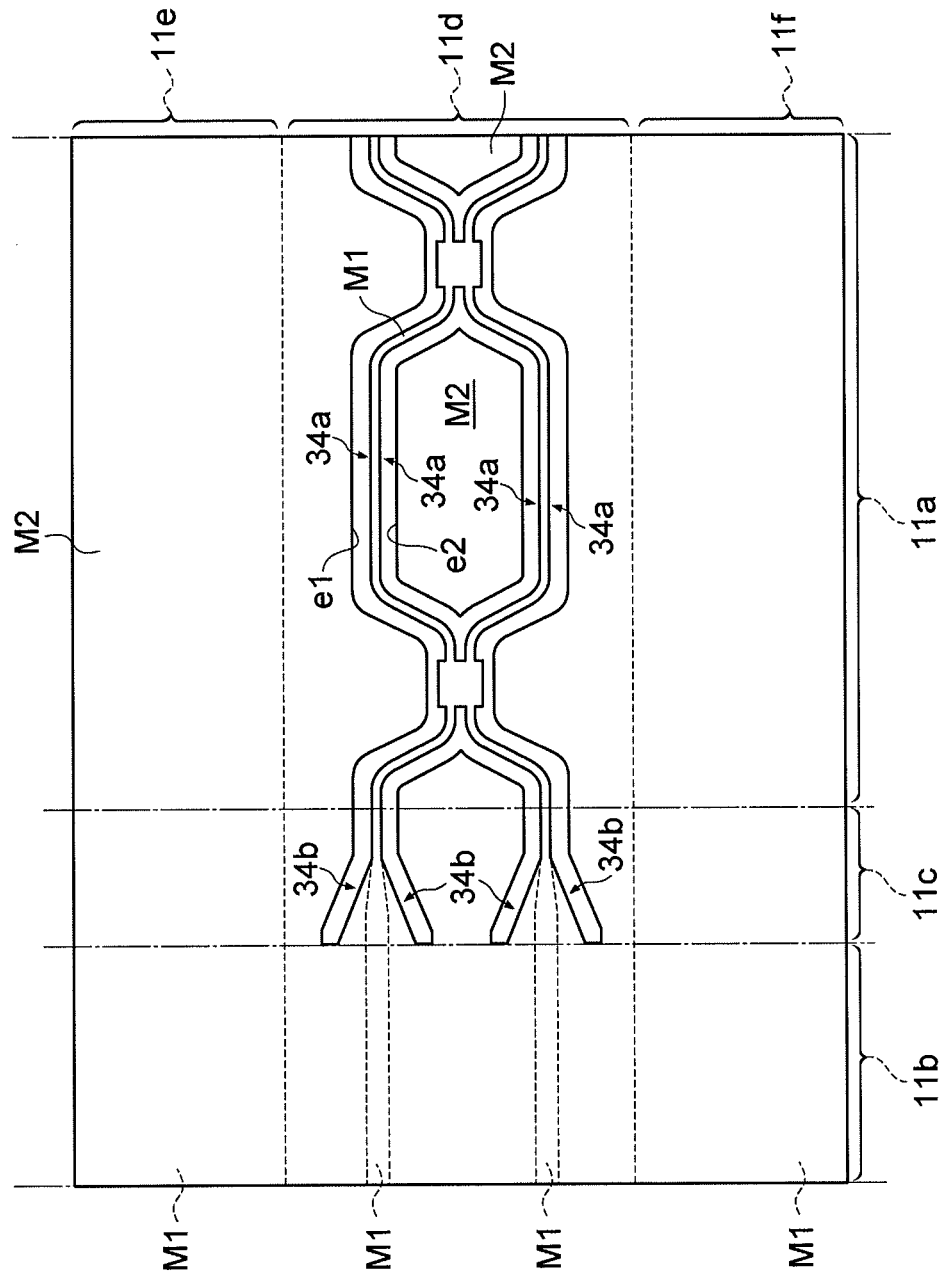
FIG. 16 illustrates a second mask formed in a second mask formation step in the method for producing the semiconductor optical device in FIG. 1.

In the second mask formation step S04, a second mask M2 used to form the high-mesa optical waveguide 20 are formed on the stacked semiconductor layer 10 processed in the first etching step S03. The second mask formation step S04 will be specifically described with reference to FIGS. 10A to 16. FIGS. 10A, 12A, 13A, 14A, and 15A are schematic cross-sectional views taken along line A-A in FIG. 1 in the second mask formation step S04. FIGS. 10B, 12B, 13B, 14B, and 15B are schematic cross-sectional views taken along line B-B in FIG. 1 in the second mask formation step S04. FIGS. 10C, 12C, 13C, 14C, and 15C are schematic cross-sectional views taken along line C-C in FIG. 1 in the second mask formation step S04. FIG. 11 illustrates a selection film formed in a procedure illustrated in FIGS. 10A to 10C. FIG. 16 illustrates the second mask formed in the second mask formation step S04.

Figure 10A:
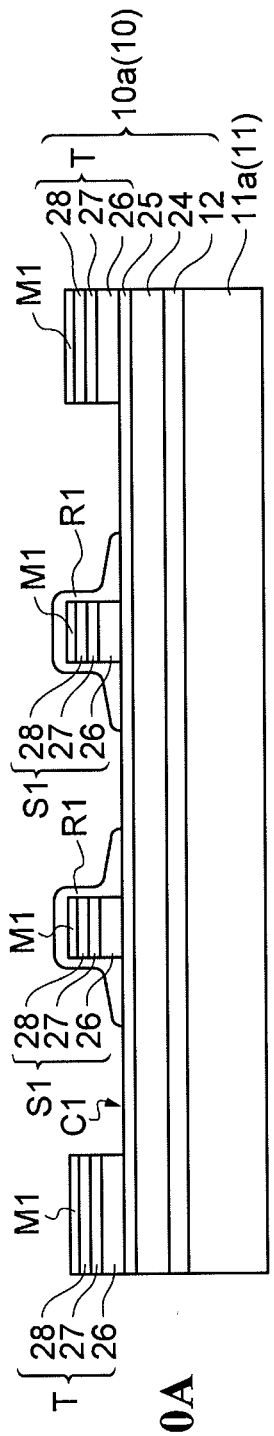
FIGS. 10A to 10C illustrate a procedure of a second mask formation step in the method for producing the semiconductor optical device in FIG. 1.
Figure 10B:
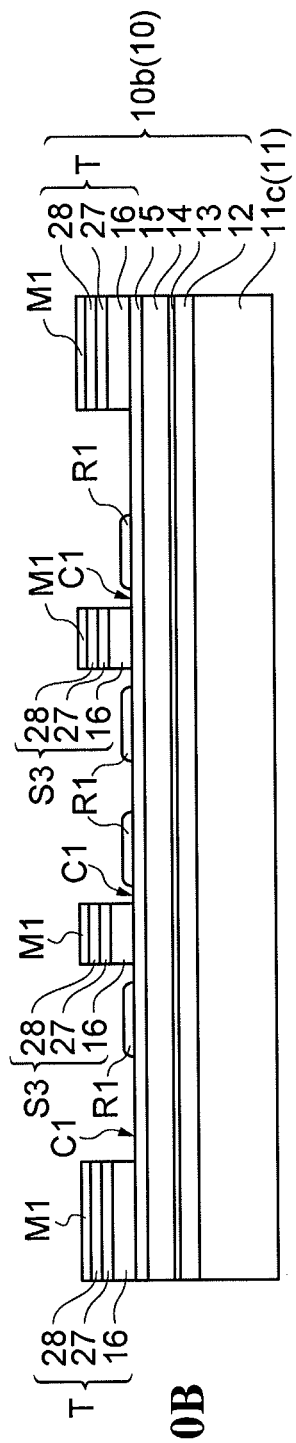
Figure 10C:
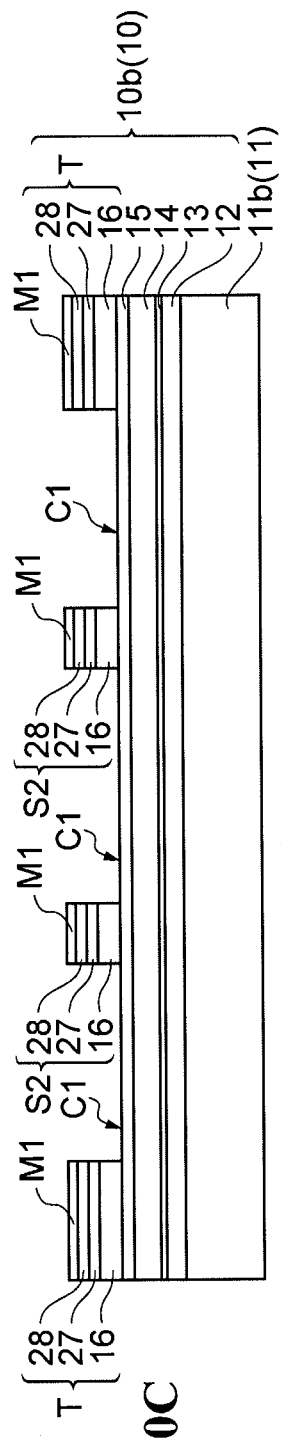
Figure 11:
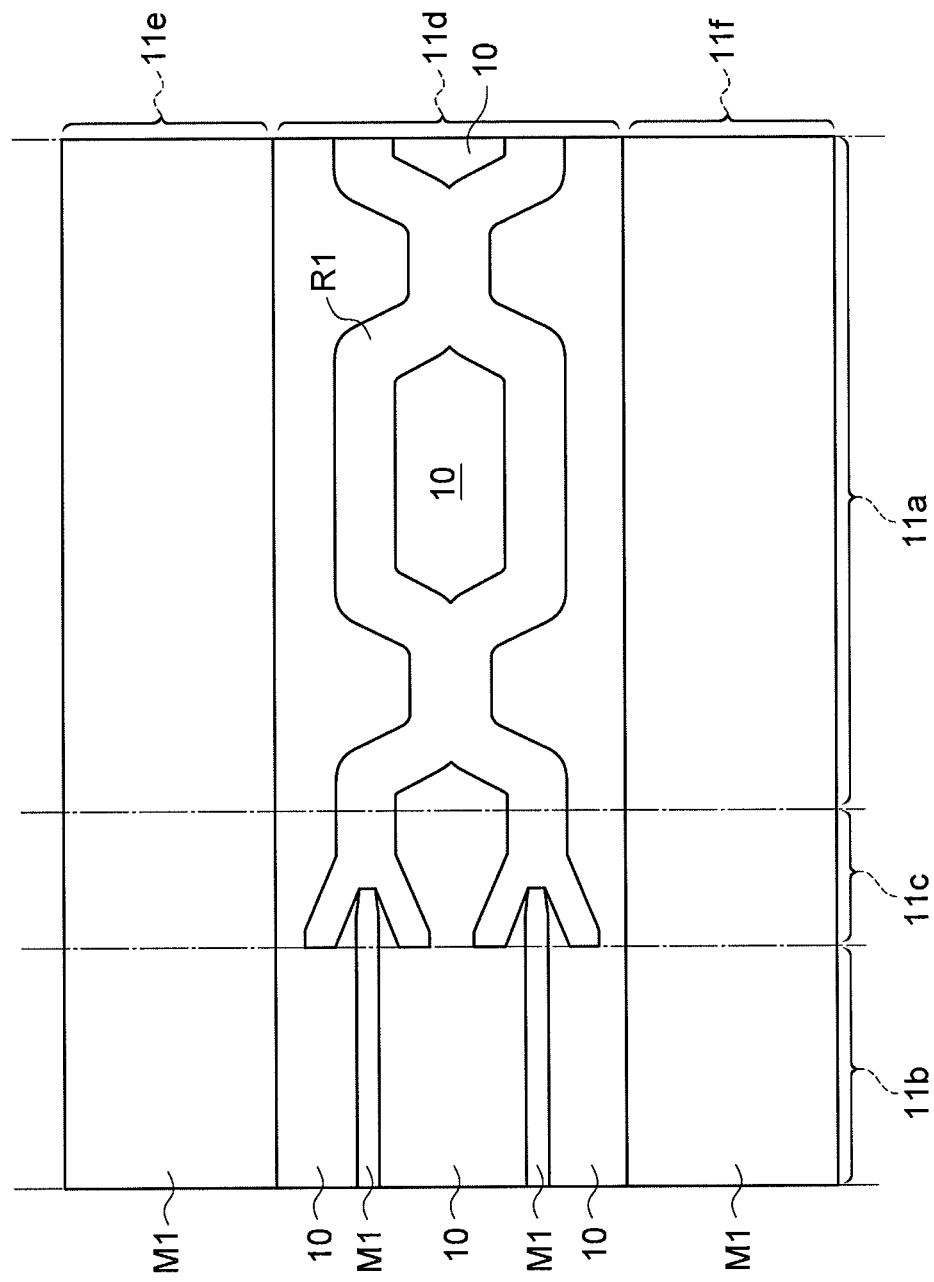
FIG. 11 illustrates a selection film formed in the procedure in FIG. 10A to 10C.

As illustrated in FIGS. 10A to 10C, a thermo-curable resin is spin-coated onto the stacked semiconductor layer 10 processed in the first etching step S03 while the first masks M1 are not removed but are left. The thermo-curable resin is, for example, a photosensitive resin with a low dielectric constant. The number of revolutions of a spin coater is adjusted in such a manner that the thermo-curable resin has a thickness of, for example, about 1500 nm, and the thermo-curable resin is applied onto the stacked semiconductor layer 10. The thermo-curable resin is soft-baked in a $N_2$ atmosphere at 60° C. for 90 seconds. The thermo-curable resin is then exposed and developed by photolithography, thereby forming a pattern used to form a selection film R1 as illustrated in FIG. 11. The patterned thermo-curable resin is subjected to curing (thermal curing treatment) in a $N_2$ atmosphere at 300° C. for 60 minutes to form the selection film R1. The selection film R1 has thermosetting properties and a glass transition temperature of 350° C. or higher. Note that a photosensitive benzocyclobutene (BCB) resin is used as the thermo-curable resin.

As illustrated in FIGS. 10A to 10C and 11, the selection film R1 is provided above the first region 11a and the third region 11c and is not provided above the second region 11b. Above the first region 11a, the selection film R1 is provided so as to cover the top surface and both side surfaces of the first stripe-shaped waveguide section S1. The width of the selection film R1 is larger than that of the first stripe-shaped waveguide section S1. Above the third region 11c in the vicinity of the boundary between the first region 11a and the third region 11c, the selection film R1 is provided so as to cover the top surface and both side surfaces of the third stripe-shaped waveguide section S3. Above the third region 11c, the selection film R1 is provided so as to be gradually separated from both side surfaces of the third stripe-shaped waveguide section S3 from the boundary between the first region 11a and the third region 11c toward the boundary between the third region 11c and the second region 11b. In addition, above the third region 11c, the selection film R1 has a substantially V-shape (see FIG. 11). As described above, a region where the selection film R1 is formed (selection film formation region) is formed so as to cover a region where the second recess C2 is formed in the second etching step S05 described below. In other words, the selection film formation region is formed so as to cover a first opening formation region where a first opening 34a of the second mask M2 is formed and a second opening formation region where a second opening 34b of the second mask M2 is formed.

As illustrated in FIGS. 12A to 12C, a silicon nitride film 34 is formed by a CVD method on the stacked semiconductor layer 10 where the selection film R1 has been formed. The silicon nitride film 34 has a thickness of, for example, about 300 nm. At this time, the deposition temperature of the silicon nitride film 34 is about 220° C. The selection film R1 has a glass transition temperature of 350° C. or higher. Thus, the silicon nitride film 34 is formed without the influence of the deposition temperature on the selection film R1. A resist mask 35 including an opening 35a and an opening 35b is formed on the selection film formation region of the silicon nitride film 34 by photolithography. The opening 35a is provided on the selection film formation region above the first region 11a. The opening 35b is provided on the selection film formation region above the third region 11c. That is, edges of the opening 35a and edges of the opening 35b are located above the selection film R1.

Figures 13A, 13B, 13C:
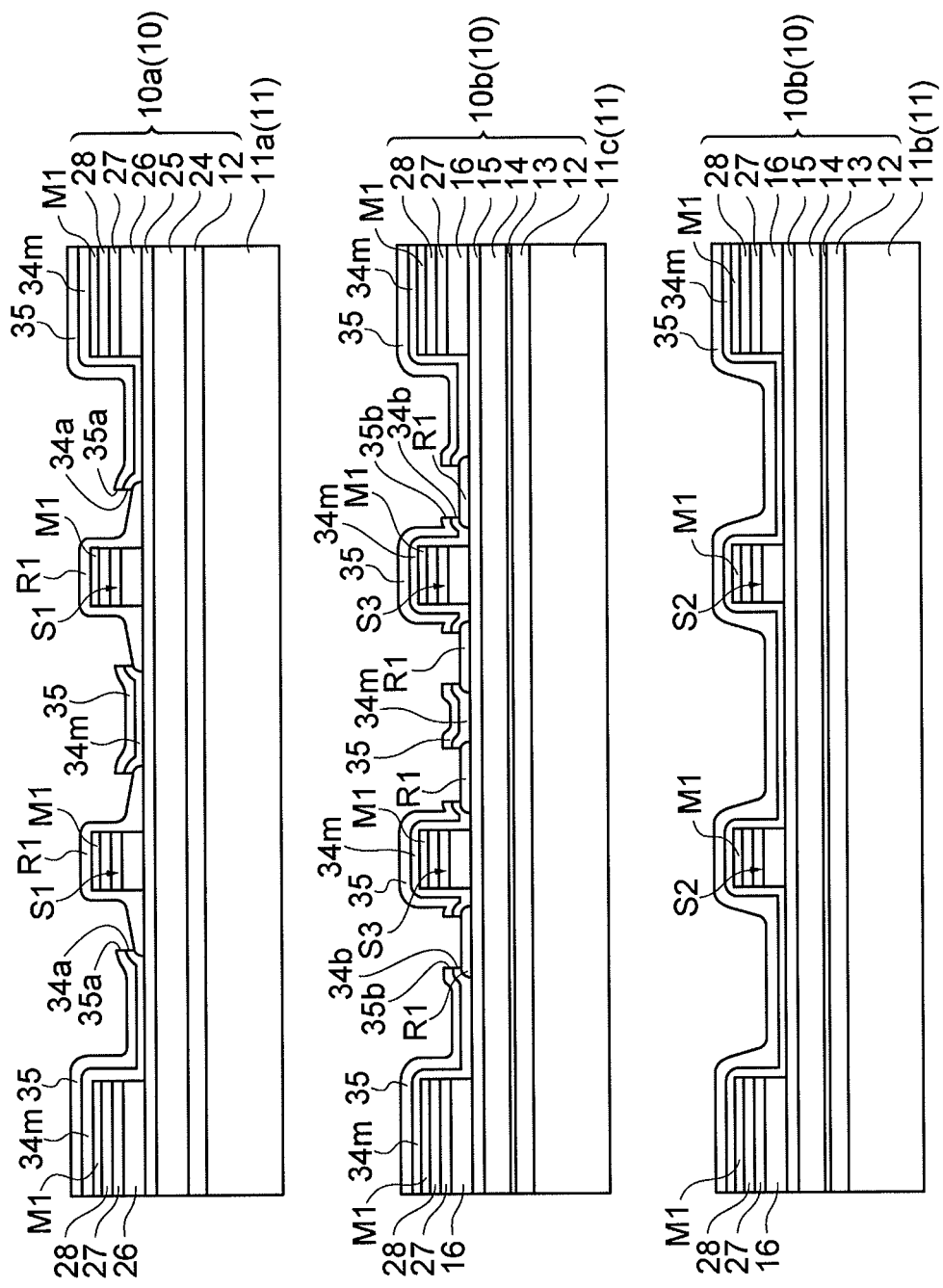
FIGS. 13A to 13C illustrate a procedure subsequent to the procedure in FIGS. 12A to 12C.

As illustrated in FIGS. 13A to 13C, the silicon nitride film 34 is etched with the resist mask 35 as an etching mask by RIE using $CF_4$ gas as an etching gas to form a silicon nitride film mask 34m. As illustrated in FIGS. 14A to 14C, the resist mask 35 is removed with an organic solvent, for example, acetone or isopropyl alcohol. As illustrated in FIGS. 15A to 15C, the selection film R1 is removed with the silicon nitride film mask 34m using oxygen plasma to form the second mask M2 including the silicon nitride film mask 34m. When the selection film R1 is composed of a photosensitive BCB resin, the selection film R1 may be removed by RIE plasma etching using a gas mixture of $CF_4$ gas and oxygen gas as an etching gas.

As illustrated in FIG. 16, the second mask M2 includes the first opening 34a and the second opening 34b. The second mask M2 is formed on the stacked semiconductor layer 10 where the first masks M1 is provided. The first opening 34a is formed in the silicon nitride film 34 by etching the silicon nitride film 34 through the opening 35a of the resist mask 35. The second opening 34b is formed in the silicon nitride film 34 by etching the silicon nitride film 34 through the opening 35b of the resist mask 35. That is, the first opening 34a extends along the waveguiding direction. The first opening 34a includes a first opening edge e1 remote from one side surface of the first stripe-shaped waveguide section S1; and a second opening edge e2 remote from the other side surface of the first stripe-shaped waveguide section S1. That is, the width of the first opening 34a is larger than that of the first stripe-shaped waveguide section S1. The first opening edge e1 and the second opening edge e2 are located on a portion of the stacked semiconductor layer 10 uncovered with the first masks M1. In other words, the first opening edge e1 and the second opening edge e2 are located on the first recess C1. The second opening 34b is provided on the first recess C1 and extends along the waveguiding direction so as to be gradually separated from both side surfaces of the third stripe-shaped waveguide section S3. The second mask M2 is stacked on the first masks M1 provided on the terraces T, the second stripe-shaped waveguide section S2, and the third stripe-shaped waveguide section S3.

Figure 17A:
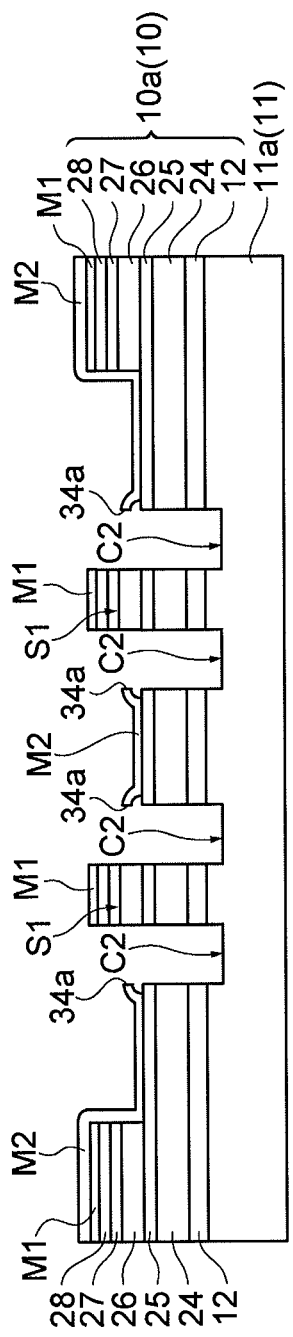
FIGS. 17A to 17C illustrate a second etching step in the method for producing the semiconductor optical device in FIG. 1.
Figure 17B:
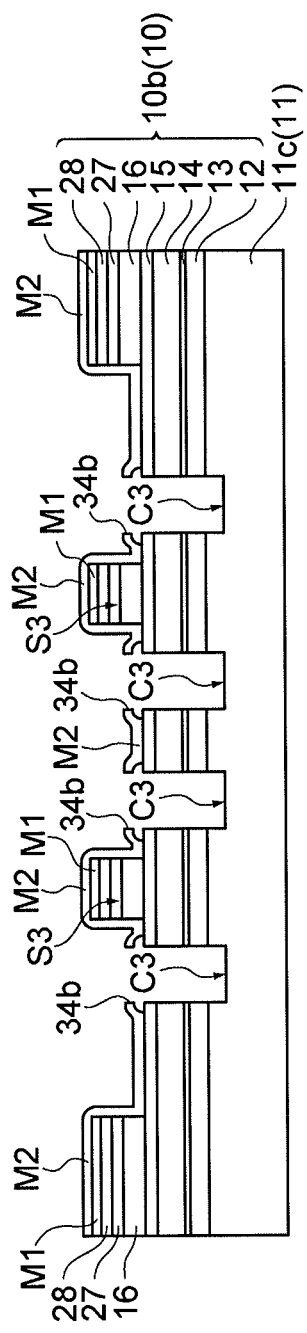
Figure 17C:
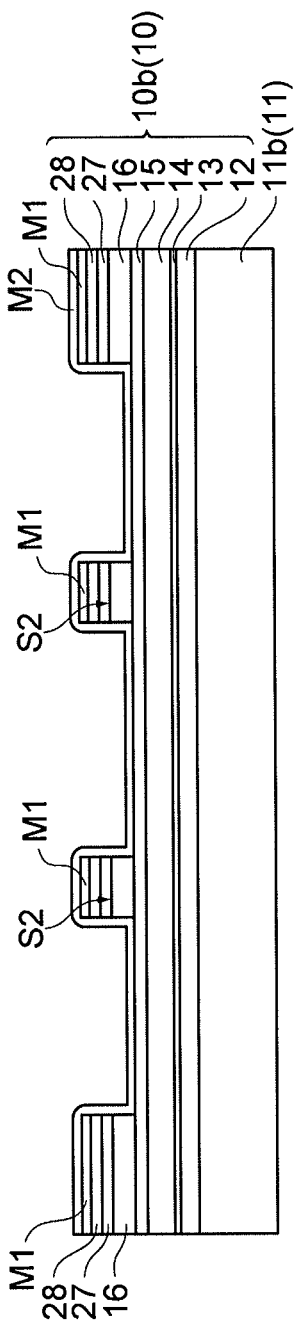

In the second etching step S05, the stacked semiconductor layer 10 on the first region 11a and the third region 11c is etched with the first masks M1 and the second mask M2 as etching masks, thereby forming a mesa structure used to form the high-mesa optical waveguide 20. In the second etching step S05, the etch-stop layers 15 and 25, the active layers 14 and 24, the spacer layer 13, and the grating layer 12 are etched in that order by, for example, RIE using $SiCl_4$ gas as an etching gas, as illustrated in FIGS. 17A to 17C. In the second etching step S05, the semiconductor substrate 11 is etched from the back surface of the grating layer 12 (from the main surface of the semiconductor substrate 11) to a depth of, for example, about 250 nm. This etching results in the formation of the second recess C2 on the first region 11a and the formation of the third recess C3 on the third region 11c. The mesa structure to form the high-mesa optical waveguide 20 is defined by the second recess C2. In this case, an etching time required to achieve a predetermined etch depth may be calculated from a previously measured etch rate, and the etching may be performed for the calculated etching time.

Figure 18A:
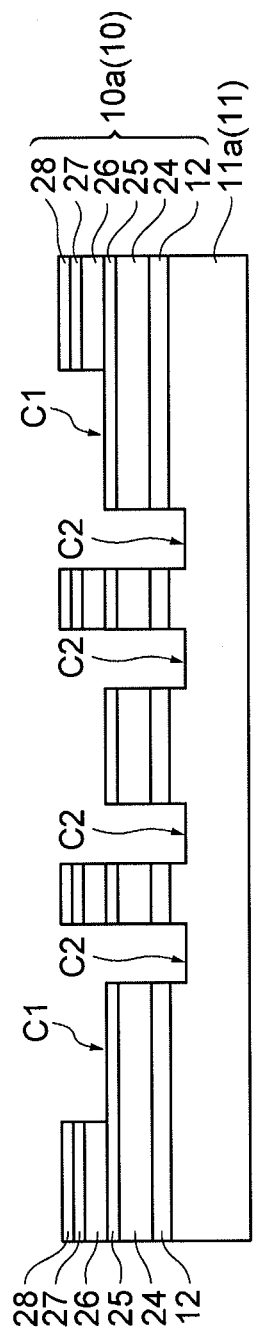
FIGS. 18A to 18C illustrate a first and second mask removal step in the method for producing the semiconductor optical device in FIG. 1.
Figure 18B:
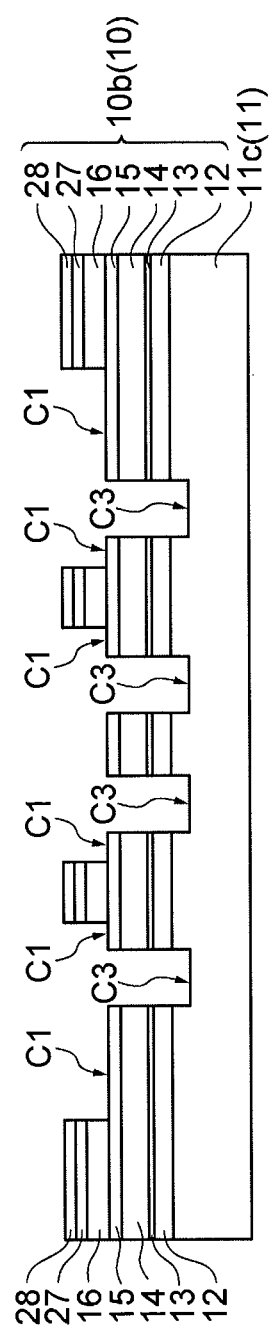
Figure 18C:
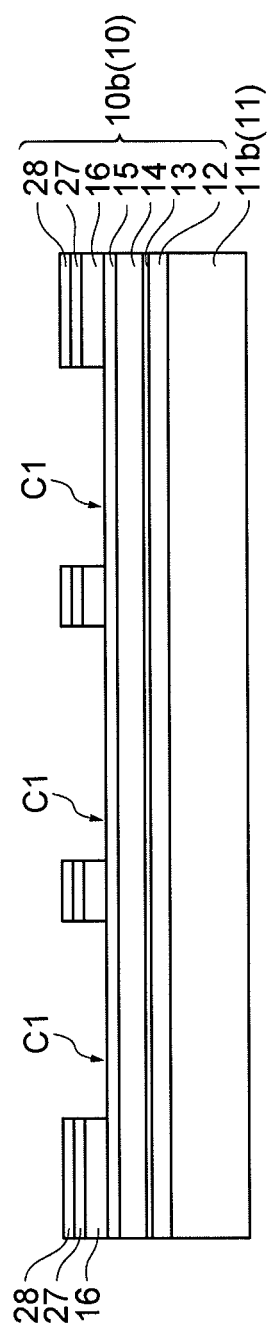

In the first and second mask removal step S06, the first masks M1 and the second mask M2 are removed with, for example, hydrofluoric acid, as illustrated in FIGS. 18A to 18C.

Figure 19A:
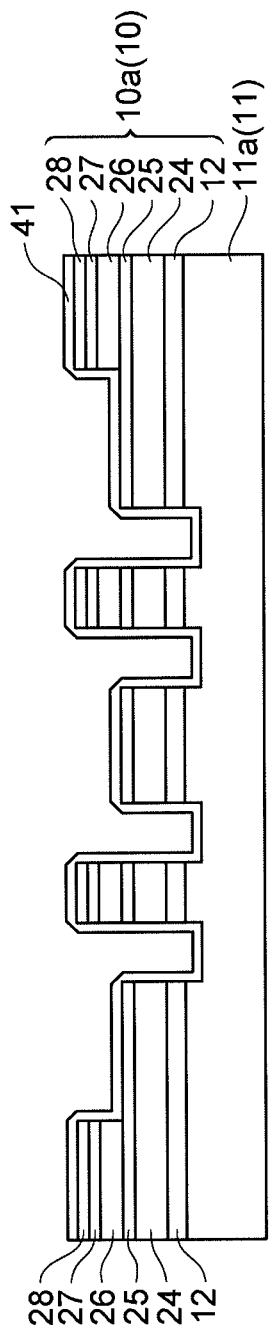
FIGS. 19A to 19C illustrate a protective film formation step in the method for producing the semiconductor optical device in FIG. 1.
Figure 19B:
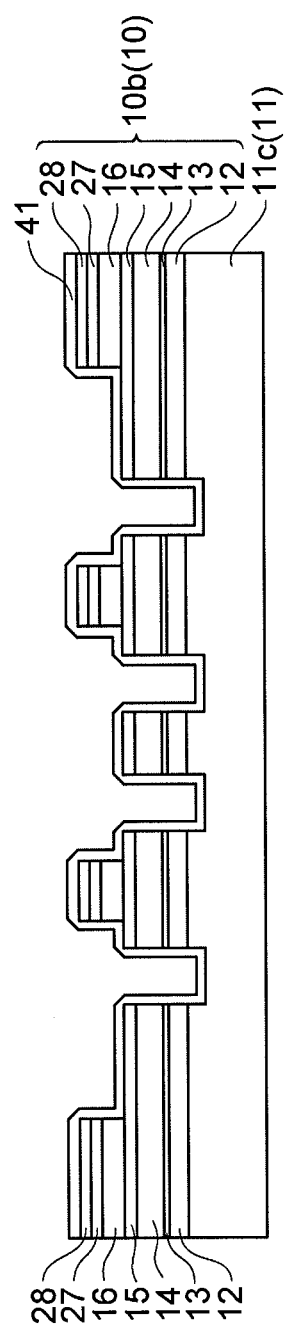
Figure 19C:
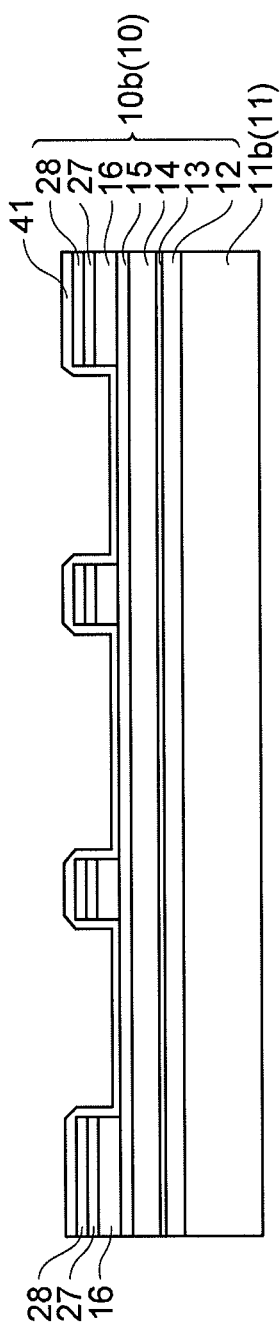

In the protective film formation step S07, a protective film (passivation film) 41 is formed by a CVD method on the stacked semiconductor layer 10 where the first recess C1 and the second recess C2 are formed, as illustrated in FIGS. 19A to 19C. The protective film 41 is formed of an insulating film composed of for example, silicon nitride.

Figure 20A:
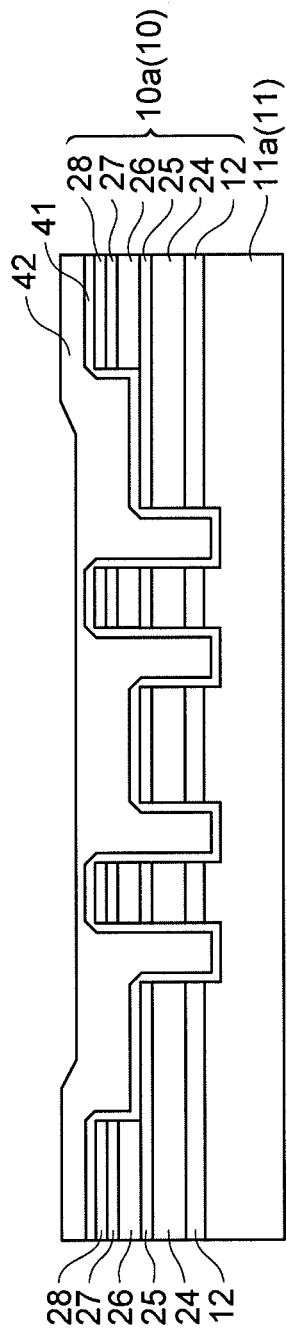
FIGS. 20A to 20C illustrate a buried layer formation step in the method for producing the semiconductor optical device in FIG. 1.
Figure 20B:
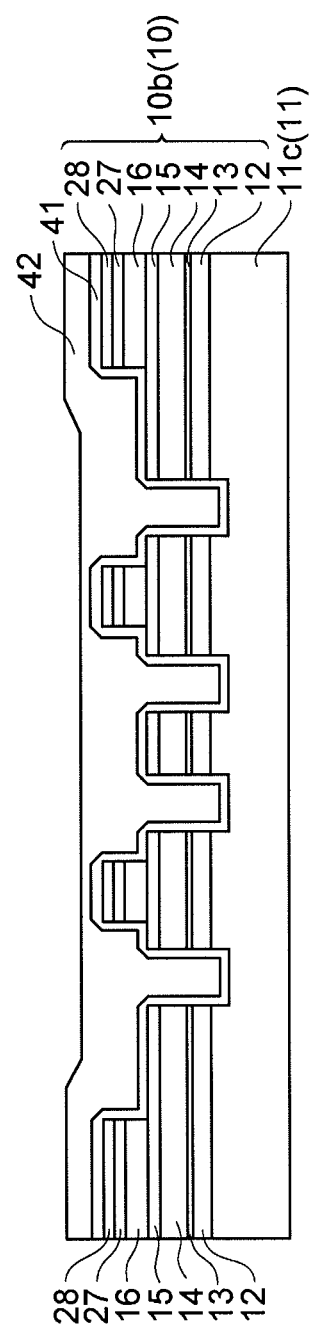
Figure 20C:
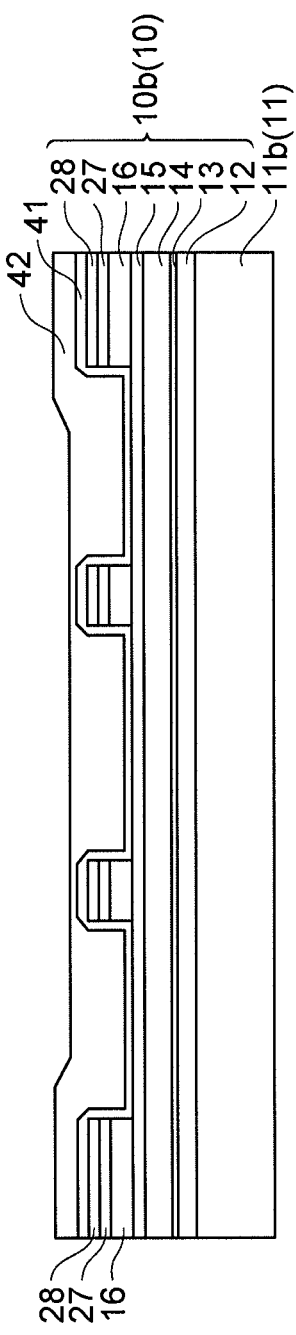

In the buried layer formation step S08, the first recess C1 and the second recess C2 are buried, and a buried layer 42 is formed to cover the stripe-shaped optical waveguide S and the terraces T, as illustrated in FIGS. 20A to 20C. The buried layer 42 is formed on the protective film 41. The buried layer 42 is formed of a low-dielectric-constant film composed of, for example, a BCB resin. In the buried layer formation step S08, the device is planarized.

Figure 21A:
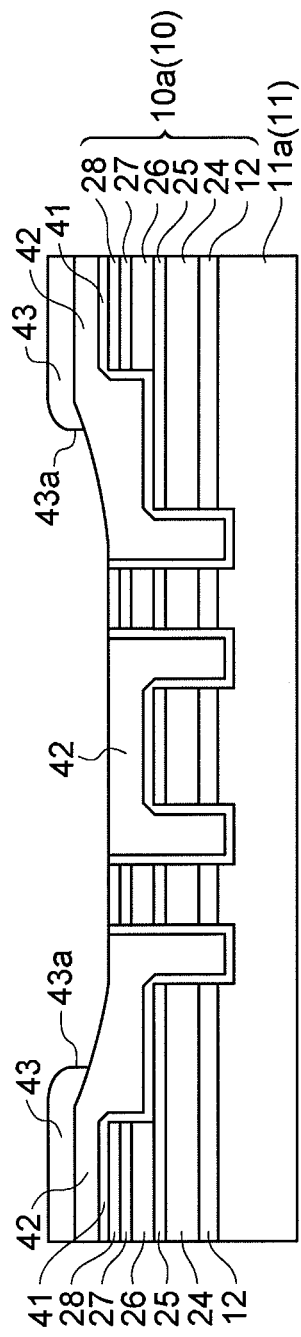
FIGS. 21A to 21C illustrate a procedure of an electrode formation step in the method for producing the semiconductor optical device in FIG. 1.
Figure 21B:
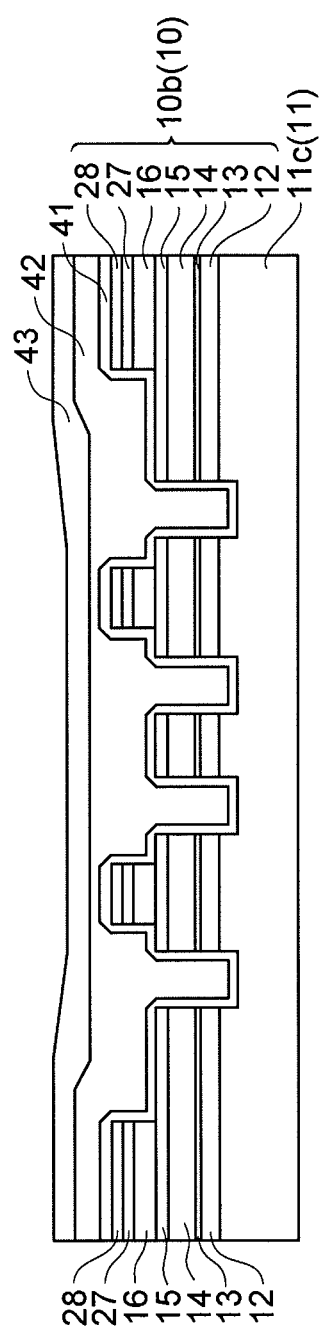
Figure 21C:
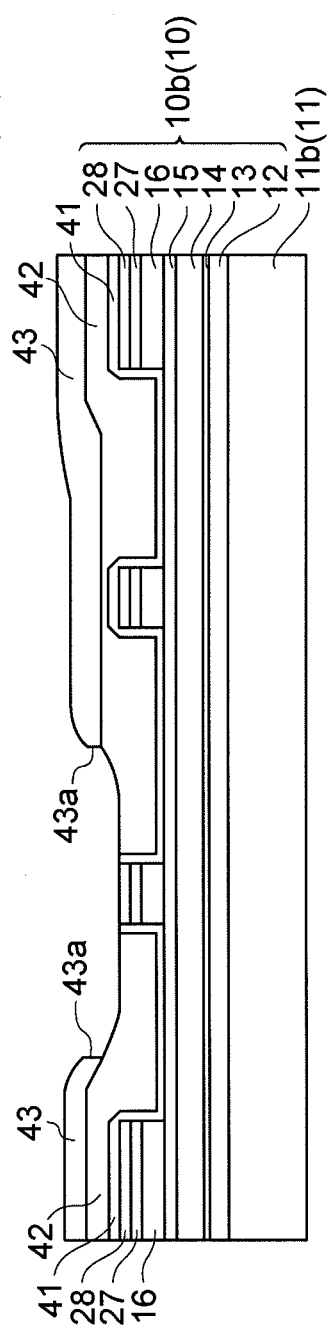

In the electrode formation step S09, a resist mask 43 is formed on the buried layer 42 by photolithography, as illustrated in FIGS. 21A to 21C. The resist mask 43 includes an opening 43a used to form an ohmic contact between an upper electrode E1 and the contact layer 28. In this embodiment, the opening 43a includes a first opening portion provided on the first ridge 30a and a second opening portion provided on the third mesa 20c and the fourth mesa 20d. The buried layer 42 is etched with the resist mask 43 as an etching mask by RIE using a gas mixture of $CF_4$ gas and $O_2$ gas. This etching is performed until the protective film 41 on the mesa structure and the ridge structure is exposed. The protective film 41 on the mesa structure and the ridge structure is etched by RIE using $CF_4$ gas until the contact layer 28 is exposed, thereby forming openings 42a, 42b, and 42c.

Figure 22A:
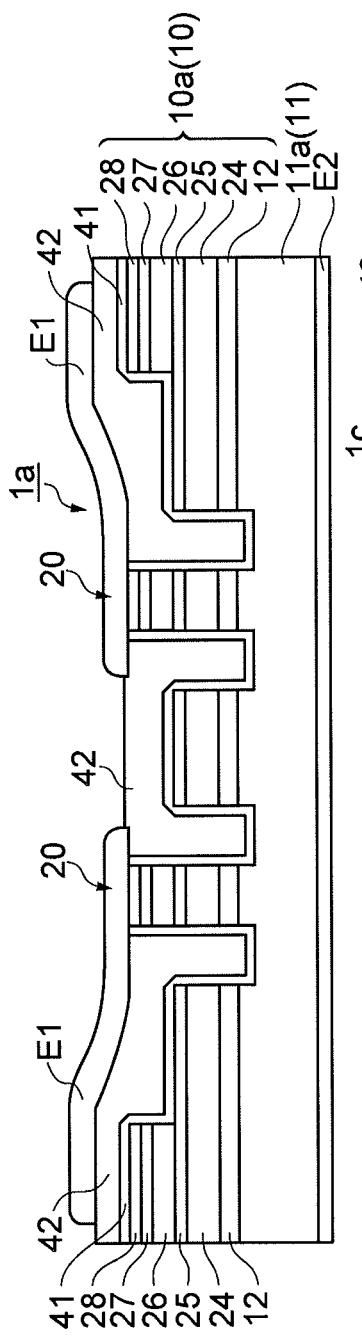
FIGS. 22A to 22C illustrate a procedure subsequent to the procedure in FIGS. 21A to 21C.
Figure 22B:
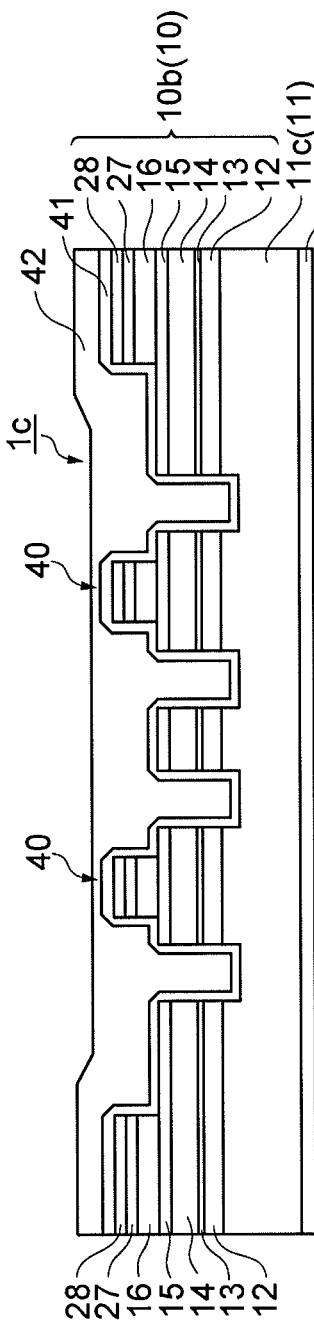
Figure 22C:
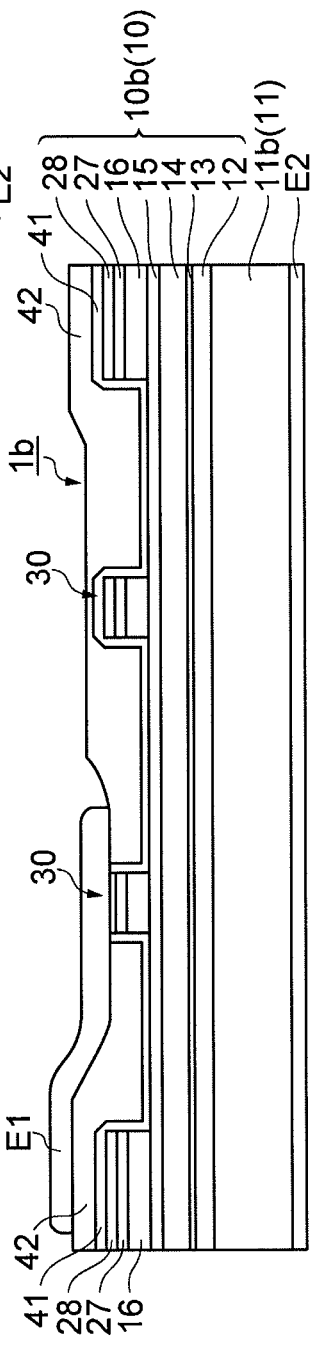

A resist mask used for a lift-off method is formed on the buried layer 42 by photolithography. As illustrated in FIGS. 22A to 22C, an ohmic metal is deposited on the buried layer 42 by evaporation to form the upper electrode E1 on the buried layer 42. The upper electrode E1 is electrically connected to the contact layer 28 through the openings 42a, 42b, and 42c. The upper electrode E1 is composed of, for example, Ti/Pt/Au. The back surface of the semiconductor substrate 11 is polished in such a manner that the semiconductor substrate 11 has a thickness of, for example, about 110 μm. An ohmic metal is deposited by evaporation on the back surface of the semiconductor substrate 11 to form a lower electrode E2 on the back surface of the semiconductor substrate 11. The lower electrode E2 is composed of, for example, AuGe. Thereby, the optical semiconductor device 1 is produced.

Advantages of the method for producing the optical semiconductor device 1 will be described below. The optical semiconductor device 1 has a structure in which the high-mesa optical waveguide 20 (optical modulator) and the ridge-type optical waveguide 30 (semiconductor laser) are connected together in the waveguiding direction. The high-mesa optical waveguide 20 and the ridge-type optical waveguide 30 differ in height. Thus, multiple etching operations need to be performed in the production of the optical semiconductor device 1. The optical axis of the high-mesa optical waveguide 20 needs to be matched to the optical axis of the ridge-type optical waveguide 30. In the method for producing the optical semiconductor device 1, the first recess C1 is formed on the first region 11a in the first etching step S03. In the second etching step S05, the first recess C1 is partially etched to form the second recess C2. As described above, the mesa structure for the high-mesa optical waveguide 20 is defined by the second recess C2 formed by the two-step etching. The first recess C1 is formed on the second region 11b in the first etching step S03. The ridge structure used to form the ridge-type optical waveguide 30 is defined by the first recess C1. At this time, the first masks M1 used to form the first recess C1 is also used to form the second recess C2. This makes it possible to match the optical axis of the high-mesa optical waveguide 20 to the optical axis of the ridge-type optical waveguide 30. The first opening edge and the second opening edge of the first opening of the second mask M2 are located on a region of the stacked semiconductor layer 10 uncovered with the first masks M1. That is, the first opening edge and the second opening edge are located on the region of the stacked semiconductor layer 10 etched in the first etching step. Thus, the first opening edge and the second opening edge are located on the region etched in the first etching step without being affected by misalignment of the second mask M2. This prevents the formation of a protruding portion due to the fact that etching is not performed or the formation of a recessed portion due to overetching, between the high-mesa optical waveguide 20 and the ridge-type optical waveguide 30.

Modified Embodiment

A modified embodiment of the method for producing the optical semiconductor device 1 will be described below. In this modified embodiment, the second mask formation step S04, the second etching step S05, and the first and second mask removal step S06 differ from those in the first embodiment. The second mask formation step S04, the second etching step S05, and the first and second mask removal step S06 will be described below.

Figure 23A:
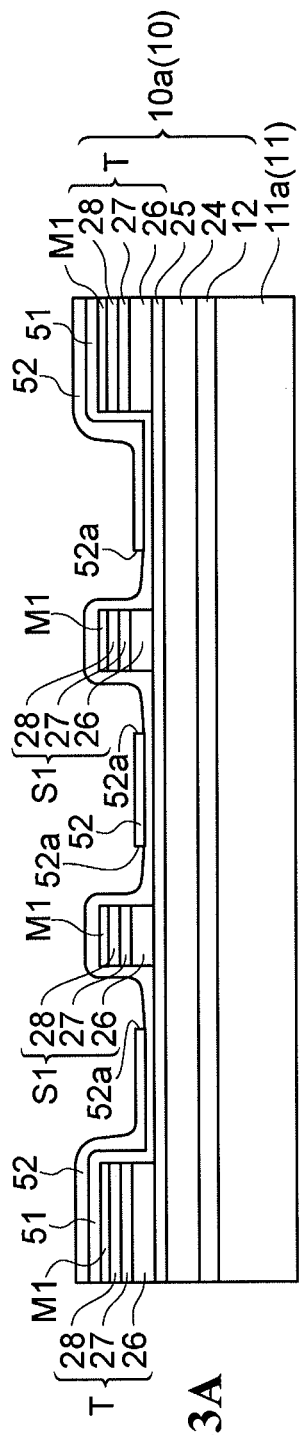
FIGS. 23A to 23C illustrate another procedure of the second mask formation step in the method for producing the semiconductor optical device in FIG. 1.
Figure 23B:
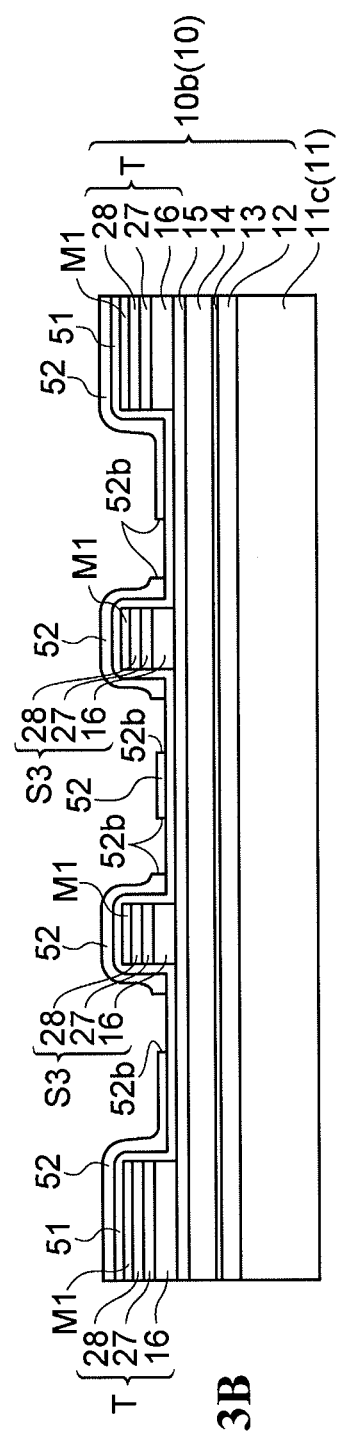
Figure 23C:
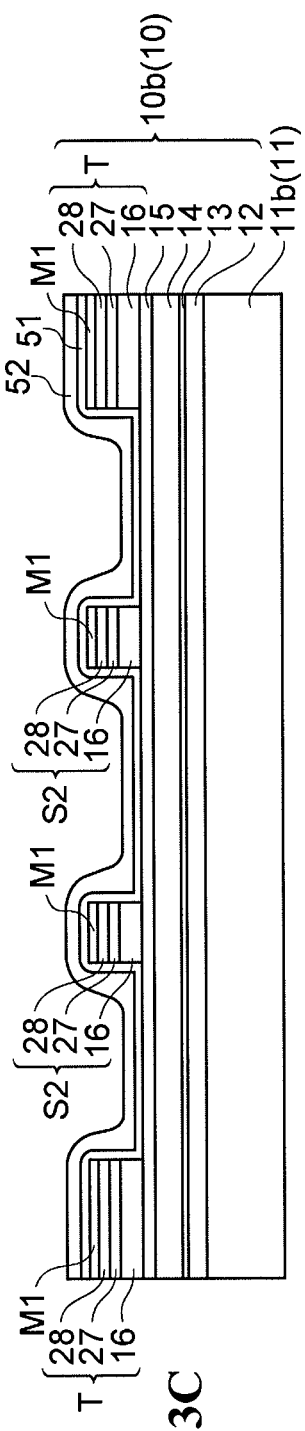
Figure 24A:
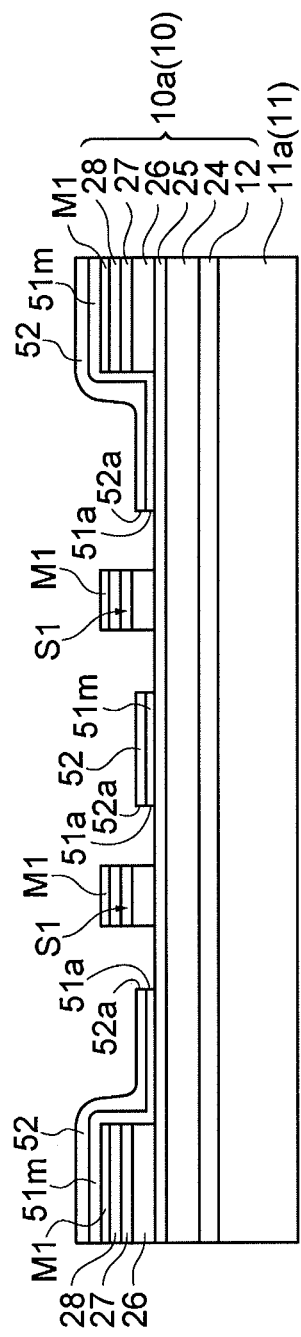
FIGS. 24A to 24C illustrate a procedure subsequent to the procedure in FIGS. 23A to 23C.
Figure 24B:
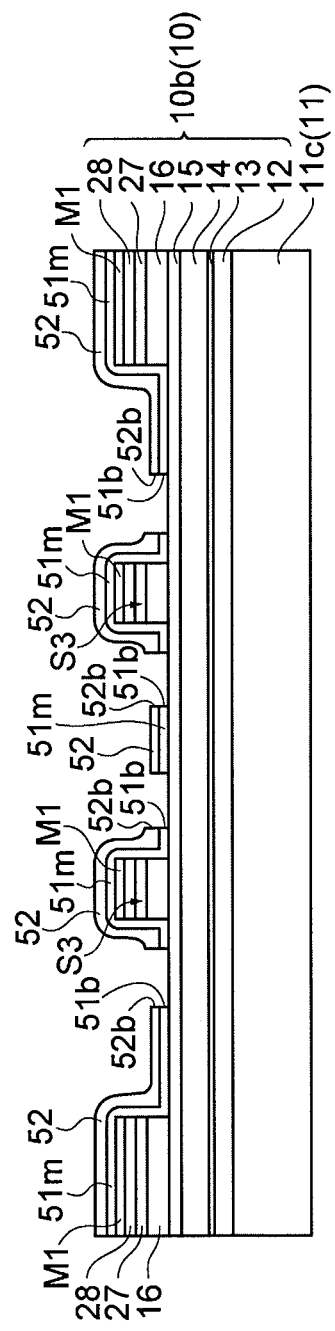
Figure 24C:
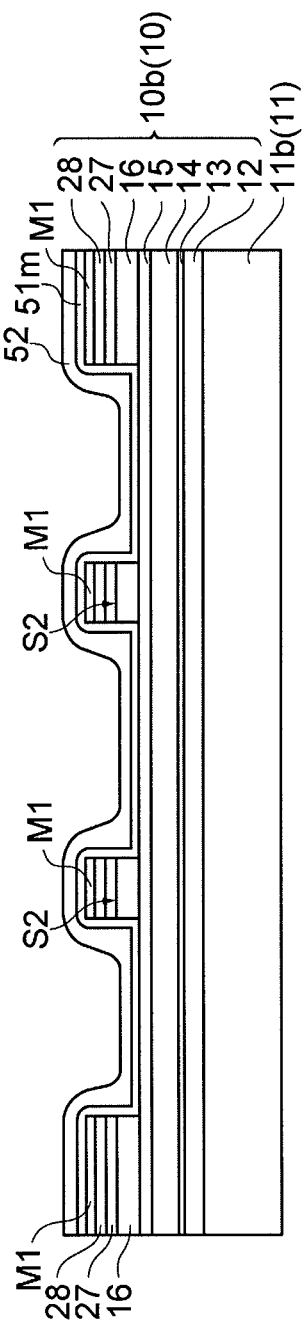
Figure 25A:
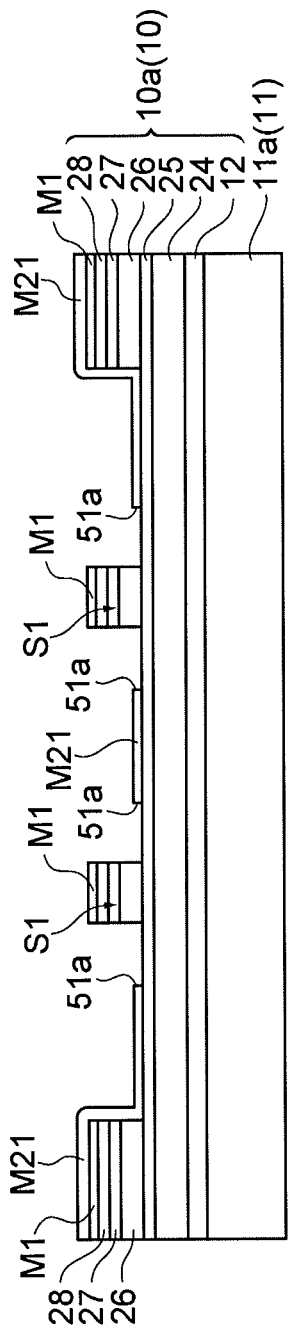
FIGS. 25A to 25C illustrate a procedure subsequent to the procedure in FIGS. 24A to 24C.
Figure 25B:
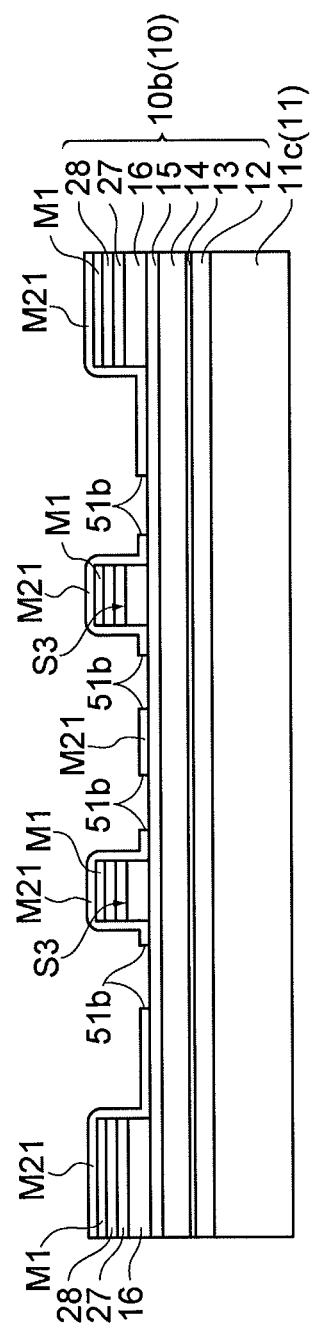
Figure 25C:
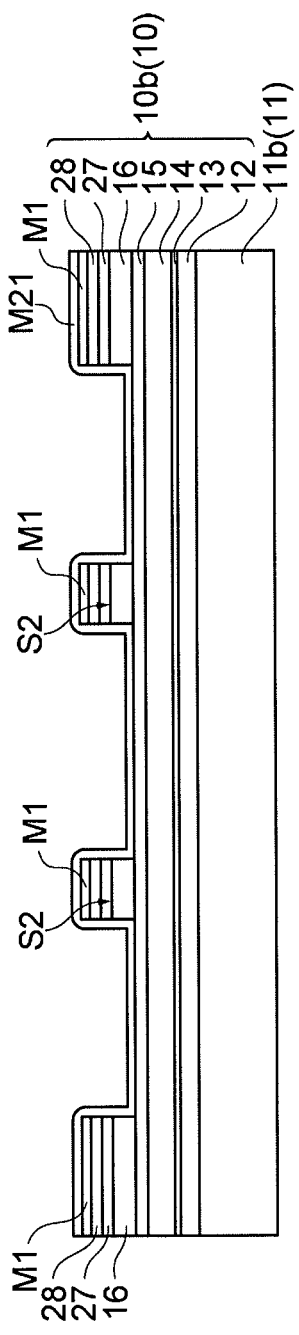

In the second mask formation step S04, a second mask M21 for the high-mesa optical waveguide 20 is formed on the stacked semiconductor layer 10 processed in the first etching step S03. The second mask formation step S04 will be specifically described with reference to FIGS. 23A to 25C. FIGS. 23A, 24A, and 25A are schematic cross-sectional views taken along line A-A in FIG. 1 in the second mask formation step S04. FIGS. 23B, 24B, and 25B are schematic cross-sectional views taken along line B-B in FIG. 1 in the second mask formation step S04. FIGS. 23C, 24C, and 25C are schematic cross-sectional views taken along line C-C in FIG. 1 in the second mask formation step S04.

As illustrated in FIGS. 23A to 23C, a silicon oxide film 51 is formed by, for example, a CVD method on the stacked semiconductor layer 10 processed in the first etching step S03 while the first masks M1 are not removed but are left. The silicon oxide film 51 has a thickness of, for example, about 300 nm. A resist mask 52 including an opening 52a and an opening 52b is formed by photolithography on the silicon oxide film 51. The opening 52a is provided on the first region 11a along the waveguiding direction. The opening 52a is provided so as to contain the first stripe-shaped waveguide section S1 therein. That is, the width of the opening 52a is larger than that of the first stripe-shaped waveguide section S1. The opening 52b is provided on the third region 11c. The opening 52b is provided in a substantially V-shape so as to extend in two directions from one end of the opening 52a toward the boundary between the third region 11c and the second region 11b. That is, the opening 52b is provided so as to be gradually separated from both side surfaces of the third stripe-shaped waveguide section S3 from the boundary between the first region 11a and the third region 11c toward the boundary between the third region 11c and the second region 11b (along waveguiding direction).

As illustrated in FIGS. 24A to 24C, the silicon oxide film 51 is selectively etched with the resist mask 52 as an etching mask using a gas mixture of $C_4F_8$ gas and CO gas, thereby forming a silicon oxide film mask 51m. The first masks M1 is not etched by this selective etching but is left. As illustrated in FIGS. 25A to 25C, the resist mask 52 is removed with an organic solvent, for example, acetone or isopropyl alcohol, to form the second mask M21 including the silicon oxide film mask 51m.

As described above, the second mask M21 includes a first opening 51a and a second opening 51b, similarly to the second mask M2 according to the first embodiment. The second mask M21 is formed on the stacked semiconductor layer 10 where the first masks M1 are formed. The first opening 51a is provided in the same position as the first opening 34a. The second opening 51b is provided in the same position as the second opening 34b. The second mask M21 is stacked on the first masks M1 provided on the terraces T and the second stripe-shaped waveguide section S2, similarly to the second mask M2.

Figure 26A:
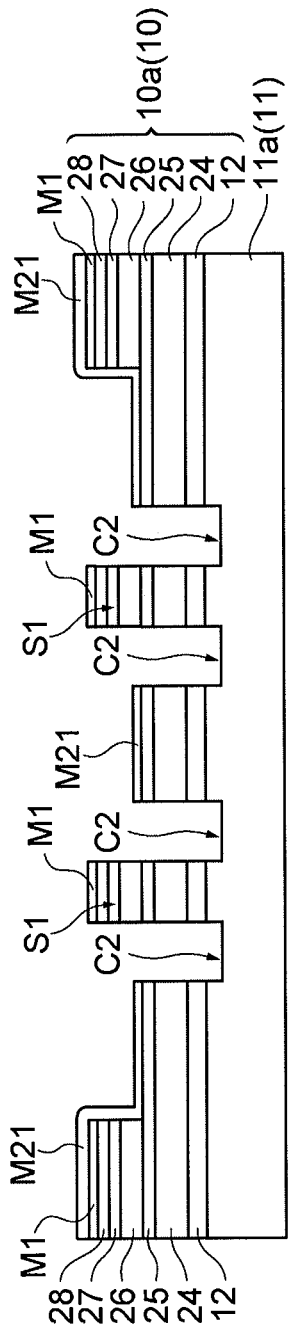
FIGS. 26A to 26C illustrates the second etching step in the method for producing the semiconductor optical device in FIG. 1.
Figure 26B:
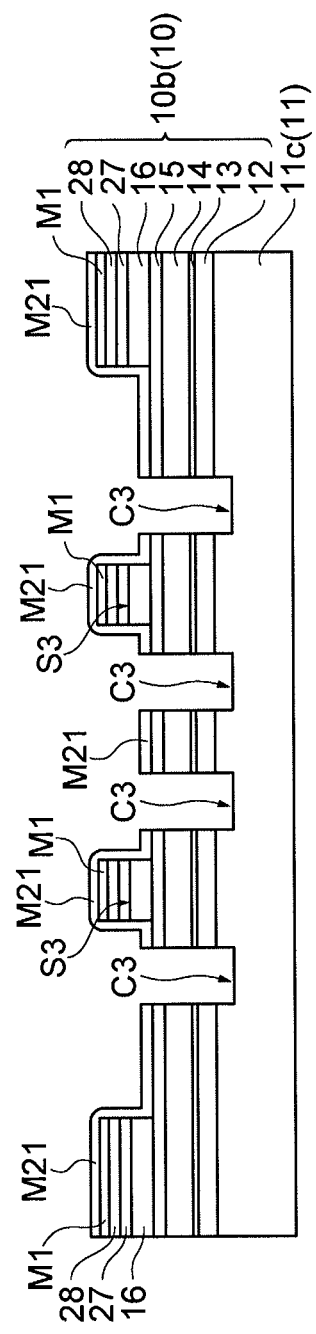
Figure 26C:
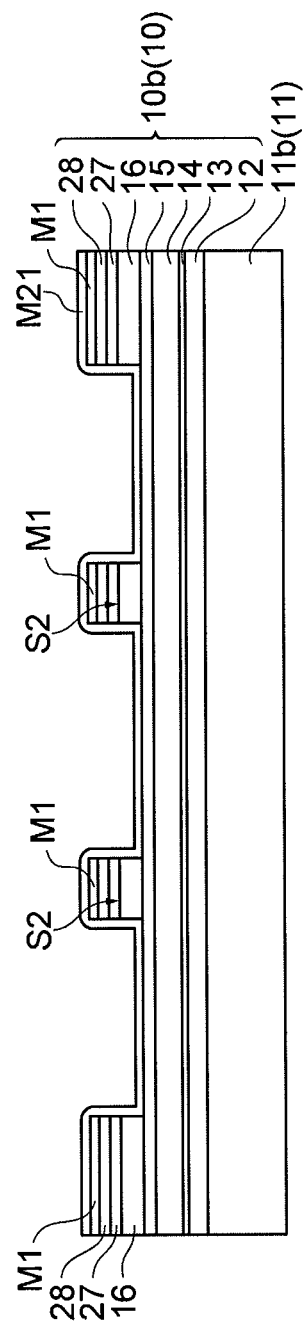

In the second etching step S05, the stacked semiconductor layer 10 on the first region 11a and the third region 11c is etched with the first masks M1 and the second mask M21 as etching masks, thereby forming a mesa structure used to form the high-mesa optical waveguide 20. In the second etching step S05, the etch-stop layers 15 and 25, the active layers 14 and 24, the spacer layer 13, and the grating layer 12 are etched in that order by, for example, RIE using $SiCl_4$ gas, as illustrated in FIGS. 26A to 26C. In the second etching step S05, the semiconductor substrate 11 is etched from the back surface of the grating layer 12 (the main surface of the semiconductor substrate 11) to a depth of, for example, about 250 nm. This etching results in the formation of the second recess C2 on the first region 11a and the formation of the third recess C3 on the third region 11c. The mesa structure used to form the high-mesa optical waveguide 20 is defined by the second recess C2. In this case, an etching time required to achieve a predetermined etch depth may be calculated from a previously measured etch rate, and the etching may be performed for the calculated etching time. The mesa structure formed in the second etching step S05 has the same shape as the mesa structure according to the first embodiment.

Figure 27A:
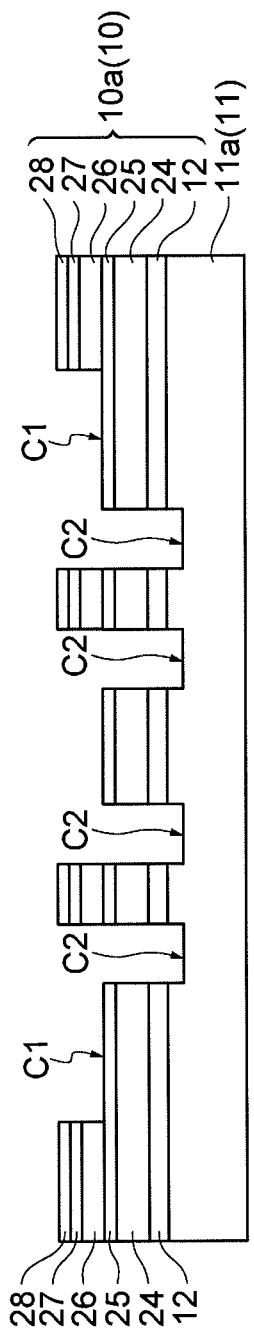
FIGS. 27A to 27C illustrate the first and second mask removal step in the method for producing the semiconductor optical device in FIG. 1.
Figure 27B:
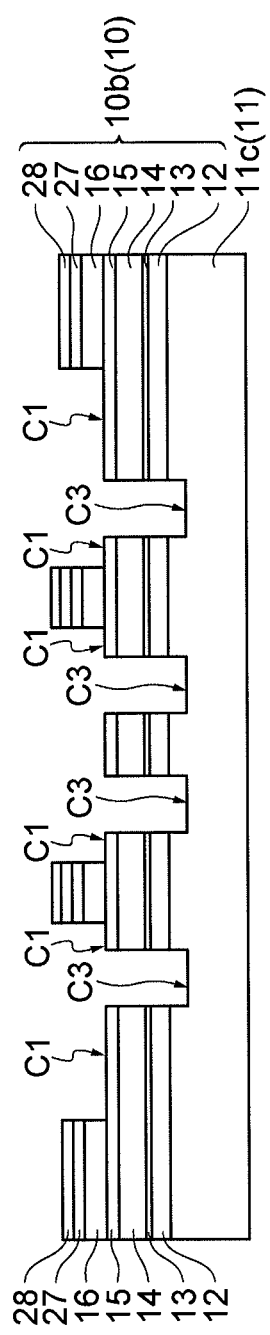
Figure 27C:
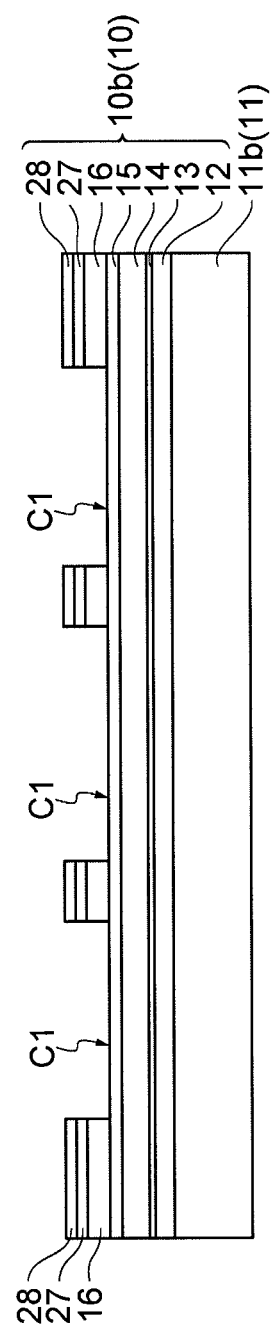

In the first and second mask removal step S06, the first masks M1 and the second mask M21 are removed with, for example, hydrofluoric acid, as illustrated in FIGS. 27A to 27C.

In this modified embodiment, steps from the step of applying the thermo-curable resin to the step of forming a pattern may be omitted, thereby simplifying the process.

Second Embodiment

Figure 28:
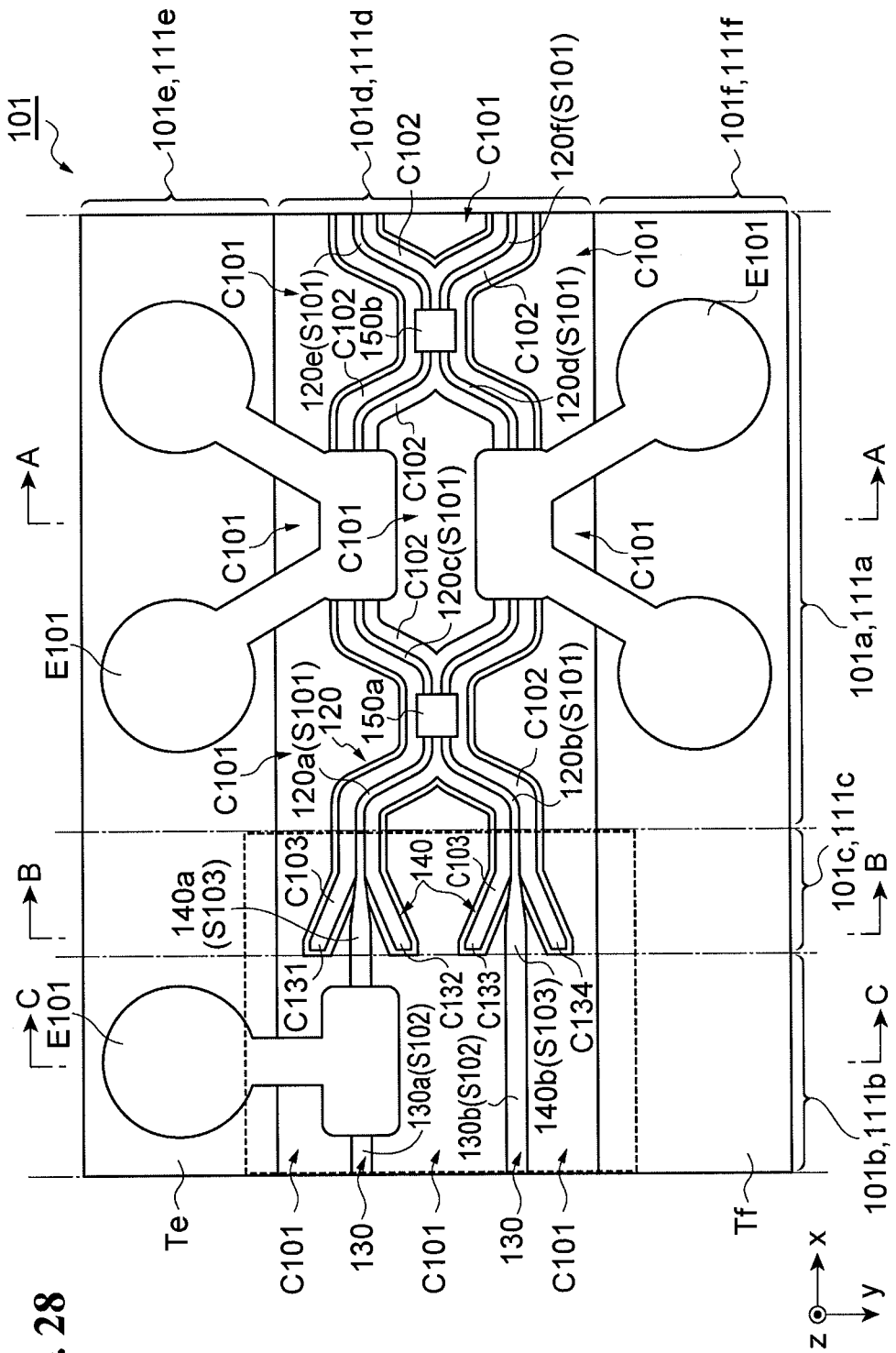
FIG. 28 is a schematic plan view illustrating a structure of a semiconductor optical device according to a second embodiment.

FIG. 28 is a schematic plan view illustrating a structure of a semiconductor optical device according to a second embodiment. As illustrated in FIG. 28, the semiconductor optical device 101 includes a first portion 101a, a second portion 101b, and a third portion 101c. The first portion 101a, the third portion 101c, and the second portion 101b are arranged in that order in one direction (first direction). The first portion 101a includes a high-mesa optical waveguide 120. The first portion 101a includes, for example, a Mach-Zehnder modulator (MZM) with 2×2 multi-mode interference (MMI). The Mach-Zehnder modulator functions as, for example, a semiconductor optical modulator. The second portion 101b includes a ridge-type optical waveguide 130. The third portion 101c includes a conversion region 140. The second portion 101b and the third portion 101c function as, for example, a semiconductor laser including a diffraction grating. The semiconductor optical device 101 includes a portion where a stripe-shaped optical waveguide is formed (hereinafter, referred to as a "stripe-shaped waveguide formation portion") 101d sandwiched, in a second direction orthogonal to the first direction, between a pair of terrace formation portions 101e and 101f.

The semiconductor optical device 101 differs from the optical semiconductor device 1 only in that a protruding portion 60 is provided at edges of a second recess C102 and a third recess C103. The protruding portion 60 will be described below, and descriptions of other elements are not redundantly repeated.

The protruding portion 60 includes a first protruding portion 60a and a second protruding portion 60b. The first protruding portion 60a is provided along the edge of the second recess C102 and has the same composition as a lower cladding layer 126. The first protruding portion 60a has a height of, for example, about 150 to 200 nm from a main surface of an etch-stop layer 125. The second protruding portion 60b is provided along the edge of the third recess C103 and has the same composition as a lower cladding layer 116. The second protruding portion 60b has a height of, for example, about 150 to 200 nm from a main surface of an etch-stop layer 115.

A method for producing the semiconductor optical device 101 will be described below with reference to FIG. 2. As illustrated in FIG. 2, the method for producing the semiconductor optical device 101 includes an epitaxial growth step S11, a first mask formation step S12, a first etching step S13, a second mask formation step S14, a second etching step S15, a first and second mask removal step S16, a protective film formation step S17, a buried layer formation step S18, and an electrode formation step S19.

Figure 29A:
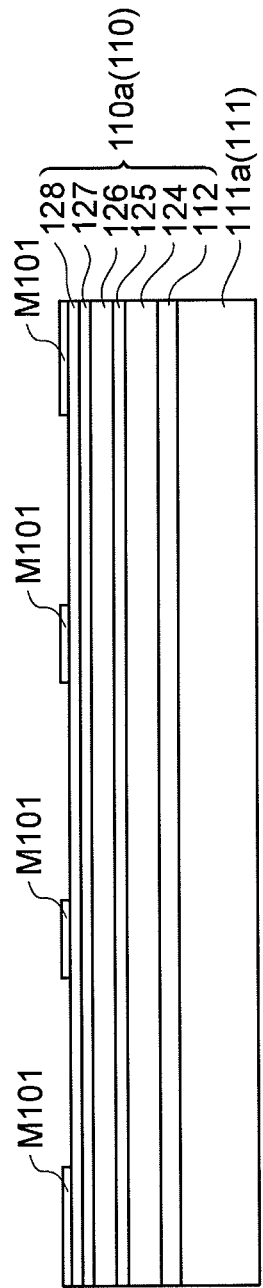
FIGS. 29A to 29C illustrate a first mask formation step in a method for producing the semiconductor optical device in FIG. 28.
Figure 29B:
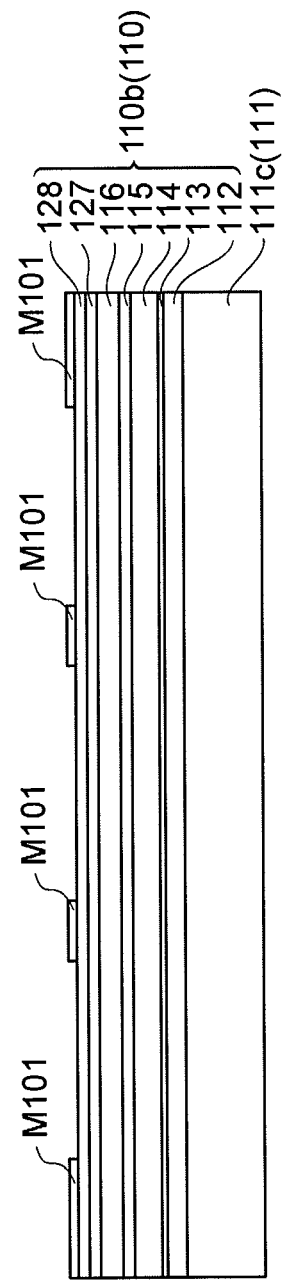
Figure 29C:
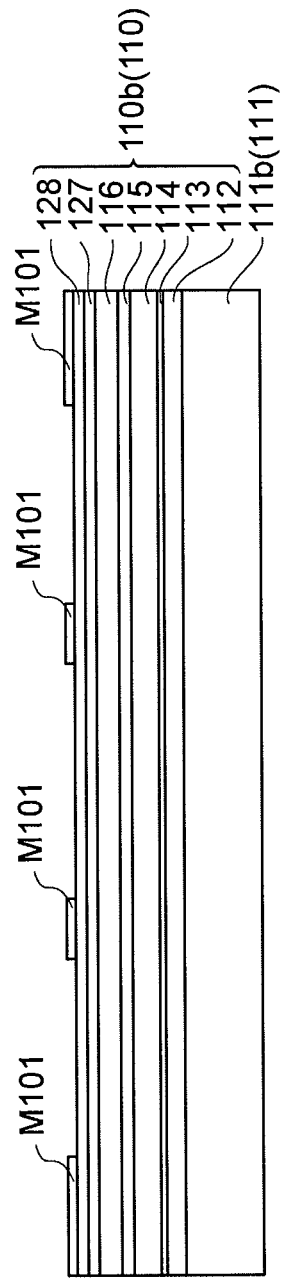

In the epitaxial growth step S11, a first stacked semiconductor layer 110a and a second stacked semiconductor layer 110b are formed on a semiconductor substrate 111 in the first direction as illustrated in FIGS. 29A to 29C. Here, the first stacked semiconductor layer 110a includes a grating layer 112, an active layer 124, the etch-stop layer 125, the lower cladding layer 126, an upper cladding layer 127, and a contact layer 128. The second stacked semiconductor layer 110b includes the grating layer 112, a spacer layer 113, an active layer 114, the etch-stop layer 115, the lower cladding layer 116, the upper cladding layer 127, and the contact layer 128.

The semiconductor substrate 111 includes a first region 111a where the high-mesa optical waveguide 120 is formed and a second region 111b where the ridge-type optical waveguide 130 is formed. A third region 111c where the conversion region 140 is formed may be provided between the first region 111a and the second region 111b. That is, in the semiconductor substrate 111, the first region 111a, the third region 111c, and the second region 111b are arranged in that order in the first direction. The first stacked semiconductor layer 110a is provided on the first region 111a. The second stacked semiconductor layer 110b is provided on the second region 111b and the third region 111c. The semiconductor substrate 111 includes the waveguide formation region 111d where the stripe-shaped optical waveguide S is formed; and a pair of terrace formation regions 111e and 111f where a pair of terraces T is formed, the waveguide formation region 111d and the terrace formation regions 111e and 111f being arranged in the second direction, and the waveguide formation region 111d being provided between the terrace formation regions 111e and 111f.

In the first mask formation step S12, first masks M101 used to form the stripe-shaped optical waveguide S and the terraces T are formed on a stacked semiconductor layer 110. As illustrated in FIGS. 29A to 29C, the first masks M101 are formed so as to cover portions of the stacked semiconductor layer 110 where the stripe-shaped optical waveguide S and the terraces T will be formed. That is, the first masks M101 have the same shape as the first masks M1 according to the first embodiment illustrated in FIG. 8. The epitaxial growth step S11 and the first mask formation step S12 are the same as the epitaxial growth step S01 and the first mask formation step S02, respectively, and detailed descriptions are omitted.

Figure 30A:
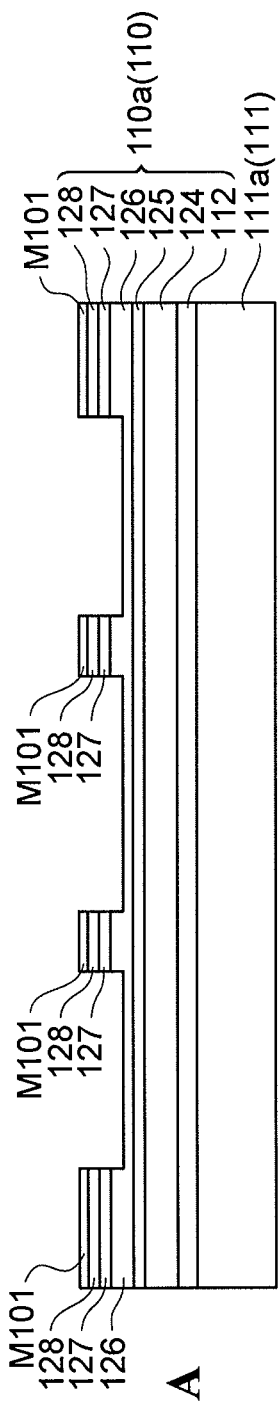
FIGS. 30A to 30C illustrate a procedure of a first etching step in the method for producing the semiconductor optical device in FIG. 28.
Figure 30B:
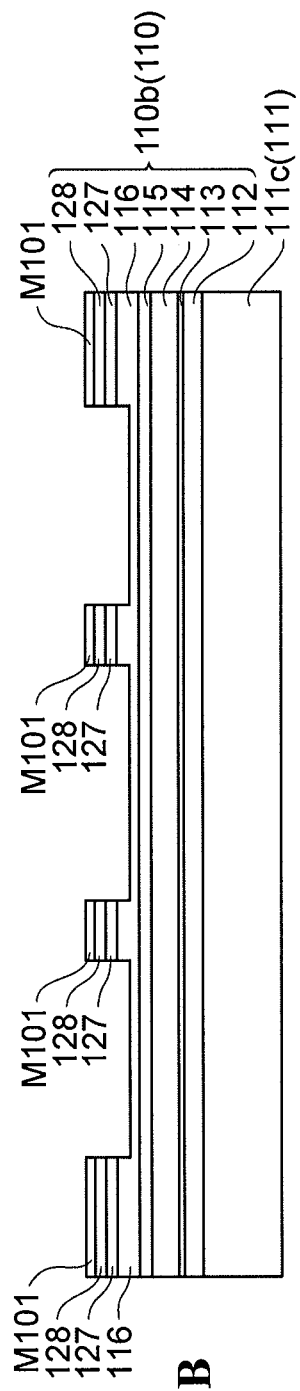
Figure 30C:
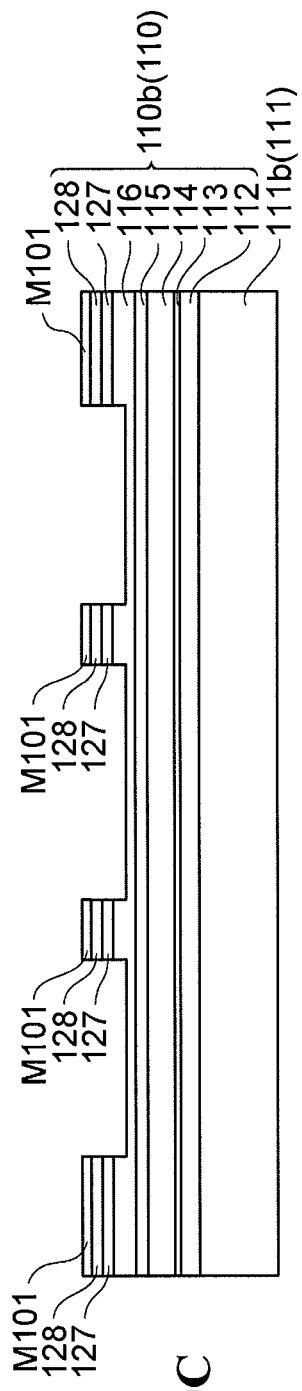
Figure 31A:
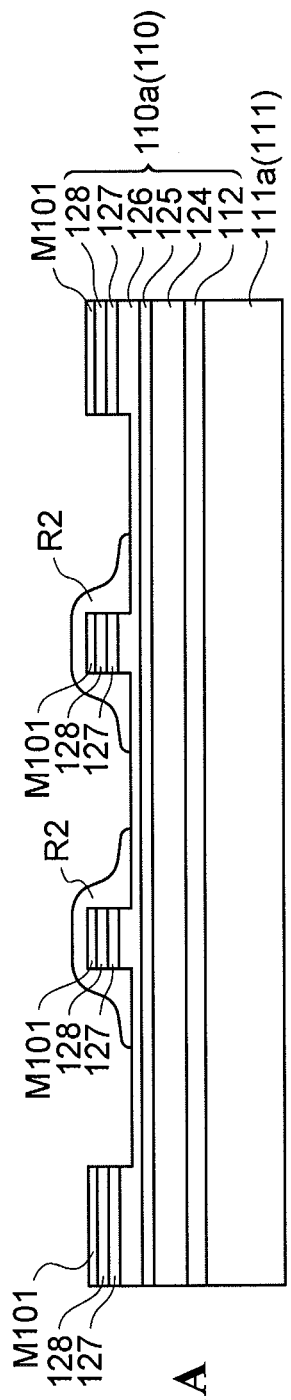
FIGS. 31A to 31C illustrate a procedure subsequent to the procedure in FIGS. 30A to 30C.
Figure 31B:
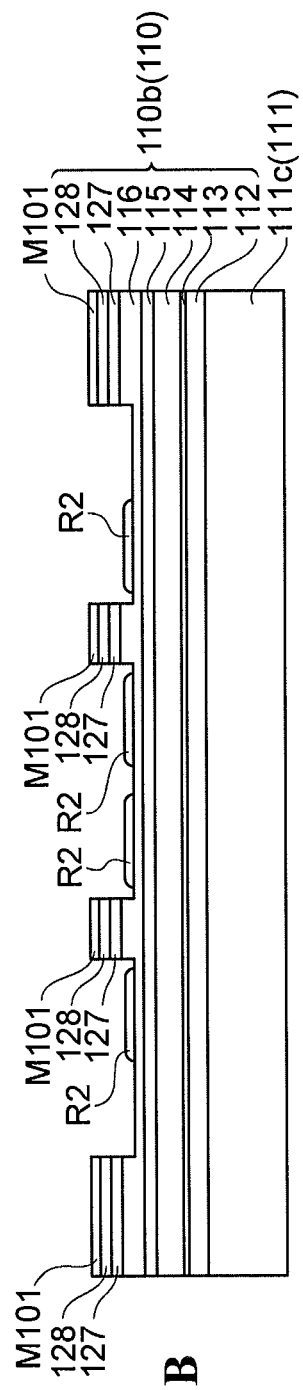
Figure 31C:
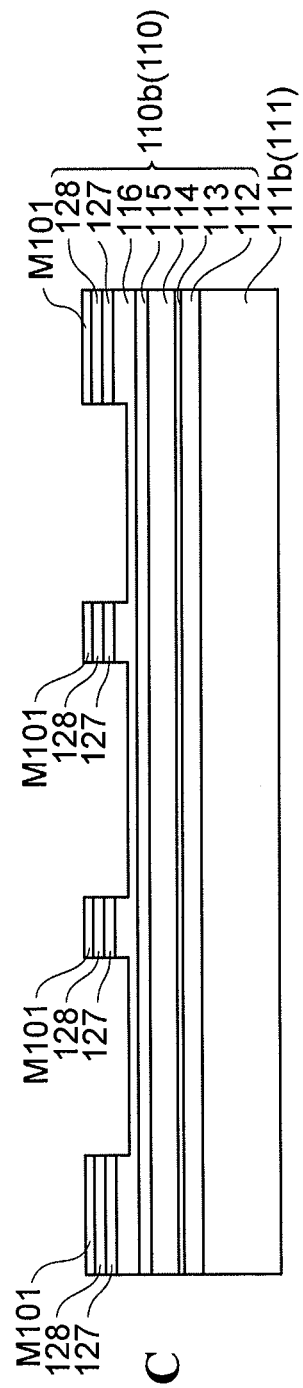
Figure 32A:
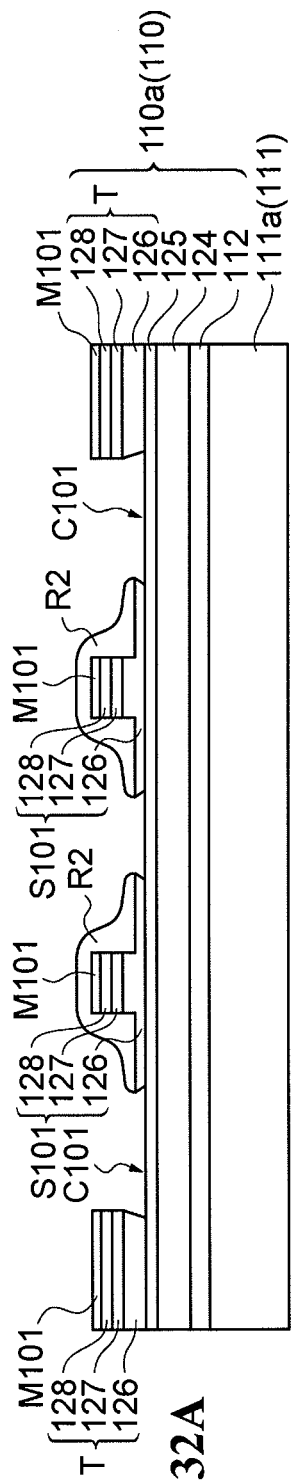
FIGS. 32A to 32C illustrate a procedure subsequent to the procedure in FIGS. 31A to 31C.
Figure 32B:
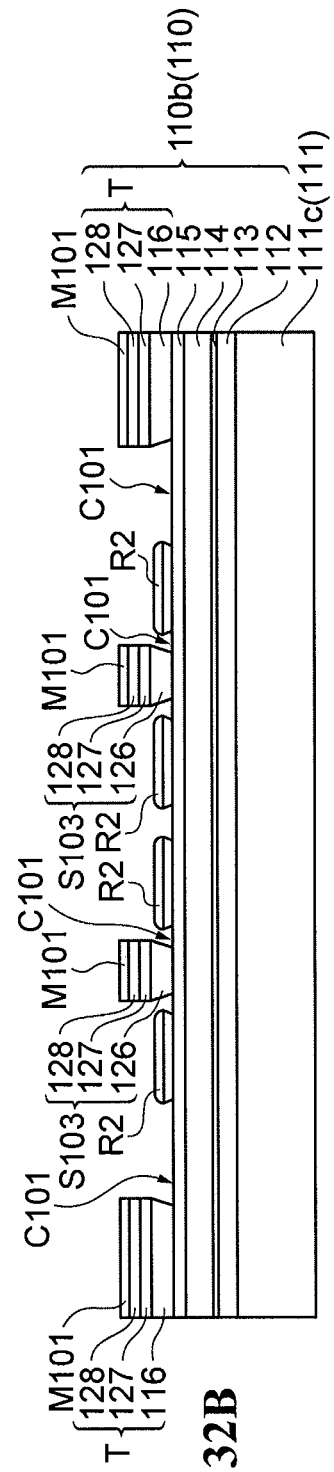
Figure 32C:
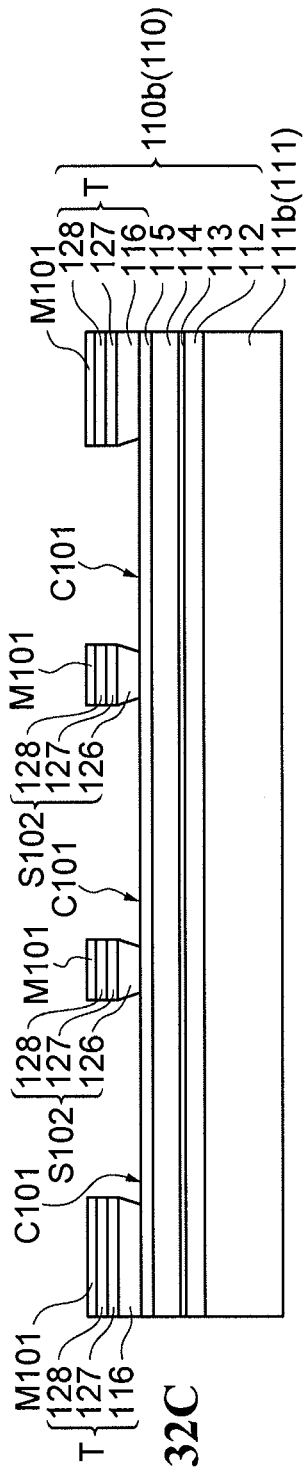

In the first etching step S13, the stacked semiconductor layer 110 is etched with the first masks M101 as etching masks to form the stripe-shaped optical waveguide S. The first etching step S13 will be specifically described with reference to FIGS. 30A to 32C. FIGS. 30A, 31A, and 32A are schematic cross-sectional views taken along line A-A in FIG. 28 in the first etching step S13. FIGS. 30B, 31B, and 32B are schematic cross-sectional views taken along line B-B in FIG. 28 in the first etching step S13. FIGS. 30C, 31C, and 32C are schematic cross-sectional views taken along line C-C in FIG. 28 in the first etching step S13.

As illustrated in FIGS. 30A to 30C, the contact layer 128, the upper cladding layer 127, and the lower cladding layers 116 and 126 are etched in that order by, for example, RIE using $SiCl_4$ gas. The etching is stopped at a position located, for example, about 150 to 200 nm from main surfaces of the etch-stop layers 115 and 125 in the depth direction. In this case, an etching time required to achieve a predetermined etch depth may be calculated from a previously measured etch rate, and the etching may be performed for the calculated etching time.

As illustrated in FIGS. 31A to 31C, a thermo-curable resin is spin-coated onto the stacked semiconductor layer 110 processed by etching while the first masks M101 are not removed but are left. The thermo-curable resin is, for example, a photosensitive resin with a low dielectric constant. The number of revolutions of a spin coater is adjusted in such a manner that the thermo-curable resin has a thickness of, for example, about 1500 nm, and the thermo-curable resin is applied onto the stacked semiconductor layer 110. The thermo-curable resin is soft-baked in a nitrogen ($N_2$) atmosphere at 60° C. for 90 seconds. The thermo-curable resin is then exposed and developed by photolithography, thereby forming a pattern used to form a selection film R2. The patterned thermo-curable resin is subjected to curing (thermal curing treatment) in a $N_2$ atmosphere at 300° C. for 60 minutes to form the selection film R2. The selection film R2 has thermosetting properties and a glass transition temperature of 350° C. or higher. Note that a photosensitive BCB resin is used as the thermo-curable resin. The selection film R2 has the same shape as the selection film R1 according to the first embodiment illustrated in FIG. 11. As described above, a region where the selection film R2 is formed (selection film formation region) is formed so as to cover a region where the second recess C102 is formed in the second etching step S15 described below.

As illustrated in FIGS. 32A to 32C, the lower cladding layers 116 and 126 are selectively etched with the first masks M101 until the etch-stop layers 115 and 125 are exposed, while the selection film R2 is not removed but is left, thereby forming a first recess C101. This selective etching is performed with the aqueous solution of 48% hydrobromic acid and water, the mixing ratio by volume of 48% hydrobromic acid to water being 2:1. As described above, in the first etching step S13, the stacked semiconductor layer 110 is processed to form the first recess C101, thereby forming the stripe-shaped optical waveguide S on the waveguide formation region 111d and forming the terraces Te and Tf on the terrace formation regions 111e and 111f.

The lower cladding layers 116 and 126 are selectively etched by wet etching, thereby exposing the (111) plane on side surfaces (first recess C101) of the stripe-shaped optical waveguide S and the terraces T. Thus, the side surfaces of the stripe-shaped optical waveguide S and the terraces T have an inverted mesa shape. The stripe-shaped optical waveguide S includes a first stripe-shaped waveguide section S101 on the first region 111a; and a second stripe-shaped waveguide section S102 on the second region 111b. When the third region 111c is provided, the stripe-shaped optical waveguide S further includes a third stripe-shaped waveguide section S103 on the third region 111c. One end of the third stripe-shaped waveguide section S103 is connected to one end of the first stripe-shaped waveguide section S101. The other end of the third stripe-shaped waveguide section S103 is connected to one end of the second stripe-shaped waveguide section S102.

In the second mask formation step S14, a second mask M102 for the high-mesa optical waveguide 120 is formed on the stacked semiconductor layer 110 processed in the first etching step S13. The second mask formation step S14 will be specifically described with reference to FIGS. 33A to 36C. FIGS. 33A, 34A, 35A, and 36A are schematic cross-sectional views taken along line A-A in FIG. 28 in the second mask formation step S14. FIGS. 33B, 34B, 35B, and 36B are schematic cross-sectional views taken along line B-B in FIG. 28 in the second mask formation step S14. FIGS. 33C, 34C, 35C, and 36C are schematic cross-sectional views taken along line C-C in FIG. 28 in the second mask formation step S14.

Figure 33A:
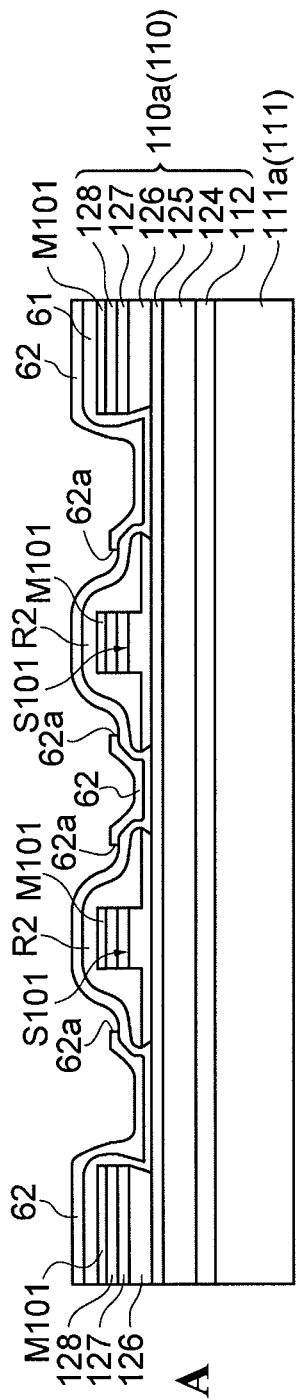
FIGS. 33A to 33C illustrate a procedure of a second mask formation step in the method for producing the semiconductor optical device in FIG. 28.
Figure 33B:
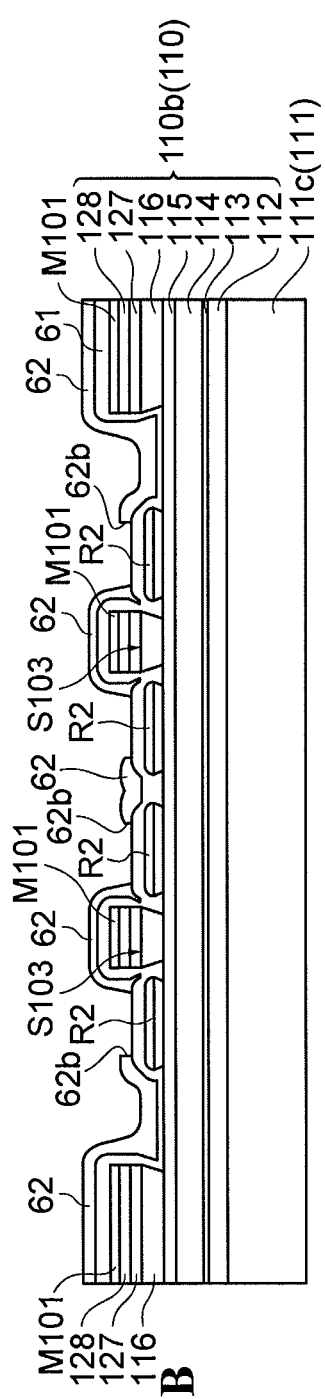
Figure 33C:
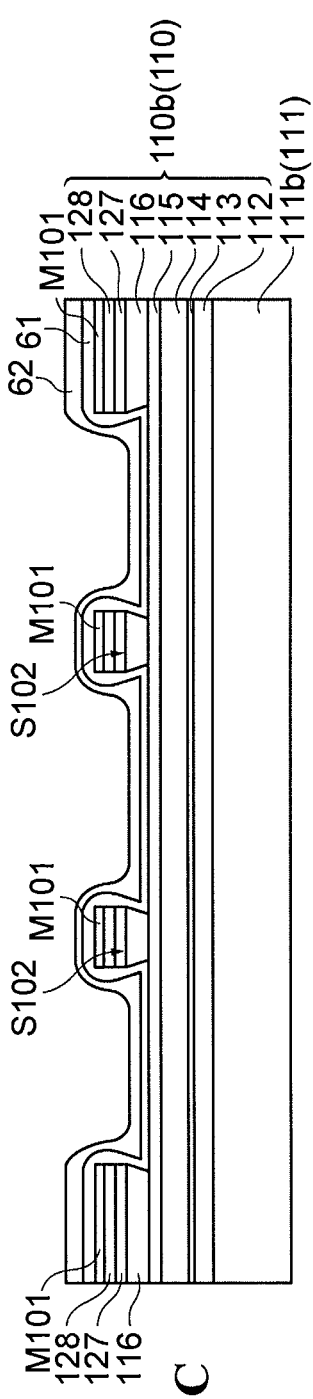

As illustrated in FIGS. 33A to 33C, a silicon nitride film 61 is formed by a CVD method on the stacked semiconductor layer 110 where the selection film R2 is formed. The silicon nitride film 61 has a thickness of, for example, about 300 nm. The deposition temperature of the silicon nitride film 61 is about 220° C. The selection film R2 has a glass transition temperature of 350° C. or higher. Thus, the silicon nitride film 61 is formed without the influence of the deposition temperature on the selection film R2. A resist mask 62 including an opening 62a and an opening 62b is formed on the selection film formation region of the silicon nitride film 61 by photolithography. The opening 62a is provided on the selection film formation region above the first region 111a. The opening 62b is provided on the selection film formation region above the third region 111c. That is, edges of the opening 62a and edges of the opening 62b are located above the selection film R2.

Figure 36A:
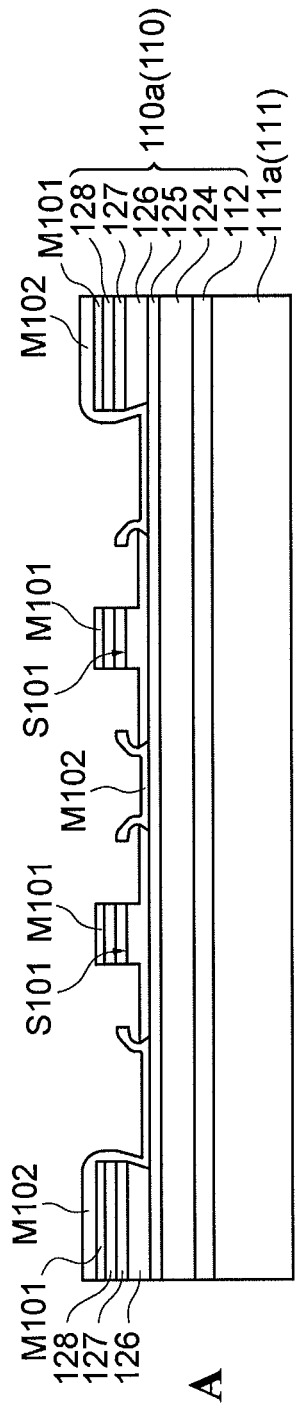
FIGS. 36A to 36C illustrate a procedure subsequent to the procedure in FIGS. 35A to 35C.
Figure 36B:
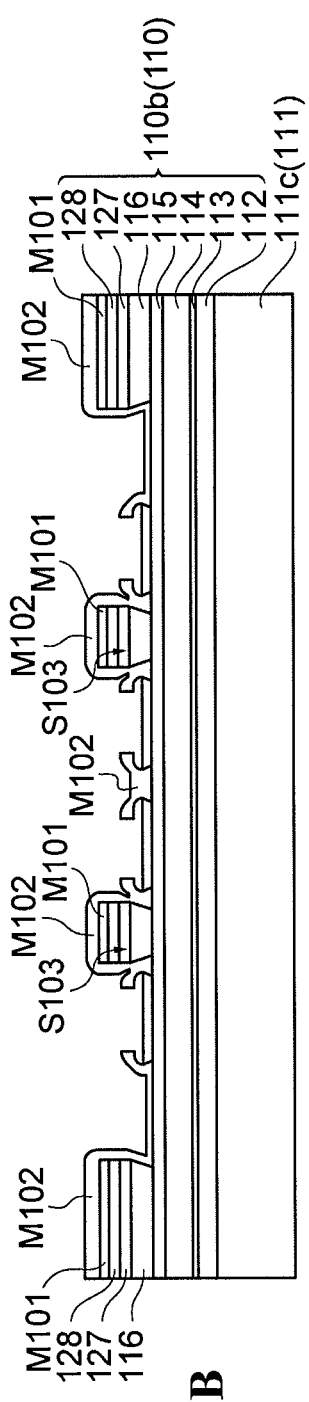
Figure 36C:
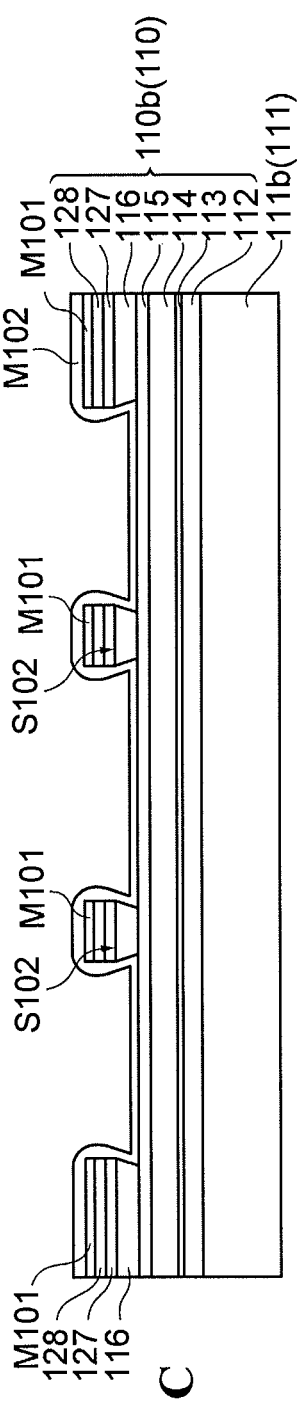

As illustrated in FIGS. 34A to 34C, the silicon nitride film 61 is etched with the resist mask 62 as an etching mask by RIE using $CF_4$ gas as an etching gas to form a silicon nitride film mask 61m. As illustrated in FIGS. 35A to 35C, the resist mask 62 is removed with an organic solvent, for example, acetone or isopropyl alcohol. As illustrated in FIGS. 36A to 36C, the selection film R2 is removed with the silicon nitride film mask 61m using oxygen plasma. This results in the formation of the second mask M102 including the silicon nitride film mask 61m. A portion that has been covered with the selection film R2 is not selectively etched in the first etching step S13. Thus, the lower cladding layers 116 and 126 each having a thickness of about 150 to 200 nm are left on the main surfaces of the etch-stop layers 115 and 125.

The second mask M102 has the same shape as the second mask M2 according to the first embodiment illustrated in FIG. 16. That is, the second mask M102 includes a first opening 61a and a second opening 61b and is formed on the stacked semiconductor layer 110 where the first masks M101 are provided. The first opening 61a is formed in the silicon nitride film 61 by etching the silicon nitride film 61 through the opening 62a of the resist mask 62. The second opening 61b is formed in the silicon nitride film 61 by etching the silicon nitride film 61 through the opening 62b of the resist mask 62. That is, the first opening 61a extends along the waveguiding direction. The first opening 61a includes a first opening edge e101 remote from one side surface of the first stripe-shaped waveguide section S101; and a second opening edge e102 remote from the other side surface of the first stripe-shaped waveguide section S101. That is, the width of the first opening 61a is larger than that of the first stripe-shaped waveguide section S101. The first opening edge e101 and the second opening edge e102 are located on the selection film R2 above the first region 111a. The second opening 61b is provided on the selection film R2 above the third region 111c. The second opening 61b extends along the waveguiding direction so as to be gradually separated from both side surfaces of the third stripe-shaped waveguide section S103. The edge of the second opening 61b is located on the selection film R2 above the third region 111c. The second mask M102 is stacked on the first masks M101 provided on the terraces T, the second stripe-shaped waveguide section S102, and the third stripe-shaped waveguide section S103.

Figure 37A:
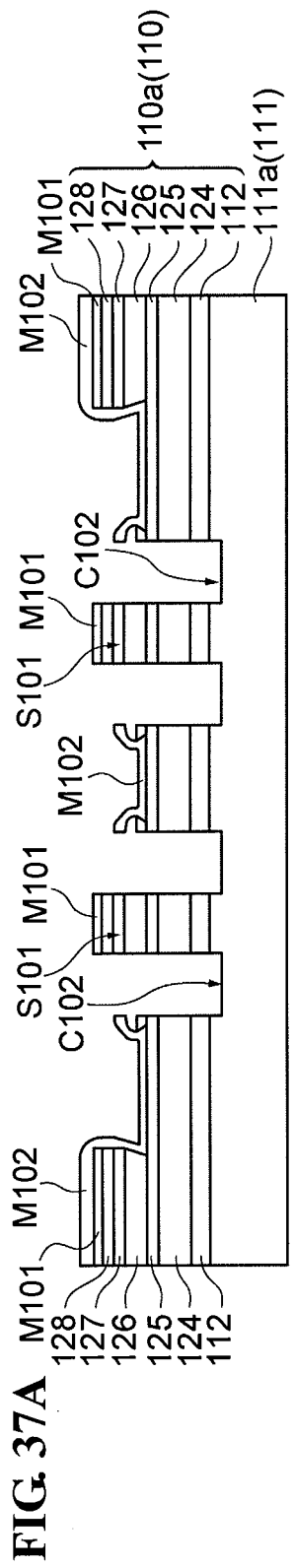
FIGS. 37A to 37C illustrate a second etching step in the method for producing the semiconductor optical device in FIG. 28.
Figure 37B:
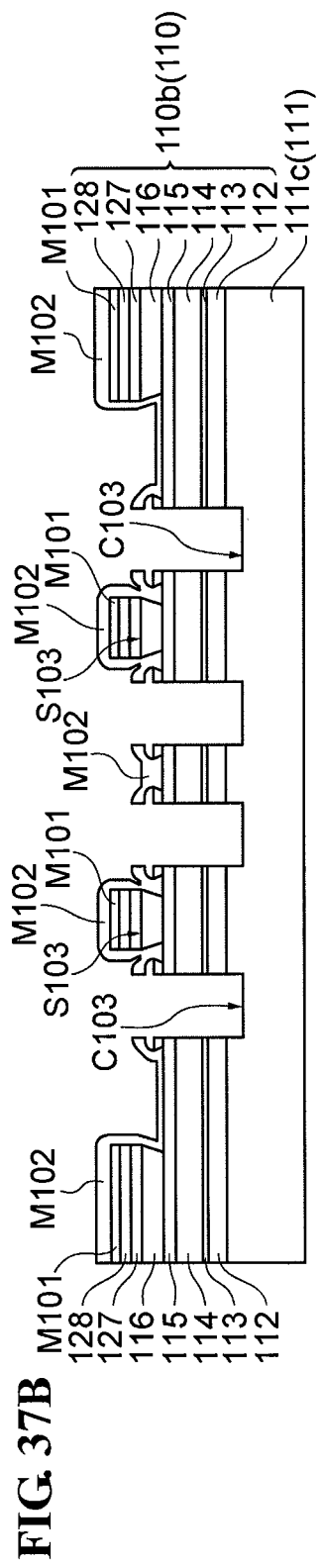
Figure 37C:
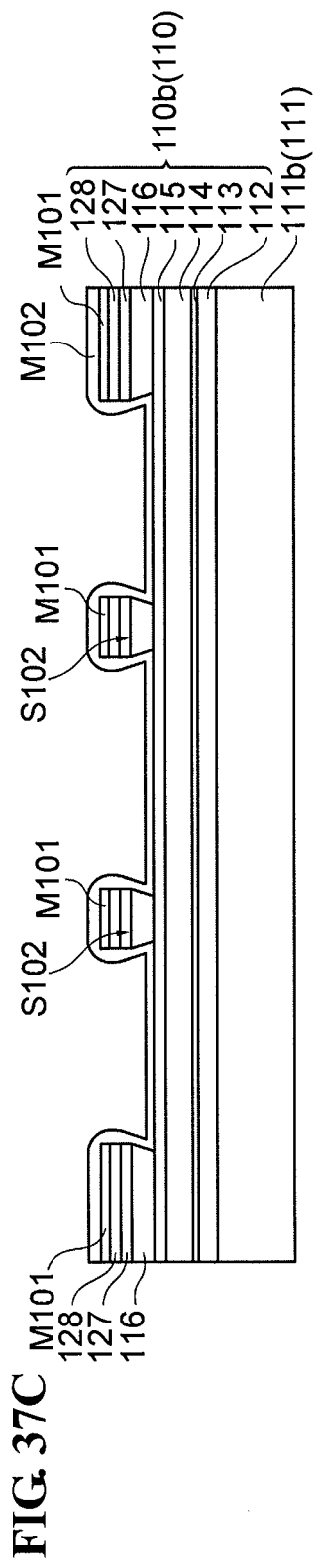

In the second etching step S15, the stacked semiconductor layer 110 on the first region 111a and the third region 111c is etched with the first masks M101 and the second mask M102 as etching masks, thereby forming a mesa structure used to form the high-mesa optical waveguide 120. In the second etching step S15, the lower cladding layers 116 and 126, the etch-stop layers 115 and 125, the active layers 114 and 124, the spacer layer 113, and the grating layer 112 are etched in that order by, for example, RIE using $SiCl_4$ gas, as illustrated in FIGS. 37A to 37C. In the second etching step S15, the semiconductor substrate 111 is etched to a depth of, for example, about 250 nm from the back surface of the grating layer 112 (the main surface of the semiconductor substrate 111). This etching results in the formation of the second recess C102 on the first region 111a and the formation of the third recess C103 on the third region 111c. The mesa structure used to form the high-mesa optical waveguide 120 is defined by the second recess C102. In this case, an etching time required to achieve a predetermined etch depth may be calculated from a previously measured etch rate, and the etching may be performed for the calculated etching time. The mesa structure formed in the second etching step S15 has substantially the same shape as the mesa structure used to form the high-mesa optical waveguide 20 according to the first embodiment.

The edge of the first opening 61a and the edge of the second opening 61b of the second mask M102 are located on the selection film R2. Thus, in the second etching step S15, the lower cladding layers 116 and 126 are not etched but are left along the edges of the second recess C102 and the third recess C103 to form the protruding portion 60.

In the first and second mask removal step S16, the first masks M1 and the second mask M102 are removed with, for example, hydrofluoric acid as illustrated in FIGS. 38A to 38C.

The protective film formation step S17, the buried layer formation step S18, and the electrode formation step S19 are the same as the protective film formation step S07, the buried layer formation step S08, and the electrode formation step S09, respectively, and descriptions are not redundantly repeated. As described above, the semiconductor optical device 101 is produced.

In the method for producing the semiconductor optical device 101, the semiconductor optical device 101 has a structure in which the side surfaces of the stripe-shaped optical waveguide S and the terraces T have an inverted mesa shape. Therefore, a width of a lower portion of the ridge becomes narrower. This prevents the spreading of a current, thereby resulting in improved emission efficiency of the semiconductor laser. On the other hand, a width of an upper portion of the ridge is relatively large, so that a contact hole required to form the electrode is easily processed. Furthermore, the low-resistance ohmic contact between the contact layer 128 and the electrode is easily obtained. In the method for producing the semiconductor optical device 101, the protruding portion is formed along the edges of the second recess C102 and the third recess C103. This eliminates the formation of a recess due to overetching in the conversion region between the high-mesa optical waveguide and the ridge-type optical waveguide, thereby resulting in a reduction in optical loss in the conversion region.

Third Embodiment

Figure 39:
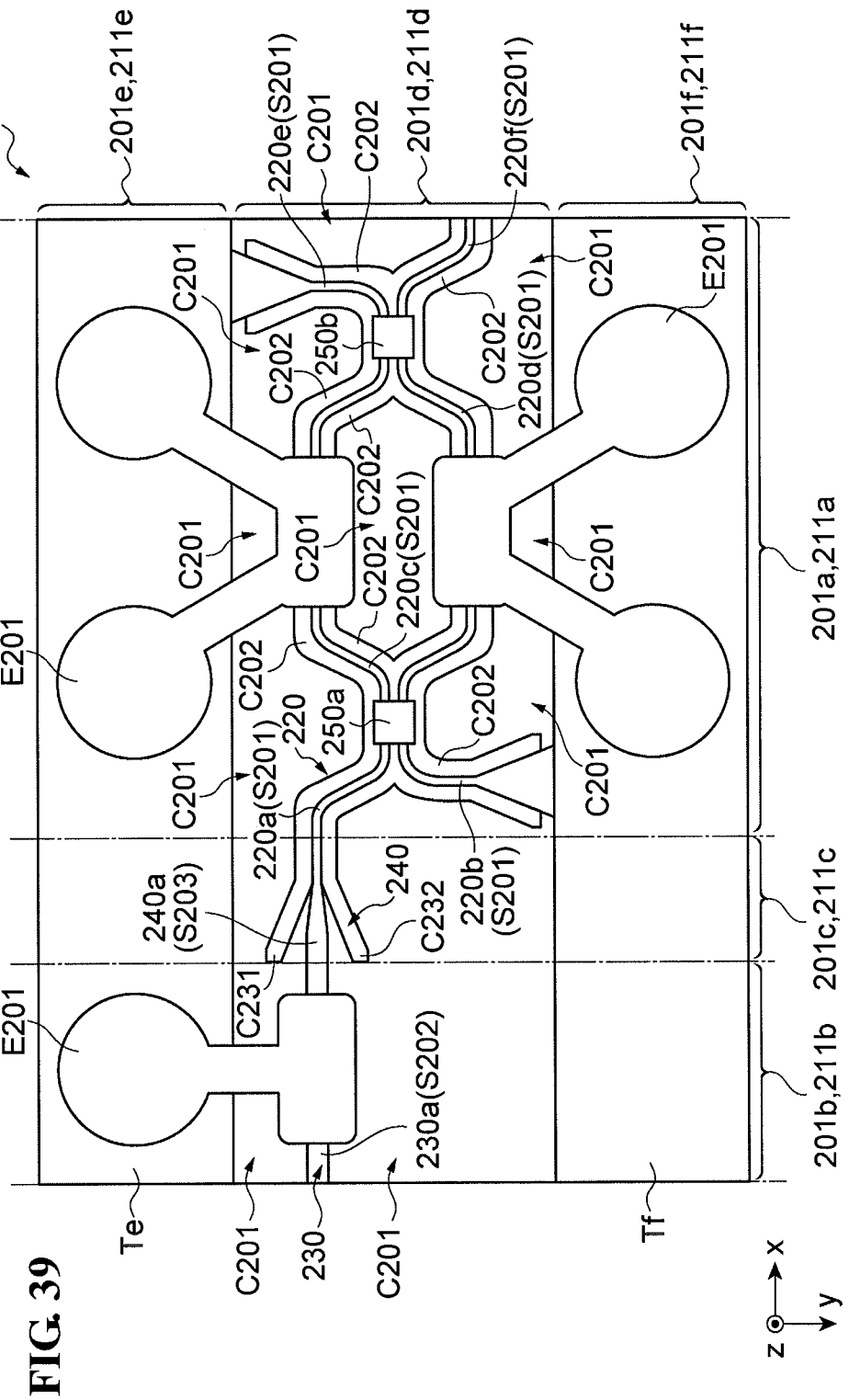
FIG. 39 is a schematic plan view illustrating a structure of a semiconductor optical device according to a third embodiment.

FIG. 39 is a schematic plan view illustrating a structure of a semiconductor optical device according to a third embodiment. A semiconductor optical device 201 differs from the optical semiconductor device 1 according to the first embodiment only in the arrangement of the stripe-shaped optical waveguide S and the arrangement of a second recess C202. Specifically, in the semiconductor optical device 201, a second mesa 220b is provided between a first multiplexer/demultiplexer 250a and the terrace Tf. A fifth mesa 220e is provided between a second multiplexer/demultiplexer 250b and the terrace Te. More specifically, one end of the second mesa 220b is connected to the terrace Tf, with its width increasing gradually. The other end of the second mesa 220b is connected to the first multiplexer/demultiplexer 250a. One end of the fifth mesa 220e is connected to the second multiplexer/demultiplexer 250b. The other end of the fifth mesa 220e is connected to the terrace Te, with its width increasing gradually. The semiconductor optical device 201 does not include elements corresponding to the second ridge 30b and the second conversion portion 40b of the optical semiconductor device 1. The semiconductor optical device 201 having the foregoing structure may be produced by the same production method as those in the first and second embodiments.

The principles of the present invention have been illustrated and described in the preferred embodiments. It will be recognized by those skilled in the art that the arrangements and details of the present invention may be changed without departing from the principles of the present invention. The present invention is not limited to the particular configurations disclosed in the embodiments. It is, therefore, intended that all modifications and changes within the spirit and scope of the claims be covered by the appended claims.

What is claimed is:

1. A method for producing a semiconductor optical device, comprising:
a step of preparing a substrate including a first region and a second region;
a step of growing a stacked semiconductor layer on the substrate;
a step of forming a first mask on the stacked semiconductor layer, the first mask having a stripe-shaped pattern that extends in a waveguiding direction;
a first etching step of etching the stacked semiconductor layer with the first mask to form a stripe-shaped optical waveguide, the stripe-shaped optical waveguide including a first stripe-shaped optical waveguide formed on the first region, and a second stripe-shaped optical waveguide formed on the second region;
after the first etching step, a step of forming a second mask on the stacked semiconductor layer with the first mask left, the second mask having a pattern configured to form a semiconductor mesa structure; and
a second etching step of etching the stacked semiconductor layer on the first region with the first mask and the second mask to form the semiconductor mesa structure,
wherein the second mask includes a first opening extending along the waveguiding direction,
the first opening includes a first opening edge remote from one side surface of the first stripe-shaped optical waveguide, and a second opening edge remote from the other side surface of the first stripe-shaped optical waveguide,
the first opening edge and the second opening edge are located on a region of the stacked semiconductor layer uncovered with the first mask,
the semiconductor mesa structure is formed of the first stripe-shaped optical waveguide formed on the first region, and
the second stripe-shaped optical waveguide formed on the second region has a ridge structure different from the semiconductor mesa structure.

2. The method according to claim 1,
wherein the substrate further includes a third region provided between the first region and the second region,
the stripe-shaped optical waveguide further includes a third stripe-shaped optical waveguide formed on the third region, the third stripe-shaped optical waveguide connecting the first stripe-shaped optical waveguide and the second stripe-shaped optical waveguide,
the second mask further includes a second opening on a region which is uncovered with the first mask and which is located on both sides of the third stripe-shaped optical waveguide,
the second opening extends along the waveguiding direction and is gradually separated from both side surfaces of the third stripe-shaped optical waveguide, and
wherein, in the second etching step, the stacked semiconductor layer on the third region is etched with the first mask and the second mask to form a conversion region provided between the semiconductor mesa structure and the ridge structure, the conversion region including the third stripe-shaped optical waveguide.

3. The method according to claim 2,
wherein the step of forming the second mask includes:
after the first etching step, a step of forming a selection film composed of a thermo-curable resin on a selection film formation region, the selection film formation region including a first opening formation region of the stacked semiconductor layer where the first opening will be formed, and a second opening formation region of the stacked semiconductor layer where the second opening will be formed;
after the step of forming the selection film, a step of forming a silicon nitride film on the stacked semiconductor layer;
a step of forming a resist mask on the silicon nitride film, the resist mask including an opening located on the first opening formation region and the second opening formation region;
a step of etching the silicon nitride film with the resist mask to form a silicon nitride film mask;
after the step of etching the silicon nitride film, a step of removing the resist mask; and
after the step of removing the resist mask, a step of removing the selection film to form the second mask, and
wherein the second mask includes the silicon nitride film mask.

4. The method according to claim 3,
wherein, in the step of removing the selection film, the selection film is removed with oxygen plasma.

5. The method according to claim 2,
wherein the first mask is formed of a silicon nitride film,
wherein the step of forming the second mask includes:
after the first etching step, a step of forming a silicon oxide film on the stacked semiconductor layer;
a step of forming a resist mask on the silicon oxide film, the resist mask including an opening which is located on a first opening formation region of the stacked semiconductor layer where the first opening will be formed and which is located on a second opening formation region of the stacked semiconductor layer where the second opening will be formed;
a step of selectively etching the silicon oxide film with the resist mask to form a silicon oxide film mask; and
after the step of selectively etching the silicon oxide film, a step of removing the resist mask to form the second mask, and
wherein the second mask includes the silicon oxide film mask.

6. The method according to claim 2,
wherein the stacked semiconductor layer includes an active layer, an etch-stop layer provided on the active layer, and a plurality of semiconductor layers stacked on the etch-stop layer,
wherein the first etching step includes:
a step of etching the plurality of semiconductor layers;
after the step of etching the plurality of semiconductor layers, a step of forming a selection film composed of a thermo-curable resin on a selection film formation region, the selection film formation region including a first opening formation region of the stacked semiconductor layer where the first opening will be formed, and a second opening formation region of the stacked semiconductor layer where the second opening will be formed; and
a step of selectively etching the plurality of semiconductor layers using the first mask with the selection film left until the etch-stop layer is exposed, to form the stripe-shaped optical waveguide,
wherein the step of forming the second mask includes:
after the selective etching, a step of forming a silicon nitride film on the stacked semiconductor layer;
a step of forming a resist mask on the silicon nitride film, the resist mask including an opening located on the first opening formation region and the second opening formation region;
a step of etching the silicon nitride film with the resist mask to form a silicon nitride film mask;
after the step of etching the silicon nitride film, a step of removing the resist mask; and
after the step of removing the resist mask, a step of removing the selection film to form the second mask, and
wherein the second mask includes the silicon nitride film mask.

7. The method according to claim 6,
wherein, in the step of forming the resist mask, the edge of the opening of the resist mask is provided on the selection film.

8. The method according to claim 1,
wherein the height of the semiconductor mesa structure is greater than the height of the ridge structure.

9. The method according to claim 1,
wherein the stacked semiconductor layer includes an active layer, an etch-stop layer provided on the active layer, and a plurality of semiconductor layers stacked on the etch-stop layer, and
wherein, in the first etching step, the plurality of semiconductor layers are etched until the etch-stop layer is exposed.

10. The method according to claim 1,
wherein the width of the semiconductor mesa structure differs from the width of the ridge structure.

* * * * *